(12) United States Patent
Koelmel et al.

(10) Patent No.: US 8,057,602 B2
(45) Date of Patent: Nov. 15, 2011

(54) APPARATUS AND METHOD FOR SUPPORTING, POSITIONING AND ROTATING A SUBSTRATE IN A PROCESSING CHAMBER

(75) Inventors: Blake Koelmel, Palo Alto, CA (US); Alexander N. Lerner, San Jose, CA (US); Joseph M. Ranish, San Jose, CA (US); Kedarnath Sangam, Sunnyvale, CA (US); Khurshed Sorabji, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 963 days.

(21) Appl. No.: 12/017,293

(22) Filed: Jan. 21, 2008

(65) Prior Publication Data
US 2008/0280453 A1 Nov. 13, 2008

Related U.S. Application Data

(63) Continuation-in-part of application No. 11/746,392, filed on May 9, 2007.

(51) Int. Cl.
*C23C 16/00* (2006.01)
(52) U.S. Cl. ............ 118/730; 118/728; 141/65; 406/88
(58) Field of Classification Search ............... 118/728, 118/500, 730; 141/65, 82, 98; 406/88, 86
See application file for complete search history.

(56) References Cited

U.S. PATENT DOCUMENTS

| | | |
|---|---|---|
| 3,982,627 A | 9/1976 | Isohata |
| 4,495,024 A | 1/1985 | Bok |
| 4,544,446 A | 10/1985 | Cady |
| 4,681,776 A | 7/1987 | Bok |
| 4,738,748 A * | 4/1988 | Kisa ........................ 438/727 |
| 4,922,853 A | 5/1990 | Hofer |
| 5,194,406 A | 3/1993 | Bok et al. |
| 5,226,383 A | 7/1993 | Bhat |
| 5,248,380 A | 9/1993 | Tanaka |
| 5,489,341 A | 2/1996 | Bergman et al. |
| 5,584,310 A | 12/1996 | Bergman et al. |
| 5,761,023 A | 6/1998 | Lue et al. |
| 5,997,963 A | 12/1999 | Davison et al. |
| 6,102,057 A | 8/2000 | Vogtmann et al. |
| 6,113,702 A | 9/2000 | Halpin et al. |
| 6,183,565 B1 | 2/2001 | Granneman et al. |
| 6,239,038 B1 | 5/2001 | Wen |

(Continued)

OTHER PUBLICATIONS

Tru-Si Technologies. "No Touch Handling" http://trusi.com/notouchhandling.html, Jan. 28, 2008.

(Continued)

*Primary Examiner* — Gregory Huson
*Assistant Examiner* — Jason Niesz
(74) *Attorney, Agent, or Firm* — Patterson & Sheridan, L.L.P.

(57) ABSTRACT

Embodiments of the invention contemplate a method, apparatus and system that are used to support, position, and rotate a substrate during processing. Embodiments of the invention may also include a method of controlling the transfer of heat between a substrate and substrate support positioned in a processing chamber. The apparatus and methods described herein remove the need for complex, costly and often unreliable components that would be required to accurately position and rotate a substrate during one or more processing steps, such as an rapid thermal processing (RTP) process, a chemical vapor deposition (CVD) process, a physical vapor deposition (PVD) process, atomic layer deposition (ALD) process, dry etching process, wet clean, and/or laser annealing process.

30 Claims, 27 Drawing Sheets

U.S. PATENT DOCUMENTS

| | | | |
|---|---|---|---|
| 6,343,183 | B1 | 1/2002 | Halpin et al. |
| 6,402,843 | B1 | 6/2002 | Siniaguine et al. |
| 6,454,865 | B1 | 9/2002 | Goodman et al. |
| 6,454,866 | B1 | 9/2002 | Halpin et al. |
| 6,491,757 | B2 | 12/2002 | Halpin et al. |
| 6,505,635 | B1 | 1/2003 | Vogtmann et al. |
| 6,692,576 | B2 | 2/2004 | Halpin et al. |
| 6,720,263 | B2 | 4/2004 | Olgado et al. |
| 6,839,507 | B2 | 1/2005 | Adams et al. |
| 7,312,156 | B2 | 12/2007 | Granneman et al. |
| 2002/0179589 | A1* | 12/2002 | Morita et al. .......... 219/411 |
| 2004/0020427 | A1* | 2/2004 | Langen .......... 118/500 |
| 2004/0194817 | A1* | 10/2004 | Pope et al. .......... 134/148 |
| 2005/0091992 | A1 | 5/2005 | Aggarwal et al. |
| 2005/0126605 | A1 | 6/2005 | Yassour et al. |
| 2005/0145180 | A1 | 7/2005 | Aggarwal et al. |

OTHER PUBLICATIONS

CoreFlow: "Thermal Processes", http://www.coreflow.com/page.asp?cat=71&type=2&lang=1, Feb. 14, 2008.

CoreFlow: "Thermal Platforms" http://www.coreflow.com/page.asp?cat=140&type=2&lang=1 ,Jan. 28, 2008.

CoreFlow: "From Technology to Solution", http://www.coreflow.com/page.asp?cat=79&type=2&lang=1, Jan. 28, 2008.

CoreFlow: "Smart Nozzles", http://www.coreflow.com/page.asp?cat=113&type=2&lang=1, Feb. 14, 2008.

CoreFlow: "Handling", http://aop.co.il/customers/core/page.asp?cat=66&lang=1&type=2, Jan. 28, 2008.

CoreFlow: "XY(Z) Accurate Platforms", http://aop.co.il/customers/core/page.asp?cat=138&type=2&lang=1, Jan. 28, 2008.

CoreFlow: "Coating", http://aop.co.il/customers/core/page.asp?cat=65&lang=1&type=2, Jan. 28, 2008.

ASM International N.V.: Products—"Levitor", http://asm.com/index.php?option=com_content&task=view&id=13&Itemid=52, Jan. 28, 2008.

Kuznetsov et al., "Levitor 4000: An Advanced RTP System Based on Conductive Heat Transfer," 197th Meeting of the Electrochemical Society—Toronto, Ontario, Canada May 14-18, 2000, pp. 1-10.

Granneman et al., "Fast-Ramp, Low-Temperature, Annealing in the LEVITOR Floating Wafer System," Rapid Thermal and Other Short-Term Proc. Technol. II, 199th ECS meeting, Washington DC, Mar. 26-29, 2001, pp. 1-9.

Granneman et al., "The LEVITOR 4000 System, Ultra-fast, Emissivity-independent, Heating of Substrates Via Heat Conduction Through Thin Gas Layers," RTP-2001 Mie, Japan, Nov. 2001, pp. 1-6.

International Search Report and Written Opinion dated Sep. 7, 2009 for International Application No. PCT/US2009/030996.

International Search Report and Written Opinion of the International Searching Authority dated Aug. 22, 2008 (PCT/US08/63105).

* cited by examiner

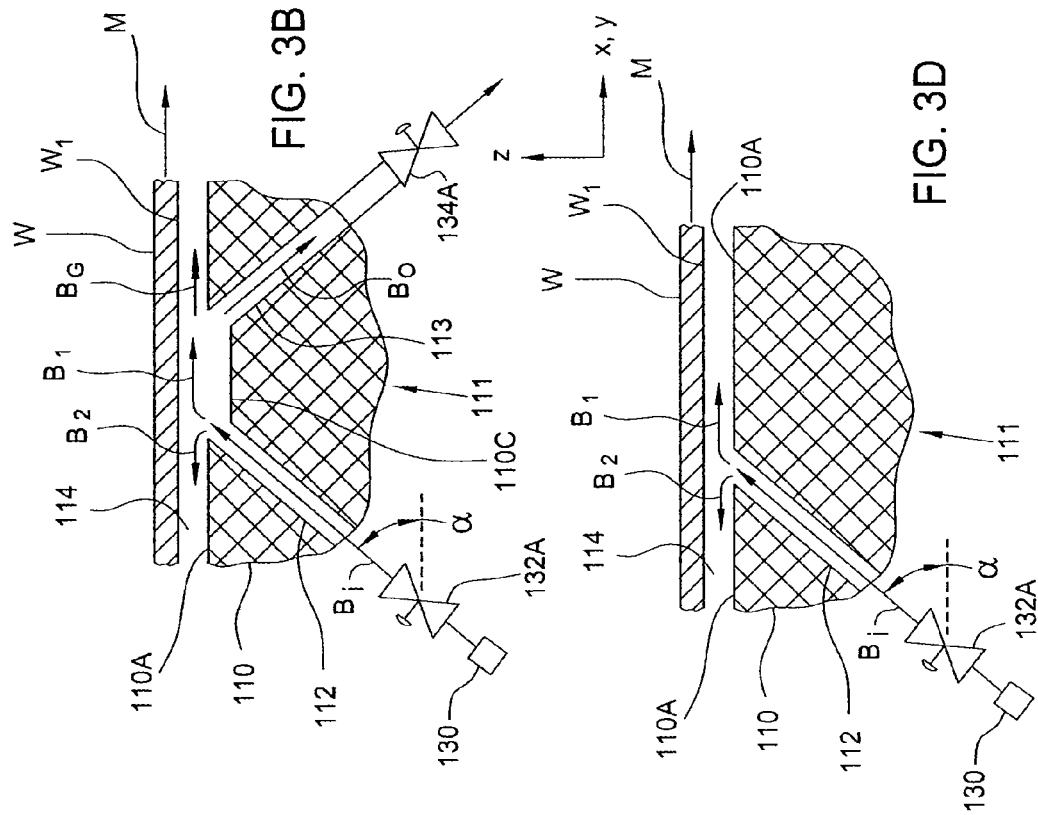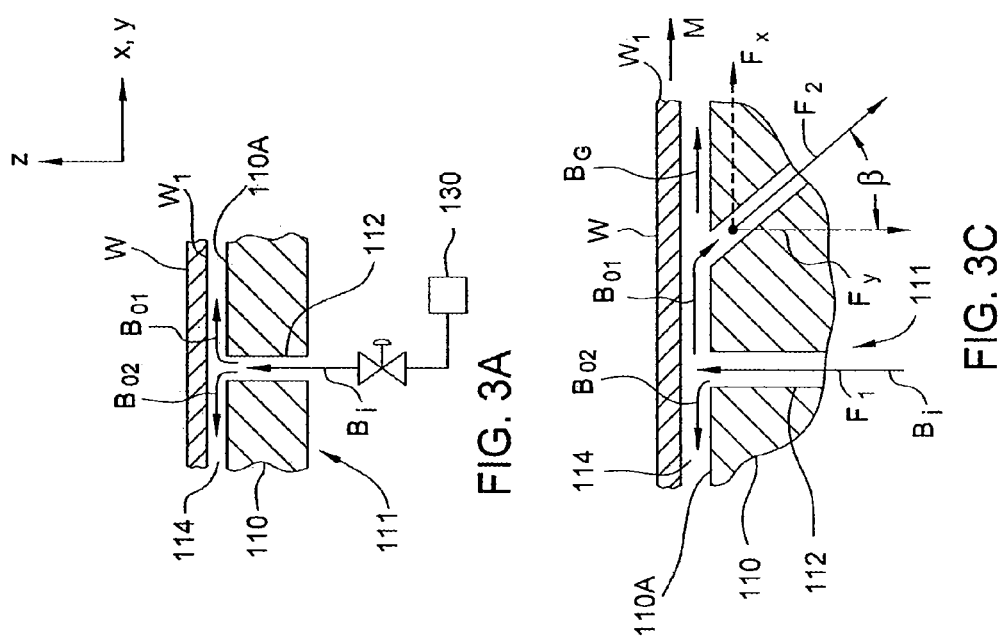

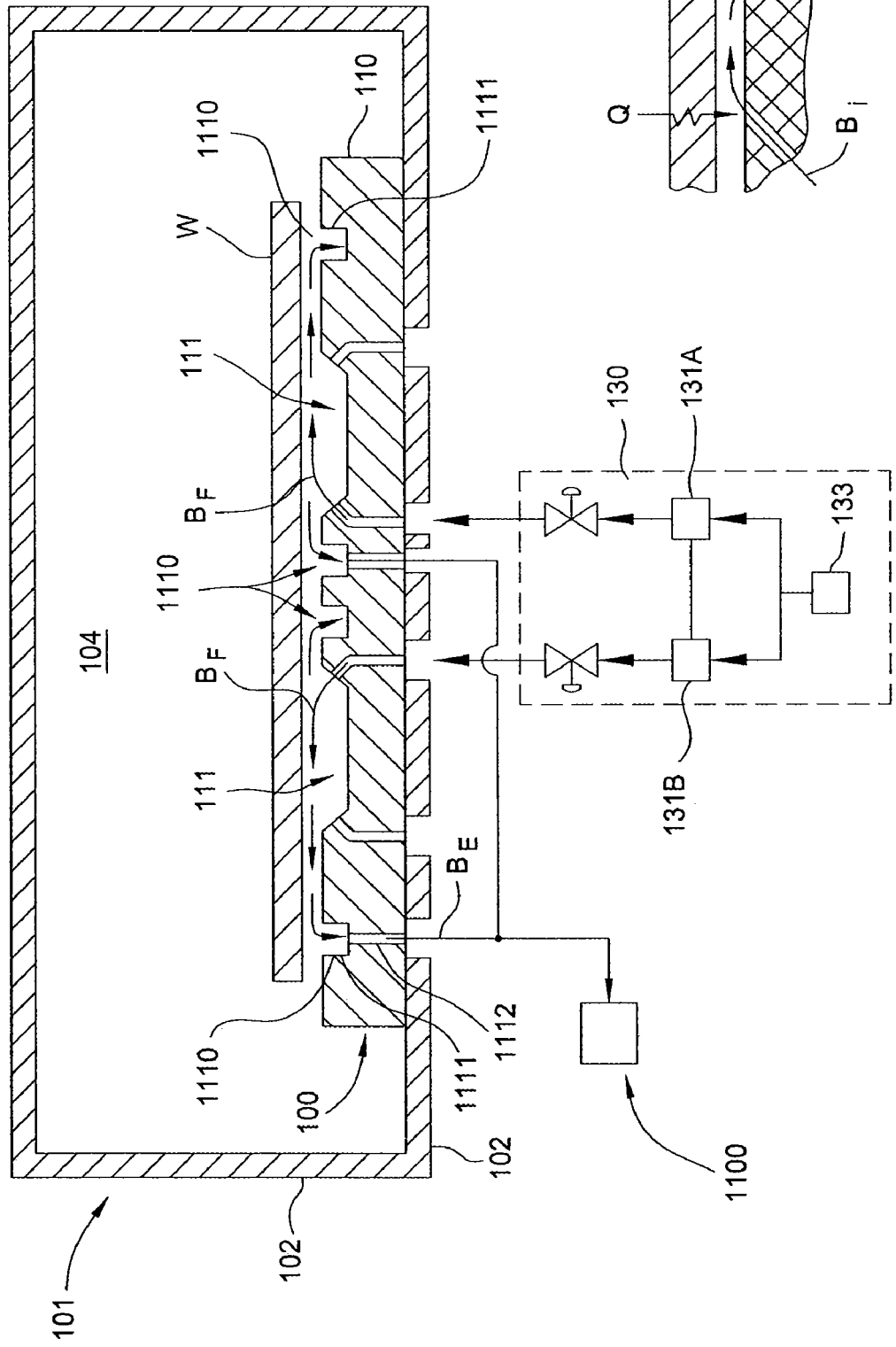
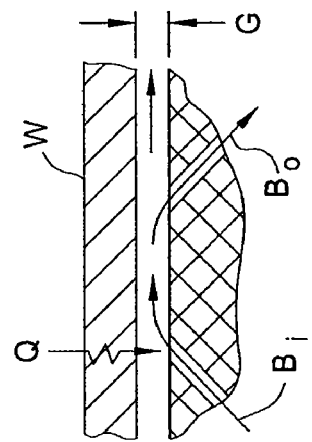
FIG. 11B
FIG. 12

APPARATUS AND METHOD FOR SUPPORTING, POSITIONING AND ROTATING A SUBSTRATE IN A PROCESSING CHAMBER

CROSS-REFERENCE TO RELATED APPLICATIONS

This application is a continuation-in-part of co-pending U.S. patent application Ser. No. 11/746,392, filed May 9, 2007, which is herein incorporated by reference.

BACKGROUND OF THE INVENTION

1. Field of the Invention

The present invention relates generally to the field of semiconductor processing, and more specifically, to supporting, positioning or rotating a substrate during semiconductor device fabrication in a processing chamber.

2. Background of the Related Art

In the fabrication of integrated circuits and displays, semiconductor, dielectric, and electrically conducting materials are formed on a substrate, such as a silicon substrate or a glass substrate. The materials can be formed by chemical vapor deposition (CVD), atomic layer deposition (ALD), physical vapor deposition (PVD), ion implantation, plasma or thermal oxidation, and nitridation processes. Thereafter, the deposited materials can be etched to form features such as gates, vias, contact holes and interconnect lines. In a typical deposition or etch processes, the substrate is exposed to a plasma in a substrate processing chamber to deposit or etch material on the substrate surface. Other typical processes that may be performed on a substrate may include thermal processing techniques that may include RTP, flash lamp, or laser annealing processes.

Integrated circuits and display devices have evolved into complex devices that can include millions of transistors, capacitors and resistors on a single chip or region of the display substrate. The evolution of chip design continually requires faster circuitry and greater circuit density that demand increasingly precise fabrication processes. One fabrication process frequently used is ion implantation.

Ion implantation is particularly important in forming transistor structures on semiconductors and may be used many times during chip fabrication. During ion implantation, silicon substrates are bombarded by a beam of electrically charged ions, commonly called dopants. Implantation changes the properties of the material in which the dopants are implanted to achieve a particular level of electrical performance. Dopant concentration is determined by controlling the number of ions in a beam of energy projected on the substrate and the number of times the substrate passes through the beam. The energy level of the beam typically determines the depth at which the dopants are placed. These dopants are accelerated to an energy level that will permit the dopants to penetrate or implant into the film at a desired depth.

During ion implantation, the implanted film often develops a high level of internal stress. In order to relieve the stress and further control the resulting properties of the implanted film, the film is typically subjected to a thermal process, such as annealing. Post-ion implantation annealing is typically performed in a rapid thermal processing (RTP) chamber that subjects the substrate to a very brief, yet highly controlled thermal cycle that can heat the substrate from room temperature to over 1000° C. in less than 10 seconds. RTP relieves the stress induced during implantation and can be used to further modify film properties such as changing the electrical characteristics of the film.

Generally, an RTP chamber includes a radiant heat source or lamp, a chamber body and a substrate support ring. The lamp is typically mounted to a top surface of the chamber body so that the radiant energy generated by the lamp impinges upon the substrate supported by the support ring within the chamber body. A quartz window is typically disposed in the top surface of the chamber body to facilitate the transfer of energy between the lamp and the substrate. The support ring is typically comprised of silicon carbide and extends from a bottom of the chamber body to support the substrate by its outer edge. An external motor is used to rotate the substrate and the support ring to compensate for variations in the radiant energy generated by the lamp impinging across the substrate surface that could heat the substrate non-uniformly. Typically, the RTP process is performed at atmospheric pressures or reduced pressures to minimize potential particle and chemical contamination of the substrate.

While RTP processes can heat and cool a substrate quickly, RTP processes often heat the entire thickness of the substrate. Uneven heating across the surface of the substrate can be a problem that is often experienced with RTP or other conventional substrate heating processes. For example, temperature variation often occurs in the area where the support ring contacts the outer edge of the substrate. Variation of substrate temperatures also may occur because the radiant heat source is applied to the top surface of the substrate which may include different device materials at various sections of the surface. The different device materials may have wide ranges of emissivities resulting in varying temperatures.

During the processes discussed above, the substrate is typically held on a substrate support having a substrate receiving surface. The support can have an embedded electrode that serves as a plasma generating device during processing and/or it may also be charged to electrostatically hold the substrate. The support can also have a resistance heating element to heat the substrate during processing, and/or a water cooling system to cool the substrate or to cool the support. One issue that arises is that as device sizes decrease the tolerance to variation across the substrate has become very low such that the alignment and positioning of a substrate relative to the substrate support, shadow ring, or other chamber components can have an affect on the uniformity of the process results achieved on the substrate. In some cases, one or more regions in a process chamber may be unable to uniformly generate a plasma (e.g., PECVD, PVD), uniformly deliver heat to the substrate (e.g., RTP, PECVD), and/or have regions of non-uniform gas flow due to the position orientation of the gas inlet or exhaust in the processing chamber, which commonly creates the need to rotate the substrate to average out the non-uniformities seen in different areas of the processing region of the processing chamber. Rotating the substrate is often a very expensive and complicated process to perform in a processing chamber that requires the substrate to be processed at subatmospheric pressures, to be processed at high temperatures and/or require one or more rotatable electrical connections to allow power to be delivered to one or more components in the substrate support (e.g., heater elements). The complexity and cost generally arises due to the need for high temperature rotational components (e.g., bearings) that are reliable and will not generate particles, precise and expensive motors, complex control systems, reliable rotating electrical connections, and reliable rotating vacuum seals.

Therefore, there is a need for an improved system adapted to support, position, and/or rotate a substrate during a substrate processing, which does not require direct contact with the substrate, is inexpensive to use and maintain, provides good process results, is reliable, and is easy to control.

SUMMARY OF THE INVENTION

The present invention generally provides a processing chamber, comprising a substrate support comprising a plurality of ports having one or more apertures that each receive a flow of fluid from one or more flow controllers, wherein each of the plurality of ports are adapted to direct the received fluid in a predominant flow direction that is not the same as the predominant flow direction of the other plurality of ports, a sensor that is positioned to monitor the position of a substrate disposed over the substrate support that is disposed within a processing region of the processing chamber, and a controller that is configured to receive a signal from the sensor and is adapted to control the position of the substrate by controlling the flow of the fluid delivered by each of the plurality of ports from the one or more flow controllers.

Embodiments of the invention further provide a processing chamber, comprising a plurality of ports that are adapted to each provide a flow of fluid to a surface of a substrate, wherein the plurality of ports comprise a first port that is adapted to receive the fluid from a first flow controller and direct the fluid in a first direction, a second port that is adapted to receive a fluid from a second flow controller and direct the fluid in a second direction, and a third port that is adapted to receive a fluid from a third flow controller and direct the fluid in a third direction, wherein at least a portion of the flow of fluids from the plurality of ports are adapted to support of the weight of the substrate, a sensor that is positioned to monitor the position of the substrate disposed within a processing region of the processing chamber, and a controller that is configured to receive a signal from the sensor and is adapted to control the position of the substrate by controlling the flow of fluids from the first, second, and third flow controllers.

Embodiments of the invention further provide a method of processing a substrate, comprising delivering a flow of a fluid to a plurality of ports, wherein the plurality of ports comprise a first port that is adapted to receive a fluid from a first flow controller and direct the fluid in a first direction, a second port that is adapted to receive the fluid from a second flow controller and direct the fluid in a second direction, and a third port that is adapted to receive the fluid from a third flow controller and direct the fluid in a third direction, wherein at least a portion of the flow of fluids from the plurality of ports are adapted to support the weight of the substrate, positioning a substrate over the plurality of ports that are disposed in a processing region of a processing chamber, monitoring the position of the edge of the substrate disposed within the processing region by use of sensor, and controlling the position of the substrate by controlling the flow of the fluid delivered from the first, second, and third ports by use of the sensor.

Embodiments of the invention further provide a method of processing a substrate, comprising positioning a substrate in a processing region of a processing chamber, wherein the substrate has a plurality of semiconductor devices formed on a processing surface of the substrate, delivering a flow of a fluid to three or more ports, wherein the three or more ports comprise a first port that is adapted to receive a fluid from a first flow controller and direct the fluid in a first direction, a second port that is adapted to receive a fluid from a second flow controller and direct the fluid in a second direction, and a third port that is adapted to receive a fluid from a third flow controller and direct the fluid in a third direction, wherein at least a portion of the flow of fluids from the three or more ports are adapted to support the weight of the substrate and none of the three or more ports are adapted to direct the fluid in the same direction, receiving the substrate on the three or more ports, monitoring the position of the edge of the substrate disposed within the processing region by use of sensor, and controlling the position of the edge of the substrate by controlling the flow of the fluid delivered from the first, second, and third ports and a signal received from the sensor.

BRIEF DESCRIPTION OF THE DRAWINGS

A more particular description of the invention, briefly summarized above, may be had by reference to the embodiments thereof that are illustrated in the appended drawings. It is to be noted, however, that the appended drawings illustrate only typical embodiments of this invention and are therefore not to be considered limiting of its scope, for the invention may admit to other equally effective embodiments.

FIG. 3A is a cross-sectional view of a port according to one embodiment of the invention;

FIG. 3B is a cross-sectional view of a port according to one embodiment of the invention;

FIG. 3C is a cross-sectional view of a port according to one embodiment of the invention;

FIG. 3D is a cross-sectional view of a port according to one embodiment of the invention;

FIG. 11B is a cross-sectional view of a substrate support and a processing chamber according to one embodiment of the invention;

FIG. 12 is a cross-sectional view of a port according to one embodiment of the invention;

To facilitate understanding, identical reference numerals have been used, wherever possible, to designate identical elements that are common to the Figures.

DETAILED DESCRIPTION

Figure 2:
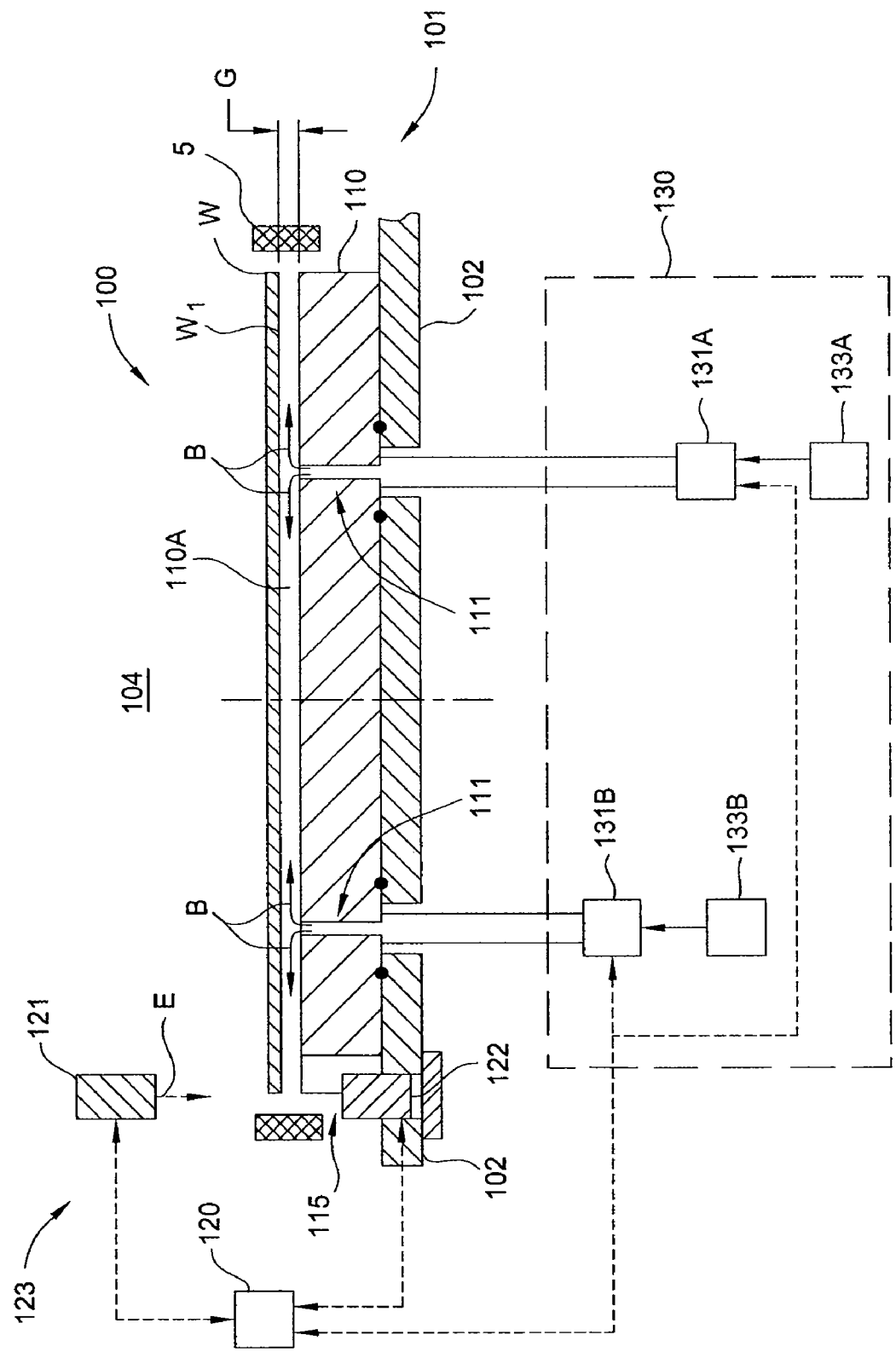
FIG. 2 is a cross-sectional view of a region of the processing chamber and substrate support assembly according to one embodiment of the invention.

Embodiments of the invention contemplate a method, apparatus and system that are used to support, position, and rotate a substrate during processing. Embodiments of the invention may also include a method of controlling the transfer of heat between a substrate and substrate support positioned in a processing chamber. The apparatus and methods described herein remove the need for complex, costly and often unreliable components that would be required to accurately position and rotate a substrate during one or more processing steps, such as an rapid thermal processing (RTP) process, a chemical vapor deposition (CVD) process, a physical vapor deposition (PVD) process, atomic layer deposition (ALD) process, wet clean processes (e.g., Tempest™ process chamber available from Applied Materials Inc.), dry etching process, and/or laser annealing process. Substrates that may be processed using the methods, apparatus and system described herein may include, but are not limited to 200 mm, 300 mm or larger single crystal silicon (Si), multi-crystalline silicon, polycrystalline silicon, germanium (Ge), silicon carbide (SiC), glass, gallium arsenide (GaAs), cadmium telluride (CdTe), cadmium sulfide (CdS), copper indium gallium selenide (CIGS), copper indium selenide (CuInSe$_2$), gallium indium phosphide (GaInP$_2$), as well as heterojunction cells, such as GaInP/GaAs/Ge or ZnSe/GaAs/Ge substrates. Preferably, the substrates are circular, but could be any other desirable shape. In one embodiment, the substrate is a semiconductor substrate that has a plurality of semiconductor devices formed on a processing surface. The processing surface, or device side of the substrate, is generally on the opposing side of the substrate from the lower surface $W_1$ of the substrate W, which is illustrated in FIG. 2.

Figure 1:
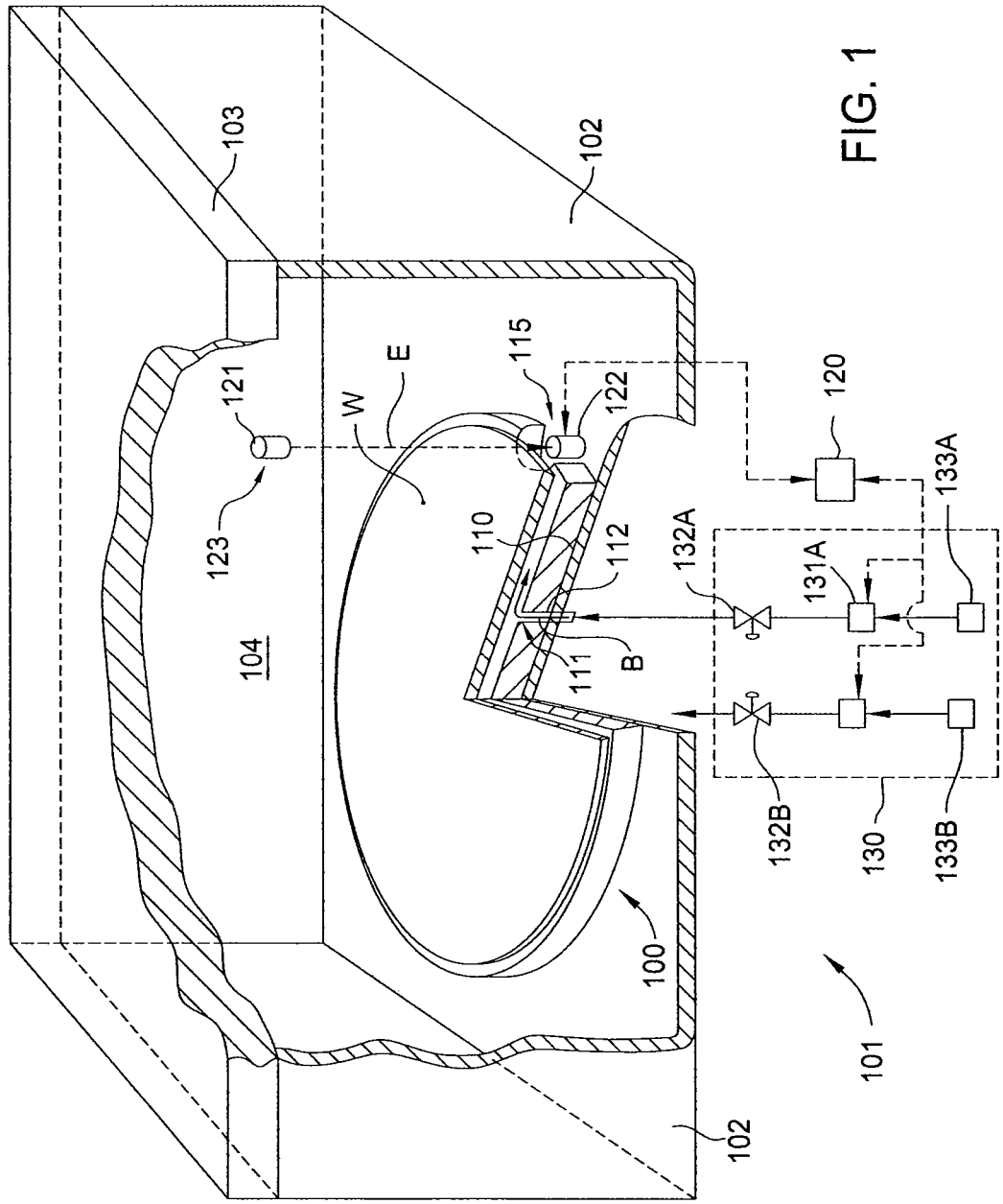
FIG. 1 is an isometric partial section view of a processing chamber according to one embodiment of the invention.

In general, embodiments of the invention may provide substrate support that is able to support, position, and/or rotate a substrate using a fluid that is delivered from three or more ports formed in a substrate support assembly 100 (FIG. 1). It has been found that by controlling the characteristics of the fluid delivered from the three or more ports to a surface of the substrate, such as flow rate and orientation of the "stream" of fluid delivered from the three or more ports, the substrate can be accurately supported, positioned, and/or rotated. The support, positioning, and rotation of the substrate is caused by the friction and momentum transfer of the atoms in the fluid striking the substrate surface. The force imparted by each fluid stream can be combined to cause the substrate to be moved and be positioned as needed by use of a closed loop control system. As device sizes shrink the tolerance for particle contamination has dramatically decreased, it is generally desirable to prevent the lower surface $W_1$ (FIG. 2) of the substrate W from contacting the chamber components, such as the substrate support surface 110A during the position, movement or rotation of the substrate. Typically, the fluid is a gas, such as nitrogen, helium, argon, krypton, neon, hydrogen, or combinations thereof, but in some applications could be a liquid, such as water.

FIG. 1 illustrates an isometric partial cross-sectional view of a processing chamber 101 that contains one or more walls 102, a lid 103 and a substrate support assembly 100 that is disposed in the processing region 104 of the processing chamber 101. In general, the processing chamber 101 may be an RTP, CVD, PVD, ALD, wet clean, dry etching, laser annealing chamber, or other similar type of substrate processing chamber. The substrate support assembly 100 generally contains a substrate support 110, a fluid delivery system 130, and a sensing assembly 123 that are all in communication with a system controller 120.

In one embodiment, as shown in FIG. 1, the substrate "W" is supported on the fluid "B" delivered from the fluid delivery system 130 to the ports 111 (only one shown) formed in the substrate support 110. FIG. 2 is a cross-sectional view of a portion of the processing chamber 101 that contains the substrate support assembly 100 that is positioned on one of the walls 102 of the processing chamber 101. In this view a substrate W is supported above the substrate support 110 by a fluid "B" delivered through port 111 so that a gap "G" is formed between the substrate W and the substrate support 110. The gap "G" created by the fluid B may be between about 1 μm and about 1000 μm, preferably between about 100 μm and about 500 μm. In one embodiment, the substrate is elevated about 500 μm. Optionally, a sensor (not shown), such as an optical sensor, may be positioned and configured to detect when the substrate is at a desired height above the substrate supporting surface. In one embodiment, the optical sensor and the system controller 120 are used to control the desired gap "G" by adjusting the flow delivered by one or more of the ports 111.

In one embodiment, the substrate support 110 can be formed from a metal, ceramic, plastic, semiconductor or other materials typically used to support substrates during processing. In one embodiment, the substrate support 110 is made of a metal, such as aluminum, and stainless steel. In another embodiment, the substrate support 110 is made of a ceramic material, such as quartz, sapphire, silicon carbide, alumina, zirconia, aluminum nitride, or boron nitride.

The fluid delivery system 130 generally contains one or more fluid control components that are used to provide and control the delivery of fluid to the ports 111 formed in the substrate support 110. In one embodiment, the fluid delivery system 130 contains one or more fluid sources (e.g., fluid sources 133A-133B) that deliver fluid to each of the ports 111 using a fluid controlling device (e.g., fluid controlling devices 131A-131B), and optionally one or more control valves (e.g., control valves 132A-132B). The fluid controlling devices are adapted to control the flow, velocity and/or pressure of the fluid delivered to the ports 111 by use of commands sent from the system controller 120. In one embodiment, the fluid controlling devices are conventional mass flow controllers (MFCs) that are in communication with the system controller 120. In another embodiment, the fluid controlling devices are a fixed orifice that is configured to deliver desired flows at various known pressures. The control of the substrate movement can also be affected by the type of fluids (e.g., gasses, liquids) delivered by the one or more ports, and thus the viscosity, atomic mass, pressure, and density need to be taken into account. The selection of the fluid generally must also take into account its affect on the process being performed in the processing region 104. In one embodiment, the fluid delivered through the ports 111 is a gas that has a different composition than the gaseous components found in the processing region 104 (FIG. 1) of the processing chamber 101 during processing. For example, in one case where the processing chamber 101 is a LPCVD chamber the processing region 104 may contain a gas or vapor that is used to deposit a material on the surface of the substrate (e.g., silane containing precursor) and the gas delivered from the ports 111 is a non-reactive or inert gas, such as nitrogen or argon.

The sensing assembly 123 generally contains a light source 121 and a sensor 122 that are positioned to sense the substrate position relative to the substrate support 110 and communicate information to the system controller 120 so that the position of the substrate W can be actively controlled by the delivery of fluid to the ports 111. In this configuration the light source 121 and sensor 122 are positioned so that when the substrate is positioned in a desirable position within the processing chamber 101, at least a portion of the light "E" (FIGS. 1-2) received by the sensor 122 from the light source 121 can be monitored by the system controller 120. Commonly this configuration is known as a "through beam" sensing configuration. In one embodiment, as shown in FIGS. 1 and 2, the sensor 122 is positioned within a cut-out 115 formed in the substrate support 110. In one embodiment, a sensor 122 is adapted to monitor the features on the edge of the substrate to sense the position of a notch formed on the substrate to allow the rotational speed to be measured by noting the frequency that the features pass through the sensor's field of view. While the sensing assembly 123 in FIGS. 1 and 2 illustrate a "through beam" type sensor configuration, or even a sensor configuration that uses light, these configurations are not intended to be limiting as to the scope of the invention since any means of monitoring the position of the substrate can be used without deviating from the basic scope of the invention. In one embodiment, a retroreflective sensor configuration is used to sense the position or motion of the substrate. Retroreflective sensors generally emit light and receive the reflected light from a desirable target along the same or similar path.

The system controller 120 is adapted to control the various components used to complete the substrate support assembly 100 and processing chamber 101. The system controller 120 is generally designed to facilitate the control and automation of the overall process chamber and typically includes a central processing unit (CPU) (not shown), memory (not shown), and support circuits (or I/O) (not shown). The CPU may be one of any form of computer processors that are used in industrial settings for controlling various system functions, chamber processes and support hardware (e.g., detectors, robots, motors, fluid sources, etc.) and monitor the processes (e.g., substrate support temperature, power supply variables, chamber process time, I/O signals, etc.). The memory is connected to the CPU, and may be one or more of a readily available memory, such as random access memory (RAM), read only memory (ROM), floppy disk, hard disk, or any other form of digital storage, local or remote. Software instructions and data can be coded and stored within the memory for instructing the CPU. The support circuits are also connected to the CPU for supporting the processor in a conventional manner. The support circuits may include cache, power supplies, clock circuits, input/output circuitry, subsystems, and the like. A program (or computer instructions) readable by the system controller 120 determines which tasks are performable on a substrate. Preferably, the program is software readable by the system controller 120 that includes code to perform tasks relating to monitoring, execution and control of the movement, support, positioning, and/or rotation of a substrate along with the various process recipe tasks and various chamber process recipe steps being performed in the processing chamber 101. In one embodiment, the system controller may use conventional PID control algorithms to control the delivery of fluid to the ports to actively control the support, position and/or rotation of the substrate.

Figure 17:
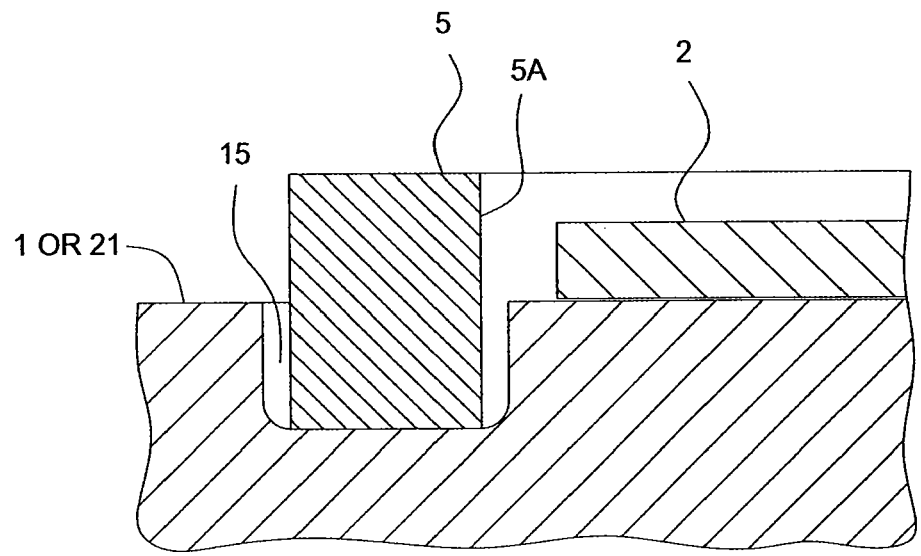
FIG. 17 depicts a partial sectional view of a thermal edge barrier positioned on the support and positioning assembly according to one embodiment of the invention.

In one embodiment of the processing chamber 101, as shown in FIGS. 2 and 17, an edge barrier 5 is added to the substrate support assembly 100 to improve the thermal uniformity of the substrate during processing. The thermal edge barrier 5 is an annular body which at least partially circumscribes the edge of substrate W and limits the movement of the substrate within its boundaries. The edge barrier 5 is also generally configured to receive heat from, or deliver heat to, the edge of the substrate. The thermal edge barrier 5 may be temperature controlled using lamps, embedded resistive heating elements, or other similar means to control the heat transfer process between the thermal edge barrier 5 and the substrate's edge. The thermal edge barrier 5 may be fabricated from a material that reduces the potential scratching or contamination of the substrate surface, and have a desired emissivity or ability to absorb the radiated energy. For example, the thermal edge barrier 5 may be fabricated from a material, such as silicon carbide, stainless steel, aluminum, silicon, alumina, or a high temperature polymer. Other attributes of the edge barrier 5 is discussed further discussed below.

FIGS. 3A-3C illustrate various embodiments of a port 111 that can be used to support, position and/or rotate a substrate W that is positioned over the substrate support 110. Embodiments of the invention generally provide orienting the one or more ports 111 formed in the substrate support 110 so that the interaction with the fluid flowing from or within the ports 111 allow the substrate to be supported, positioned and rotated as needed. It is believed that by adjusting the velocity, flow, and angle with which the fluid interacts with the substrate surface the momentum exchange and friction created between the fluid and the substrate can be used to dynamically position, move, and/or rotated the substrate relative to the substrate support 110. It has been found that flows in the subsonic regime (e.g., Mach number<1) greatly improve the coupling efficiency of the fluid to the substrate. Thus, it is generally desirable to design the apertures, and also deliver fluids to the nozzles at pressures that will cause the fluid to exit the apertures at a subsonic velocity and/or cause the flow to be choked.

In one embodiment, it is desirable to configure the one or more ports 111 so that they deliver a fluid at a supersonic velocity (e.g., Mach number>1), since the low pressure region created around these ports, due to the ejected high velocity fluid, can be used to position the substrate. In one embodiment, the apertures 112 in the ports 111 can be machined to have a converging section and diverging section so that the nozzle shape (e.g., de Laval nozzle) will allow for the creation of supersonic flow when the pressure drop is greater than the critical point. It is believed that by delivering a gas at supersonic velocities motion of a substrate can be created by the friction caused by the flow of gas towards a low pressure region created by the supersonic flow delivered by a port. Therefore, the motion of the substrate can be controlled by delivering supersonic flows from one or more strategically placed ports during one or more of the substrate processing steps performed on the substrate. In one embodiment, it may also be desirable to use ports that are able to deliver supersonic flows and ports that are able to deliver subsonic flows to move and/or position a substrate. An advantage of delivering a supersonic flow through a port is that it allows one to induce a directional flow (i.e., towards the point of low pressure) without the need to machine an angled aperture in the substrate support. Forming an angled aperture in the substrate support can be difficult to achieve in substrate supports that are made of a ceramic material, for example.

In one embodiment, as shown in FIG. 3A, the port 111 contains an aperture 112 that is oriented in a substantially normal orientation to the lower surface $W_1$ of the substrate W. In this configuration the inlet flow $B_i$ passing through the aperture 112 strikes the lower surface $W_1$ of the substrate W causing the fluid to flow in various directions, such as directions $B_{O1}$, $B_{O2}$. When the flow and/or pressure of the inlet flow $B_i$ delivered from the fluid delivery system 130 through the aperture 112 is high enough a gap 114 is formed between the substrate W and the substrate support 110. Due to the perpendicular orientation of the aperture 112 to the lower surface $W_1$ the inlet flow $B_i$ will tend to support the substrate and move the substrate in only a vertical direction (i.e., Z-direction). It should be noted that the size of gap 114 formed by the flowing fluid will depend on pressure of the flowing fluid relative to the pressure in the processing region 104 (FIG. 1), the weight of the substrate W, the angle α of the impinging fluid, the properties of the fluid, and the velocity of the flowing fluid from the apertures 112.

FIG. 3B is a side cross-sectional view of a port 111 that is oriented at an angle α to the lower surface $W_1$ of the substrate W so that the substrate W can be supported and moved as needed. The component of the inlet fluid flow that is in a direction normal to the lower surface $W_1$ (e.g., $B_i \times Sin(\alpha)$, where in this case $B_i$ is a fluid flow vector) will tend to support the wafer, while the flow in a direction tangential to the lower surface $W_1$ (e.g., $B_i \times Cos(\alpha)$, where in this case $B_i$ is a fluid flow vector) will tend to move the substrate in the direction M. Due to the angular orientation of the inlet flow $B_i$ relative to the lower surface $W_1$, the inlet flow $B_i$ will tend to move the substrate in a direction "M" due to the friction created between the flowing fluid and the substrate's lower surface $W_1$. While a portion of the inlet flow $B_i$ may flow in other directions, such as the flow vector $B_2$, most of the flow will be in the predominant flow vector $B_1$'s direction due to the orientation of the aperture 112 and fluid flow properties. The predominant flow vector $B_1$ thus creates a force that is applied to substrate W due to the friction of the flowing fluid against the substrate surface causing the substrate to move in the direction M and move away from the substrate support 110A, which are in the predominant flow vector $B_1$'s direction. It should be noted that the Z-direction component of the predominant flow vector $B_1$ and other flow vectors (e.g., flow vector $B_2$) created by the angled inlet flow $B_i$, which tend to support the substrate, are generally not shown In FIGS. 3A-3D for clarity.

In one embodiment, as shown in FIG. 3B, the port 111 also contains one or more exhaust apertures 113 that capture at least a portion of the inlet flow $B_i$ injected by the aperture(s) 112. This configuration can allow the flow of fluid delivered by each port 111 to be self contained if desired, thus avoiding the case where the flow from one port 111 on the substrate support 110 interacts with the flow from other ports 111 formed a distance there from. In one case it is desirable to restrict the flow of fluid through the exhaust apertures 113 so that a portion of the inlet flow $B_i$ exits the port 111 through the exhaust aperture 113 and a portion of the inlet flow $B_i$ flows into the gap 114 formed between the lower surface $W_1$ and the substrate support surface 110A of the substrate support 110 (i.e., gap flow $B_G$).

In another embodiment, it is desirable to selectively inhibit the injected inlet flow $B_i$ from exiting through the exhaust aperture 113 at different times during the substrate processing step(s) by use of a controllable exhaust valve 134A. The controllable exhaust valve 134A may be connected to an exhaust pump or similar type exhaust system that is able to reduce the pressure and increase the flow in the exhaust aperture 113. Closing the exhaust aperture 113 will cause the injected fluid to flow within the gap 114 formed between the lower surface $W_1$ and the substrate support surface 110A of the substrate support (i.e., gap flow direction $B_G$) and thus improve the support of the substrate.

FIG. 3C is a side cross-sectional view of a port 111 that has an aperture 112 that is oriented at an angle that is substantially normal to the lower surface $W_1$ of the substrate W and an exhaust aperture 113 that is oriented at an angle β relative to the lower surface $W_1$. In this configuration a force $F_1$ created by the inlet flow $B_i$ is used to primarily support the substrate W, while the angled orientation of the exhaust aperture 113 is used to provide a force $F_x$, which is a component of the force $F_2$ generated from the outlet flow in the flow direction $B_{O1}$, that is applied to the substrate. The force $F_x$ is used to move or position the substrate W in a desired direction M. Therefore, by providing multiple selectively controllable exhaust apertures that have been distributed in various desired directions around the substrate support 110 and/or having desired angles (e.g., angle β) the movement of the substrate can be easily controlled. In this configuration the movement can be somewhat decoupled from the inlet flow $B_i$'s flow properties. Also, in this configuration the inlet flow $B_i$ tends to reduce the risk of the lower surface $W_1$ of the substrate W contacting the chamber substrate support 110 to minimize the creation of particles or damage to the lower surface $W_1$ of the substrate W.

FIG. 3D is a side cross-sectional view of a port 111 that is oriented at an angle α to the lower surface $W_1$ of the substrate W so that the substrate W can be supported and moved as needed. FIG. 3B differs from FIGS. 3B-3C and 4 since it illustrates a configuration of a port 111 that only contains one or more apertures 112 formed in the substrate support 110 (i.e., only one is shown in FIG. 3D) that intersect the substrate support surface 110A. In this configuration no extra machining steps are required to form the lower surface 110C (FIGS. 3B and 4), features of the recess 110B (FIG. 4), and/or exhaust apertures 113 (FIGS. 3B-3C and 4), thus reducing the cost and complexity of the substrate support 110. As discussed above, the inlet fluid flow is oriented at an angle α to the lower surface $W_1$ of the substrate W so that the substrate W can be supported and moved as needed by the creation of a predominant flow vector.

Figure 4:
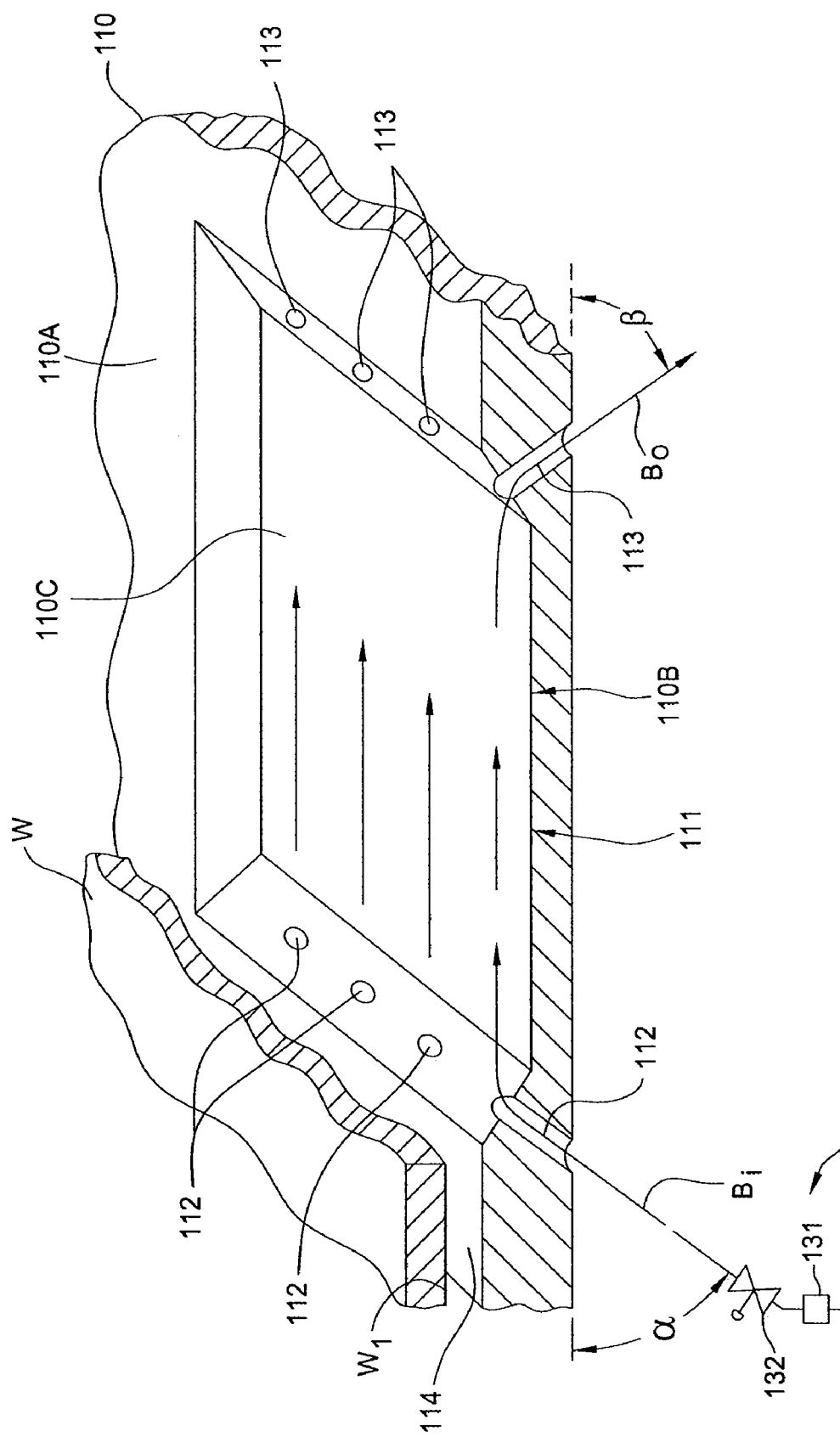
FIG. 4 is an isometric partial cross-sectional view of a port according to one embodiment of the invention.

FIG. 4 illustrates a partial isometric section view of a port 111 formed in the substrate support surface 110A of the substrate support 110. In one embodiment, the port 111 contains a plurality of apertures 112 and a plurality of exhaust apertures 113 that positioned in a recess 110B on the substrate support surface 110A of the substrate support 110. The array of apertures 112 and/or exhaust apertures 113 can help increase the coupling of fluid delivered to the substrate by the port 111 and thus help to improve the control of the movement of the substrate.

As shown in FIG. 4, which is similar to FIG. 3B, the apertures 112 are oriented an angle α relative to the substrate W and has exhaust apertures 113 oriented an angle β relative to the substrate W to allow the substrate W to be supported, positioned and/or rotated. The distance and shape of the lower surface 110C of the recess 110B relative to the lower surface $W_1$ of the substrate W can be adjusted to provide the most effective control of the substrate. In one embodiment, the distance from the lower surface 110C and the substrate support surface 110A is between about 10 μm and about 1000 μm. In one embodiment, the port 111 a rectangular in shape and have an outside length and width dimension that is greater than about 10 mm, and preferably between about 10 mm and about 50 mm.

In one embodiment, the inlet flow $B_i$ properties delivered by one or more of the apertures 112 is controlled to control how the substrate W is supported, positioned and/or rotated. In one embodiment, the flow characteristics (e.g., pressure, velocity) of the inlet flow $B_i$ is controlled by use of the components found in the fluid delivery system 130. As shown in FIG. 4, the fluid delivery system 130 may contain a fluid source 133, a fluid controlling device 131, and an optional control valve 132. The fluid controlling devices, such as mass flow controllers, are generally adapted to control the properties of the fluid delivered to the ports 111 by use of commands sent from the system controller 120. In one embodiment, a control valve 132 and at least one fluid controlling device 131 is connected to each aperture 112 in the port 111 so that the system controller 120 can individually control the inlet flow $B_i$ delivered from each aperture 112 at any time during the processing sequence. In one embodiment, a control valve 134 is connected to each exhaust aperture 113 in the port 111 so that the system controller 120 can individually control the outlet flow $B_o$ at any time during the processing sequence. In one embodiment, the outlet flow $B_o$ properties are controlled to control how the substrate W is supported, positioned and/or rotated by controlling the flow through the one or more of the exhaust apertures 113.

Figure 5A:
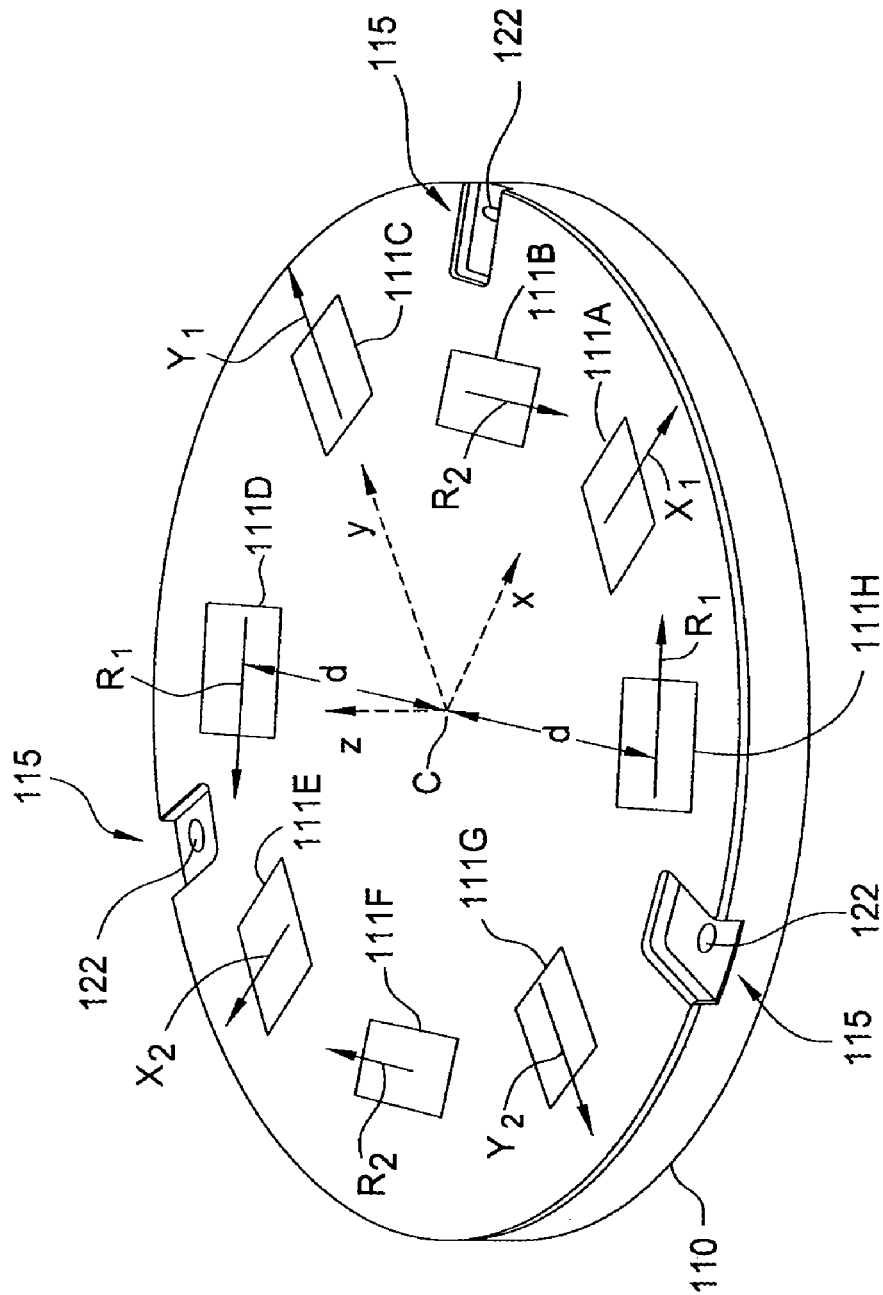
FIG. 5A is an isometric view of a substrate support assembly according to one embodiment of the invention.

FIG. 5A is an isometric view of a substrate support 110 that contains eight ports (i.e., ports 111A-111H) that have various features, such as oriented apertures 112 and/or exhaust apertures 113 that are used to impart motion to a substrate (not show for clarity) that is positioned thereon. As shown in FIG. 5A, the predominant flow vectors $X_1$, $Y_1$, $X_2$, and $Y_2$ for the ports 111A, 111C, 111E, and 111G, respectively, are adapted to move a substrate in either the X or Y-directions by delivery of a fluid through the features contained in each of the ports. For example, port 111A is adapted to move the substrate in a +X-direction by delivering fluid in the predominant flow vector $X_1$, port 111C is adapted to move the substrate in a +Y-direction by delivering fluid in the predominant flow vector $Y_1$, port 111E is adapted to move the substrate in a −X-direction by delivering fluid in the predominant flow vector $X_2$, and port 111G is adapted to move the substrate in a −Y-direction by delivering fluid in the predominant flow vector $Y_2$. In one embodiment, as shown in FIG. 5A, the predominant flow direction vectors for ports 111A, 111C, 111E, and 111G each pass though a common point "C", such as substantially the center of the substrate support 110, thus allowing the substrate to be positioned in the X and Y-directions without tending to rotate the substrate.

In one embodiment, the ports 111B, 111D, 111F, and 111H contain features that are adapted to rotate a substrate in either in a clockwise or counter-clockwise direction due to the orientation of the features contained in each of the ports creating the force vectors $R_2$ and $R_1$, respectively. In this configuration each of the ports 111B, 111D, 111F, and 111H have a predominant flow direction that is normal to the radius of the substrate. Therefore, to cause the substrate to rotate in a clockwise direction the control system could deliver fluid to the features in the ports 111B and 111F, and to cause the substrate to rotate in a counter-clockwise direction the control system 120 would deliver fluid to the features in the ports 111D and 111H. One skilled in the art would appreciate that if a port 111 has a predominant flow direction that does not pass through the center of gravity of the substrate, a rotational component and a translational component will both be imparted to the substrate. Therefore, to obtain a purely rotational motion the sum of the forces in the X-direction and Y-direction by the ports need to equal zero, while leaving a torque created by the application of a force at a distance from center of gravity of the substrate. For example, referring to FIG. 5A, if ports 111D and 111H each deliver a force vector $R_1$ in opposite directions at a distance "d" from the center of a substrate the magnitude of the counter-clockwise torque applied to the substrate would be equal to about $2(R_1 \times d)$. Also, since the center of the substrate will generally move relative to the ports active translational and rotational corrections will need to be made by the system controller 120 to assure that the substrate remains in a desired orientation and/or position in the processing chamber if desired.

In one embodiment, as shown in FIG. 5A, each of the ports 111A-111H are oriented so that the predominant flow direction is towards the edge of the substrate. In orienting the predominant flow direction towards the edge of the substrate, generally, the radial component of the predominant flow direction can be equal to zero (i.e., perpendicular to the radius) or directed away from the center of the substrate when it is generally centered over the substrate support. It has been found that by orienting the predominant flow direction towards the edge of the substrate, or away from the center of the substrate, helps to reduce the interaction between adjacent ports caused by the overlapping flows delivered by each port. In one embodiment, it is desirable to stager the position of adjacent ports to reduce the interaction between ports.

As shown in FIG. 5A, the substrate support 110 also contains a plurality of cut-outs 115 that are used in conjunction with the sensing assembly 123 components (FIGS. 1 and 2) to actively sense the position of a substrate positioned over the substrate support 110 (not shown in FIG. 5A) so that the flows from ports 111A-111G can be adjusted to actively support, position and/or rotate the substrate during processing in the processing chamber 101. In one embodiment, the flow characteristics (e.g., pressure, velocity) from each of the ports 111A-111G are separately controlled by use of the components found in the fluid delivery system 130 (discussed above) and the system controller 120. It has been found that the substrate can be easily rotated to speeds above 1000 rpm with a positional accuracy of less than about 0.2 mm. In one embodiment, the substrate is rotated at a speed between about 1 rpm and about 3000 rpm. The rotation speed may be or adjusted during one or more of the processing steps performed on the substrate in the processing chamber 101. For example, when the processing chamber is an low pressure CVD chamber the substrate may be rotated at a slower speed during a slow CVD deposition rate step and then rotated at a faster speed during a faster CVD deposition rate step.

Figure 5B:
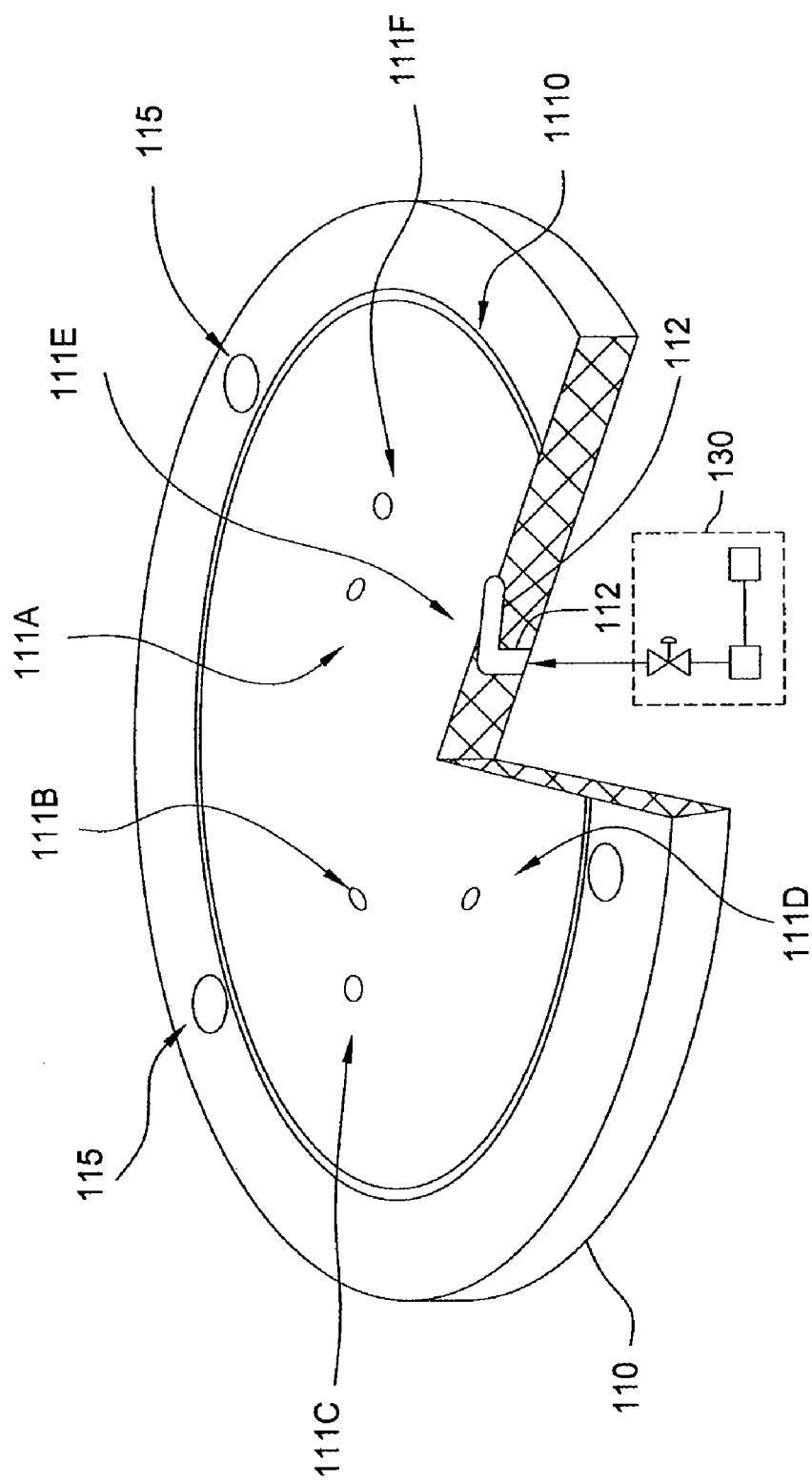
FIG. 5B is an isometric partial cross-sectional view of a substrate support assembly according to one embodiment of the invention.

FIG. 5B is an isometric view of a substrate support 110 that contains multiple ports (i.e., ports 111A-111F) that have apertures 112 that are used to channel the fluid delivered from the fluid delivery system 130 and impart motion to a substrate (not shown for clarity) that is positioned thereon. In general, each port may be in any desired orientation, such as the configurations illustrated in FIGS. 6A-8 that are discussed below. In one embodiment, as shown in FIG. 5B, a single aperture 112 is adapted to provide a fluid to the surface of the substrate in an orientation that is set by the orientation of the slanted aperture. Apertures 112 may have a diameter of between about 0.001 inches (0.025 mm) and about 0.063 inches (1.6 mm), preferably between about 0.001 inches and about 0.032 inches. The apertures may be slanted in relation to the top surface of substrate support 110 at an angle between about 10° and about 80°, preferably between about 30° and 60°. While six ports are depicted in FIG. 5B, any number of such apertures needed to provide rotational control of the substrate is contemplated. In one embodiment, an isolation feature 1110, which is discussed below, is used to prevent the fluid delivered by the ports from making its way into the processing region of the processing chamber 101. It is generally desirable to position the ports near the middle of the radius of the substrate to reduce the chance of the fluid leaving the apertures 112 from making it's way into the processing region 104 (FIG. 1). In one example, where a 300 mm semiconductor substrate is being processed the ports are positioned between about 25 mm and about 100 mm from the center of the substrate support 110.

Figure 6B:
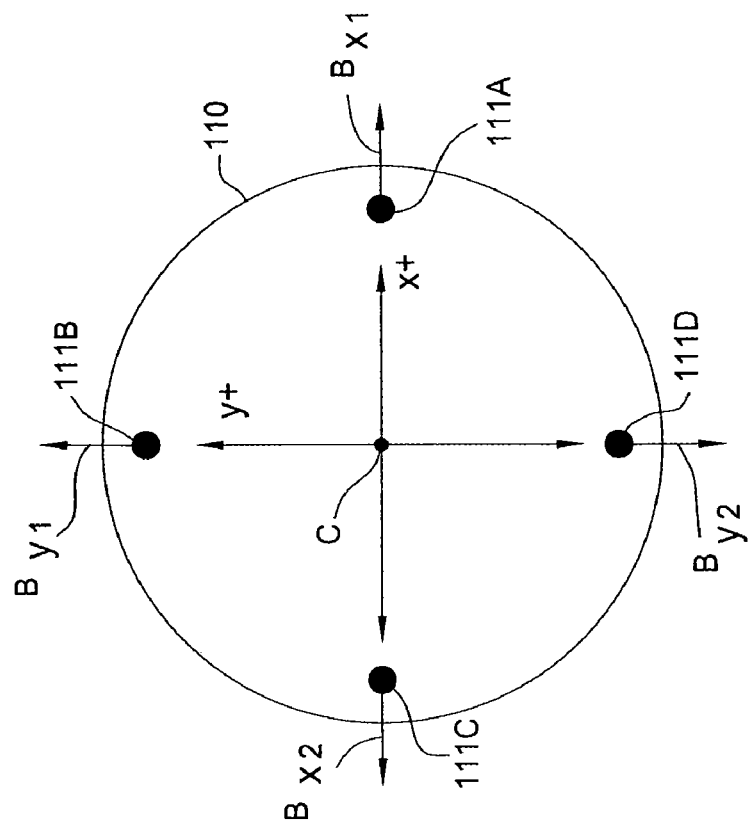
FIGS. 6A-6C are simplified schematic views of a substrate support assembly according to one embodiment of the invention.
Figure 6A:
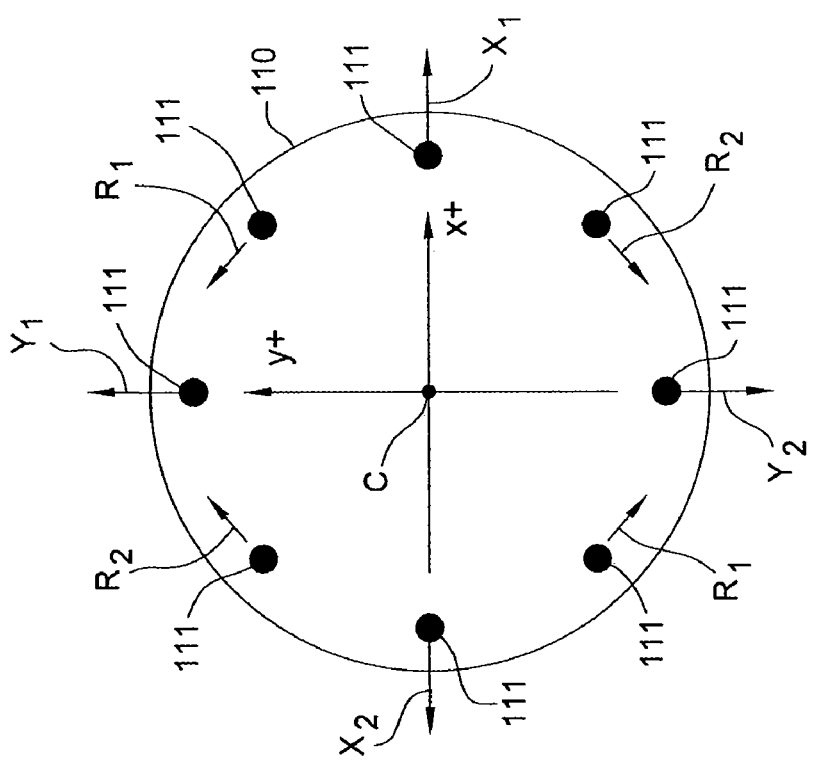
Figure 6C:
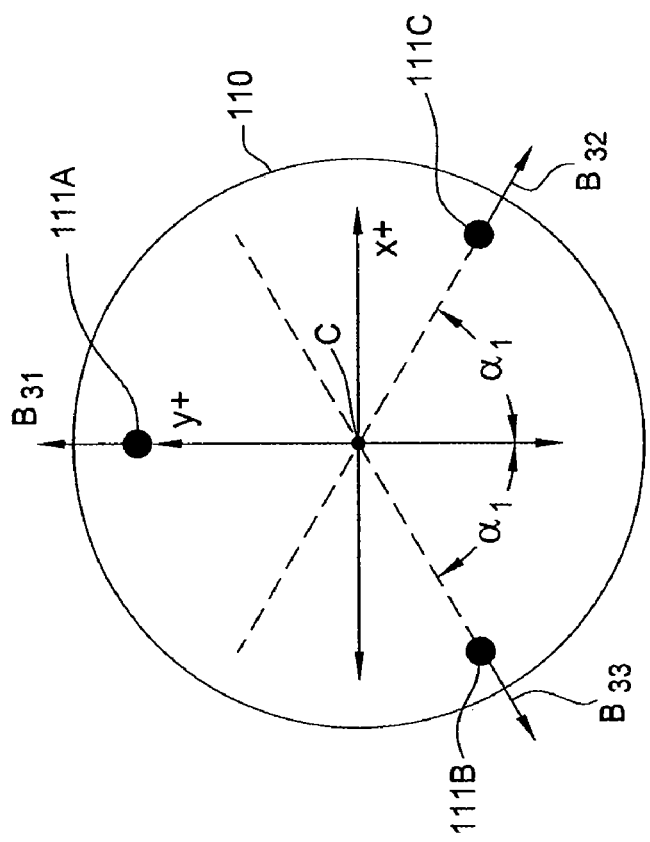

FIGS. 6A-6C are schematic plan views that illustrate different embodiments of the substrate support 110 that each have a different number of ports 111 that are used position and/or rotate a substrate. FIG. 6A illustrates a substrate support 110, similar to the one shown in FIG. 5A, that contains eight ports 111 that have a predominant flow direction that is oriented in various directions to control the support, position and/or rotation of a substrate disposed thereon. FIG. 6B illustrates a substrate support 110 that has four ports that are used to predominantly support the substrate and position the substrate in the X-Y plane by use of the predominant flow vectors $B_{x1}$, $B_{y1}$, $B_{x2}$ and $B_{y2}$. FIG. 6C illustrates a substrate support 110 that has three ports that are used to predominantly support and position the substrate in the X-Y plane by use of the predominant flow vectors $B_{31}$, $B_{32}$, and $B_{33}$. One skilled in the art would appreciate that the substrate support 110 shown in FIG. 6C is able to perform the same positioning functions as the substrate supports shown in FIGS. 6A and 6B when the positioning process performed by the system controller 120 is able to take into account the characteristics of predominant flow vector (e.g., magnitude and direction) created by the fluid delivered from each port (i.e., ports 111A-111C). In one embodiment, the predominant flow vectors $B_{32}$ and $B_{33}$ are symmetrically oriented at an angle $\alpha_1$ from the predominant flow vector $B_{31}$. It should be noted that FIGS. 5A, 6A-6C, 7A-7C and 8 all generally illustrate the component of the predominant flow vector that is parallel to the surface $W_1$ (FIGS. 3B-3D and 4), or a plane that is parallel to the surface $W_1$. Thus FIGS. 5A, 6A-6C, 7A-7C and 8 do not show the component of the predominant flow vector that tends to support the substrate (Z-direction shown in FIG. 3D) for clarity reasons and since the component of the predominant flow vector that is parallel to the surface $W_1$ is generally what is used to position and/or rotate the substrate, which is generally discussed in conjunction with these figures below.

While it generally follows that the greater the number of ports within the substrate support the more precise the control of the movement of the substrate, it is also generally desirable to reduce the number of ports to reduce the cost and complexity of the substrate support assembly 100, and reduce the amount of fluid used during the support, positioning and/or rotation of the substrate. In cases where the process being performed in the processing chamber 101 that is sensitive to the injection of fluid into the processing region 104 (FIG. 1) it is desirable to minimize the flow of fluid used support, position and or rotate the substrate. In one example, during a low pressure chemical vapor deposition (LPCVD) process, which is discussed below, it is desirable to reduce the total gas flow from all of the ports to less than about 5 standard liters/min (slm). In one embodiment, the total gas flow from all of the ports is kept between about 3 slm and about 5 slm.

Figure 7A:
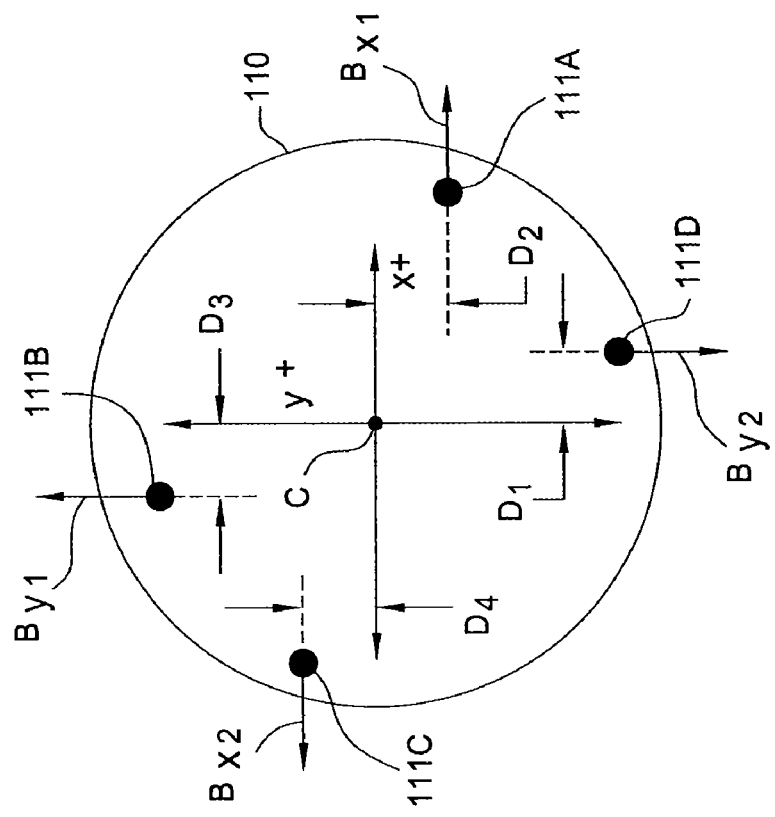
FIGS. 7A-7C are simplified schematic views of a substrate support assembly according to one embodiment of the invention.
Figure 7C:
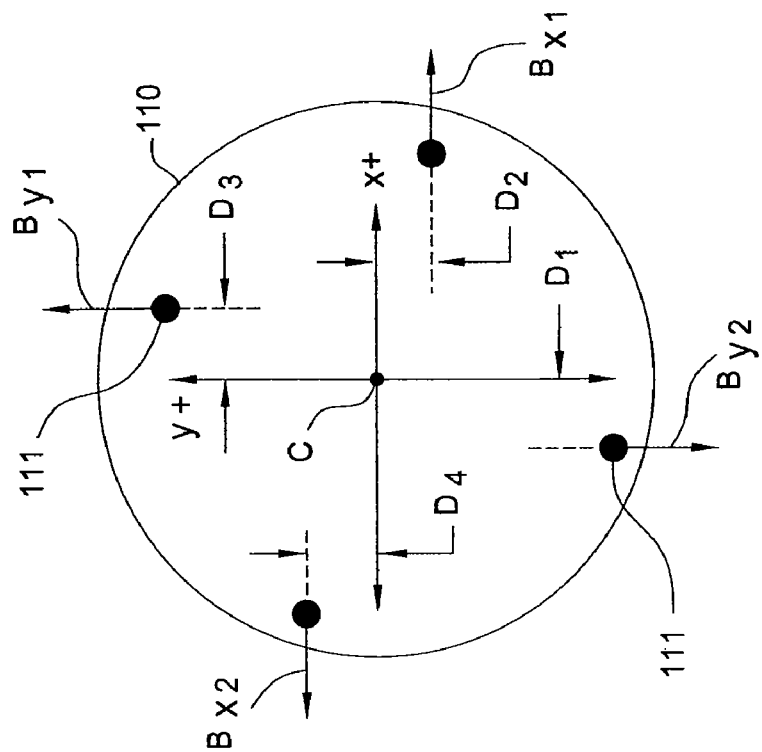
Figure 7B:
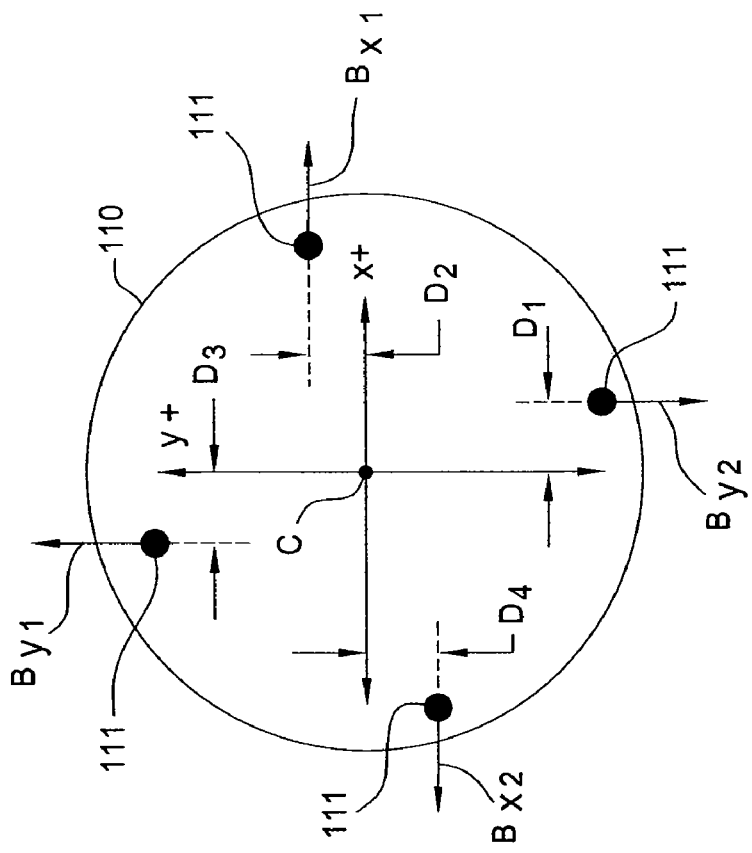

FIGS. 7A-7C illustrate different embodiments of the substrate support 110 that have four ports 111 that are used to support, position and rotate a substrate that is positioned thereon. FIG. 7A illustrates a substrate support 110 that contains four ports 111 that have a predominant flow direction that is oriented in the +X, −X, +Y and −Y directions to control the support, position and rotation of a substrate disposed thereon. In this configuration, as compared to FIG. 6B where the predominant flow directions were through the center of the substrate support, a rotational torque will be applied to the substrate due to the offset distance of the predominant flow force vectors delivered by each port 111 from the center of a substrate generally positioned over the center of the substrate support 110. A counter-clockwise torque can be applied to a substrate by use of the ports 111A and/or 111C due to the application of a force created by the predominant flow vectors $B_{x1}$ and $B_{x2}$ at a distance $D_2$ and $D_4$, respectively. A clockwise torque can be applied to a substrate by use of the ports 111B and/or 111D due to the application of a force created by the predominant flow vectors $B_{y1}$ and $B_{y2}$ at a distance $D_3$ and $D_1$, respectively. It should be noted that the system controller 120 will be able to cause a purely X and Y-direction movement (i.e., no rotational motion) of a substrate by causing the sum of the torques to equal zero, which is related to $\{(B_{x1} \times D_2)+(B_{x2} \times D_4)\}$ minus $\{(B_{y1} \times D_3)+(B_{y2} \times D_1)\}$ equaling zero.

FIGS. 7B-7C illustrate embodiments of a substrate support 110 that have four ports that are used to predominantly support, position and rotate the substrate. FIG. 7B illustrates a substrate support 110 that has four ports that are used to predominantly support, position and rotate a substrate in a clockwise orientation. A clockwise rotational motion will always be imparted on the substrate by the application of the flow from one or more of the ports 111 due to the torque created by the predominant flow direction of the ports being offset in the same clockwise torque direction from the center of gravity of a substrate generally positioned over the center of the substrate support.

FIG. 7C illustrates a substrate support 110 that has four ports that are used to predominantly support, position and rotate a substrate in a counter-clockwise orientation. A counter-clockwise rotational motion will always be imparted on the substrate by the application of the flow from one or more of the ports 111 due to the torque created by the predominant flow direction of the ports being offset in the same counter-clockwise torque direction from the center of gravity of a substrate generally positioned over the center of the substrate support. In either embodiment, shown in FIGS. 7B-7C a purely rotational motion in either the clockwise or counter-clockwise directions, respectively, will be created by the system controller 120 when the sum of the forces in the X and Y directions imparted by the flow of fluid from the ports 111A-111D all equal to zero.

Figure 8:
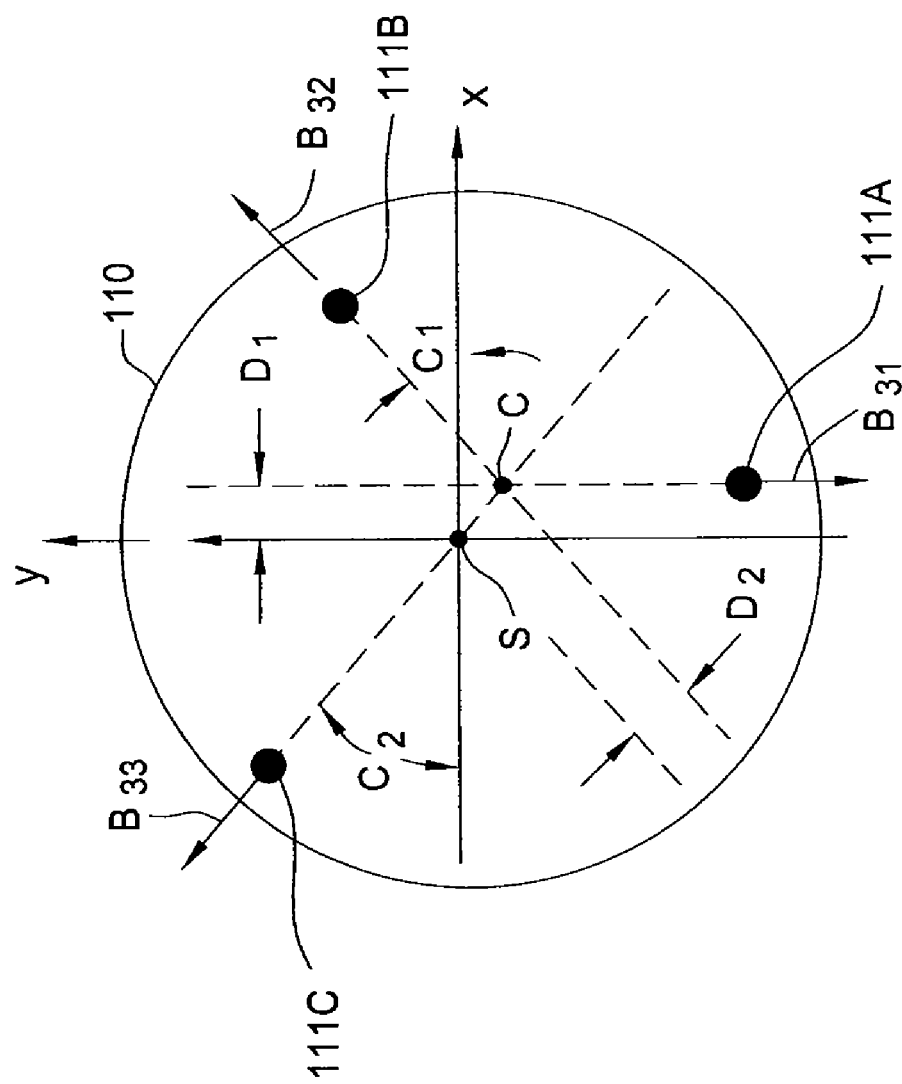
FIG. 8 is simplified schematic views of a substrate support assembly according to one embodiment of the invention.

FIG. 8 illustrates one embodiment of a substrate support 110 that have three ports 111 that are used to support, position and rotate a substrate that is positioned thereon. FIG. 8 illustrates a substrate support 110 that contains three ports 111A-111C that have predominant flow direction that is oriented in three different directions to control the support, position and rotation of a substrate disposed thereon. In one example (see FIG. 8), in this configuration, as compared to FIG. 6C where the predominant flow vectors $B_{31}$, $B_{32}$, and $B_{33}$ were through the center of the substrate support, a rotational torque can applied to the substrate due to the offset of the predominant flow direction of ports 111A and 111B due to their offset distance from the center of a substrate generally positioned over the center of the substrate support 110. A counter-clockwise torque can be applied to a substrate by use of the ports 111B due to the application of a force created by the predominant flow vector $B_{32}$ at a distance $D_2$ from the center of a substrate positioned over the center of the substrate support "S", and clockwise torque can be applied to a substrate by use of the port 111A due to the application of a force created by the predominant flow vectors $B_{31}$ at a distance $D_1$ from the center of a substrate positioned over the center of the substrate support "S".

While FIG. 8 illustrates one of the predominant flow directions being coincident with the center of the substrate support, and thus generally the center of the substrate, this configuration is not intended to be limiting as to the scope of the invention described herein. While FIGS. 6A-6C illustrate ports that each have the component of the predominant flow direction that is projected on a plane that is parallel to the substrate surface $W_1$ pass through a common point "C", this configuration is not intended to limit the scope of the invention described herein, since one could align the one or more predominant flow directions away from a common point without affecting the basic function of the design. However, in configurations where the component of the predominant flow direction parallel to the substrate surface $W_1$ do not pass through a single common point the positioning control algorithm applied by the system controller 120 would generally become more complex due to the need to account for the torque vectors and/or imbalance of forces created. Also, in one embodiment, the predominant flow vectors $B_{32}$ and $B_{33}$ may not be symmetrically oriented about the predominant flow vector $B_{31}$ (i.e., angle $C_1$ does not equal angle $C_2$) as shown in FIG. 8. In one embodiment, the common point "C" is the projection of an axis passing through the center of the substrate support on the plane that is parallel to the substrate surface $W_1$.

Figure 9A:
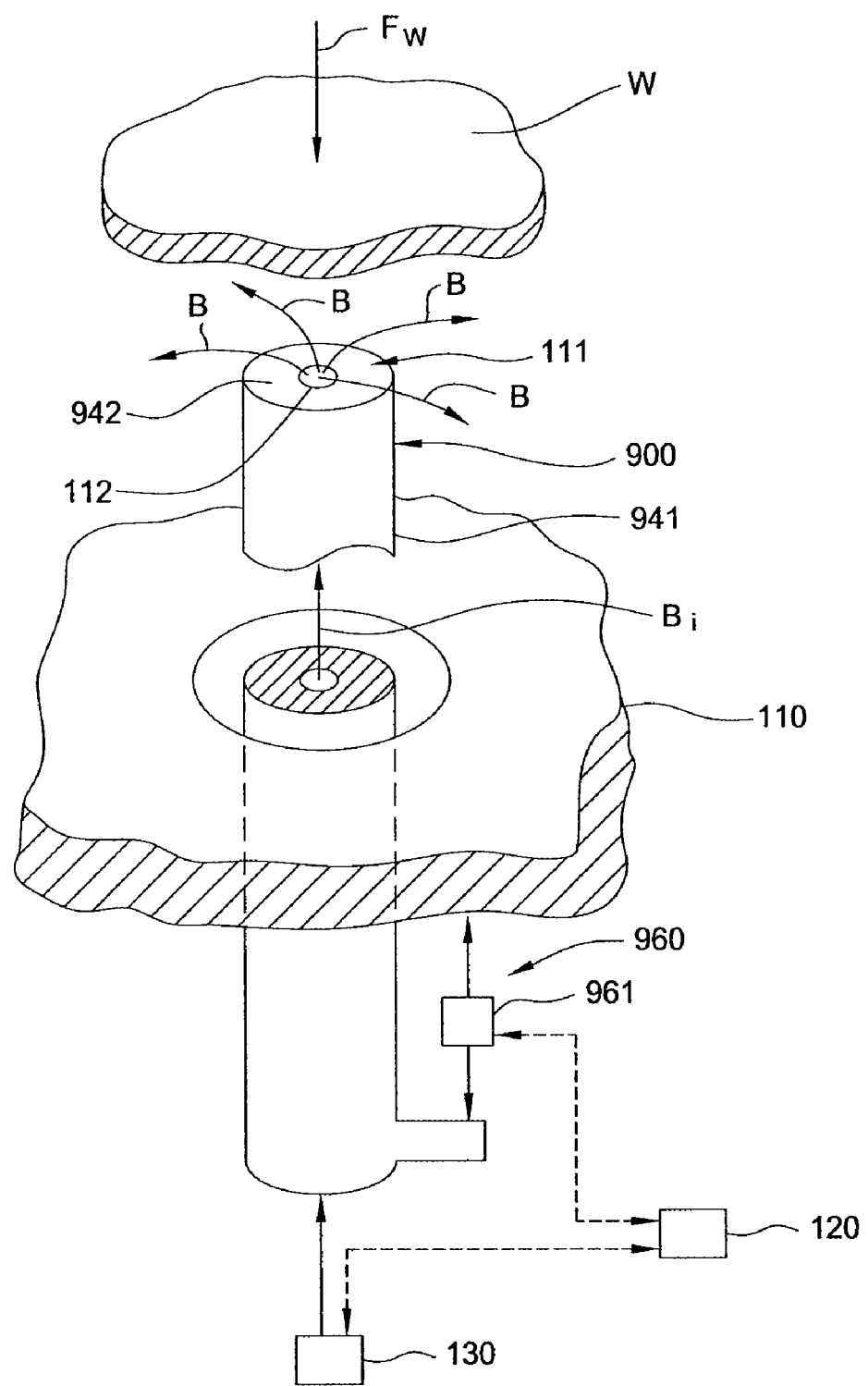
FIG. 9A is an isometric partial cross-sectional view of a port assembly according to one embodiment of the invention.

FIG. 9A illustrates an isometric partial section view of a port assembly 900 that contains a port 111 that is adapted to support, position and/or rotate a substrate W by use of a fluid delivered from a fluid source 130. In one embodiment, as shown in FIG. 9A, the port 111 is formed on a component 941 that is separate from a substrate plate 145 and is able to be moved relative to the substrate plate 145 by use of an actuator assembly 960. The substrate plate 145 may a be an electrostatic chuck, a conventional substrate heater, or a simple block having a substrate supporting surface that can be used to support a substrate during one or more of the substrate processing steps performed in the processing chamber 101. The actuator assembly 960 may contain an actuator 961, such as a pneumatic cylinder, DC servomotor and lead screw, or similar device, which is in communication with the system controller 120 to reliably position the port assembly 900 and substrate relative to the substrate support 110 during different phases of the substrate process performed in the substrate processing chamber 101. It has been found that either an aperture 112 having an inner diameter of at least 0.125 inches (3.2 mm), or the port assembly 900 that has a top surface 942 that has a diameter of at least 0.125 inches (3.2 mm), can be used to accurately and repeatably support a substrate positioned thereon using a nitrogen gas inlet flow $B_i$ pressure of 5 psig.

Figure 9D:
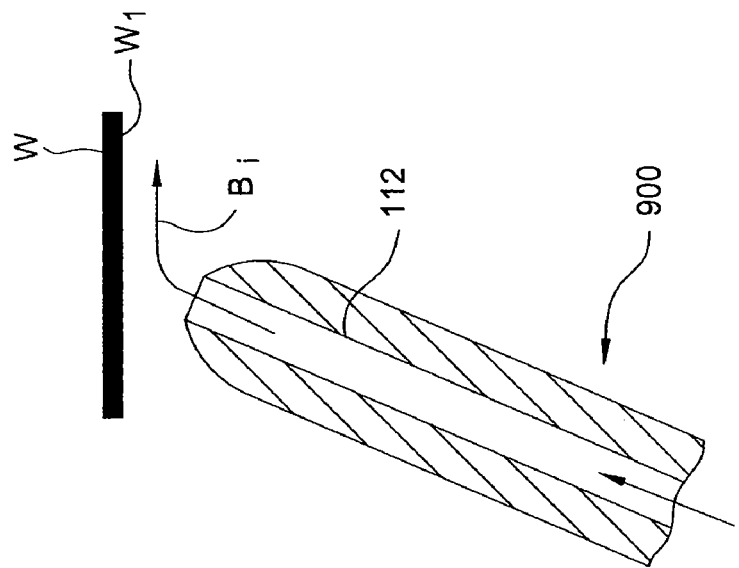
FIGS. 9B-9D are isometric views of a port assembly according to one embodiment of the invention.
Figure 9C:
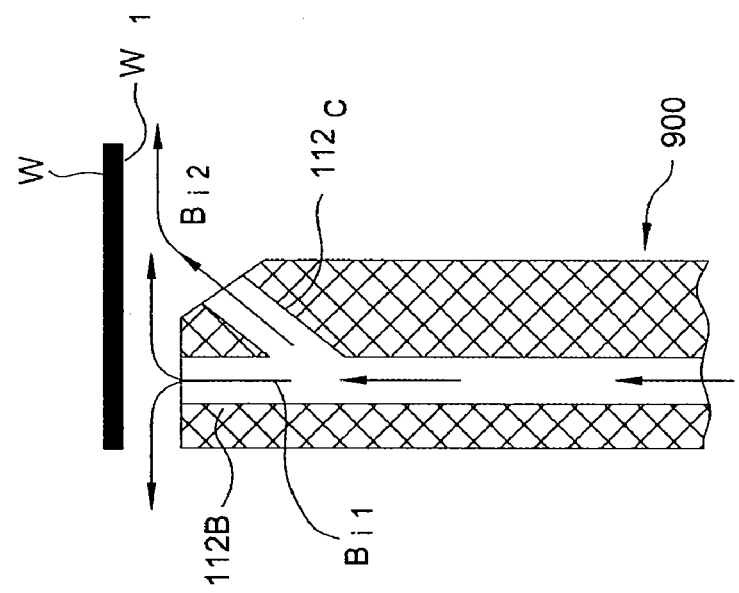
Figure 9B:
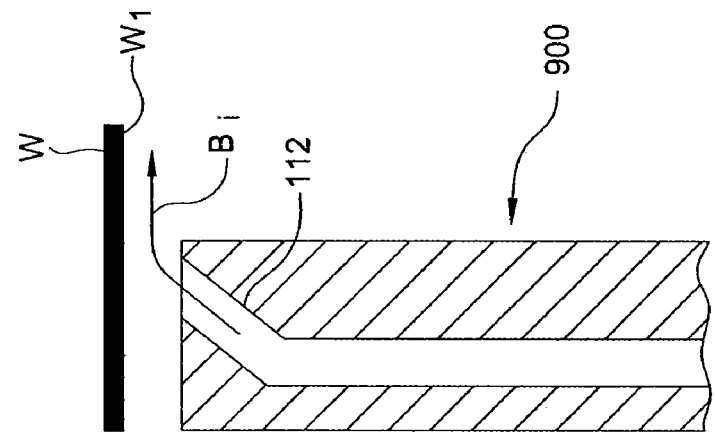

FIGS. 9B-9D are cross-sectional views of various embodiments of the port assembly 900 that can be used to support, position and/or rotate a substrate positioned thereon. FIG. 9A illustrates a port assembly 900 that has an aperture 112 that provides an inlet flow that is perpendicular to the lower surface $W_1$ of the substrate W to primarily support the weight $F_w$ of the substrate. FIG. 9B illustrates one embodiment of a port assembly 900 that has an aperture 112 that provides an inlet flow $B_i$ that is at an angle relative to the lower surface $W_1$ of the substrate W to support and move the substrate W. FIG. 9C illustrates one embodiment of a port assembly 900 that has an aperture 112B that provide an inlet flow $B_{i1}$ that is perpendicular to the lower surface $W_1$ of the substrate W to primarily support the substrate, and an inlet flow $B_{i2}$ from port 112C that is at an angle relative to the lower surface $W_1$ of the substrate W to support and move the substrate W. The size of the apertures 112B-112C can be adjusted to provide the desired amount of support and/or movement of the substrate. FIG. 9D illustrates one embodiment of a port assembly 900 that has an aperture 112 that provides an inlet flow $B_i$ that is at an angle relative to the lower surface $W_1$ of the substrate W to support and move the substrate W.

Figure 10A:
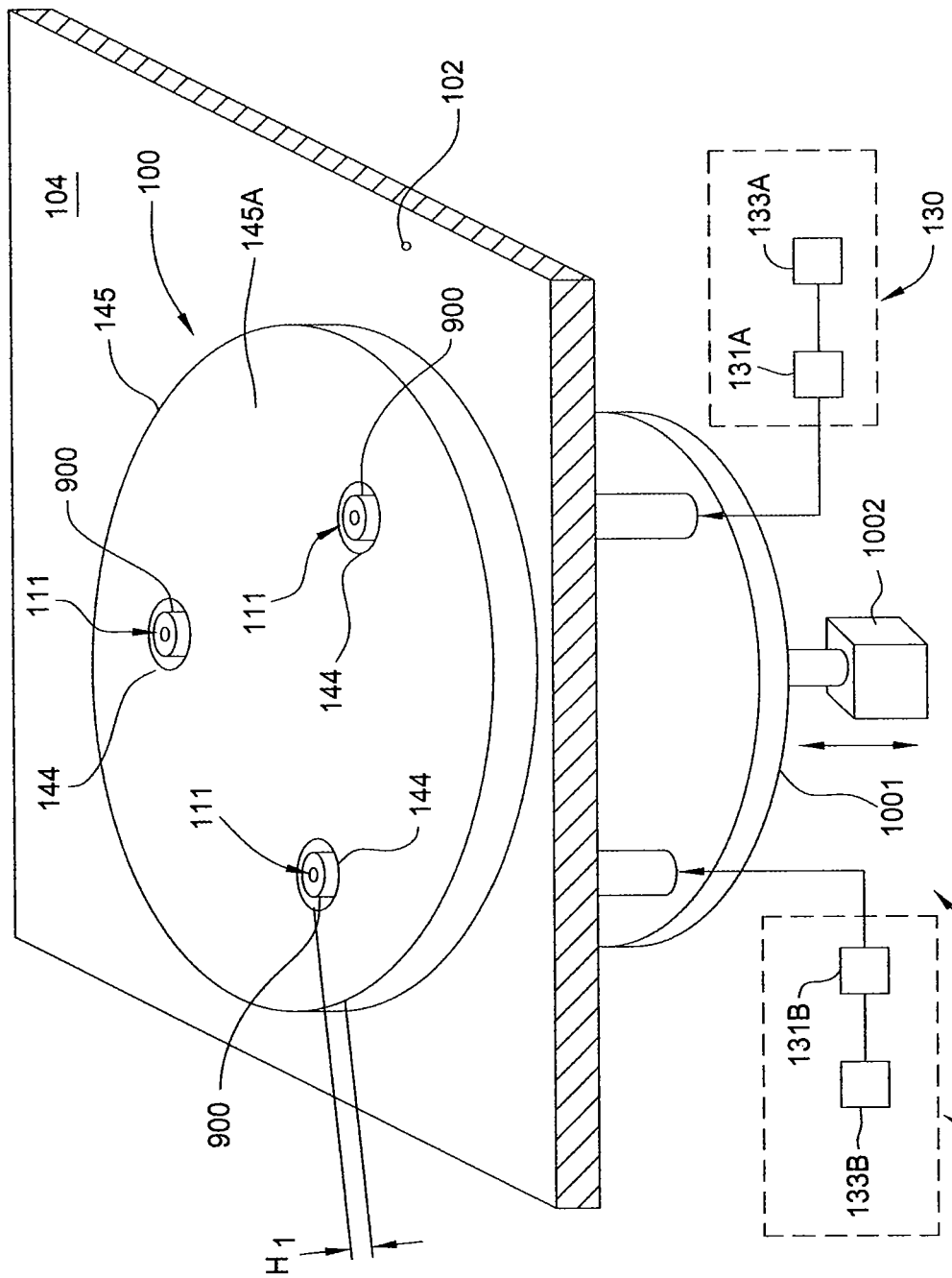
FIG. 10A is an isometric partial section view of a processing chamber according to one embodiment of the invention.
Figure 10B:
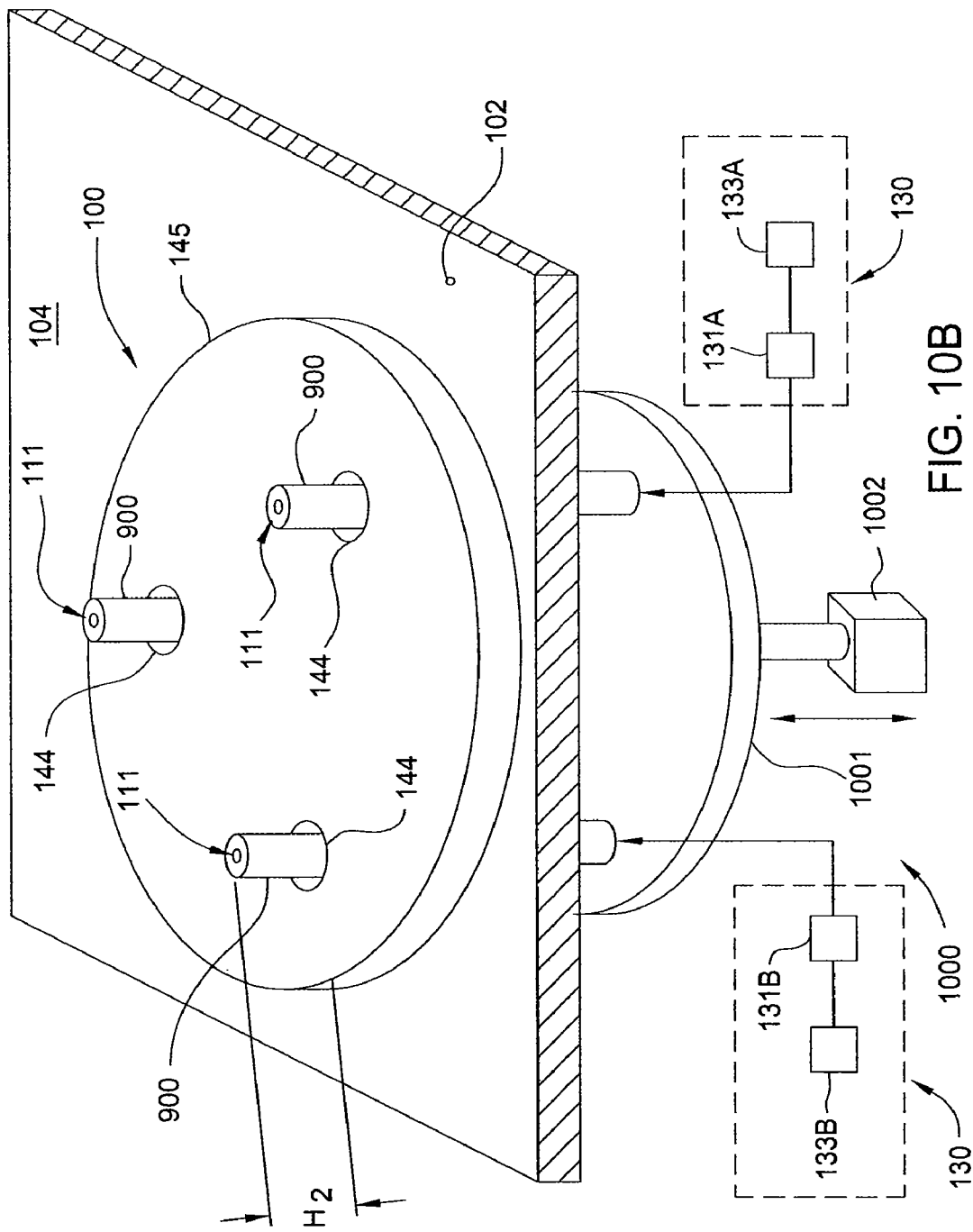
FIG. 10B is an isometric partial section view of a processing chamber according to one embodiment of the invention.

In one embodiment, as shown in FIGS. 10A and 10B, the port assembly 900 is part of a lift assembly 1000 that is used to receive a substrate (not shown for clarity) from a robot (not shown) that is positioned outside of the processing region 104 enclosed by the one or more walls 102 of the processing chamber 101 (FIG. 1). In this configuration a substrate can be supported, positioned and/or rotated by use of the ports 111 on each of the port assemblies 900 contained in the substrate lift assembly 1000. The lift assembly 1000 may generally contain a port assembly support plate 1001 and an actuator 1002 that are adapted to position the port assemblies 900 relative to the substrate plate 145 through the holes 144 formed therein. The actuator 1002 may be a pneumatic cylinder, DC servomotor or similar device, which is in communication with the system controller 120 and is able to reliably position the port assembly 900 and substrate relative to the substrate plate 145.

FIG. 10A is an isometric partial sectional view of a processing chamber 101 in which the lift assembly 1000 and port assemblies 900 are in the "down" position in which processing or robot blade insertion or removal steps may occur. In one embodiment, the "down" position allows the port 111 to be positioned a distance $H_1$ above the surface of the substrate plate 145. FIG. 10B is an isometric partial sectional view of a processing chamber 101 in which the lift assembly 1000 and port assemblies 900 are in the "up" position to allow robot transfer steps to occur. In one embodiment, in the "up" position the port 111 and substrate are positioned a distance $H_2$ above the surface of the substrate plate 145, wherein $H_2$ is greater than $H_1$. In one embodiment, the "down" position allows the substrate to be disposed on the substrate support surface 145A of the substrate plate 145. It should be noted that use of the embodiments shown in FIGS. 10A-10B could be used in conjunction with any of the other embodiments discussed herein. For example, the lift assembly 1000 could be used in conjunction with the substrate support 100 configurations shown in other figures discussed herein.

Referring to FIGS. 1, 2, 10A and 10B, in one embodiment, the transfer sequence of substrate to and from the processing chamber 101 using the lift assembly 1000 includes the following steps: 1) move the lift assembly to the "down" position, 2) insert a robot that contains a substrate, 3) begin the flow of a fluid from the fluid delivery system 130 connected to the one or more port assemblies 900 to support the substrate, 4) move the port assembly support plate 1001 using of the actuator 1002 to remove the substrate from the robot and receive the substrate on the port assemblies 900, 5) retract the robot, 6) move the substrate to a desired processing position in the processing chamber using the port assemblies 900 and the actuator 1002, 7) support, position and/or rotate the substrate using the sensing assembly 123, system controller 120 and fluid sources 130, 8) perform the desired process in the processing chamber 101 (e.g., CVD, RTP, PVD, etch), 9) end the substrate process, 10) move the lift assembly to the "up" position, 11) insert a robot to receive the substrate, 12) deposit the substrate on the robot by moving the lift assembly 1000 to the "down" position, 13) retract the robot, and 14) turn of the flow of fluid from one or more of the port assemblies 900. In one embodiment, the substrate is rotated and actively positioned during the desired substrate processing step(s) (i.e., step 8). The apparatus and methods discussed herein thus also reduce the need for high accuracy robot placement of a substrate in the processing chamber, since the substrate support assembly 100 can actively correct for these errors.

Figure 11A:
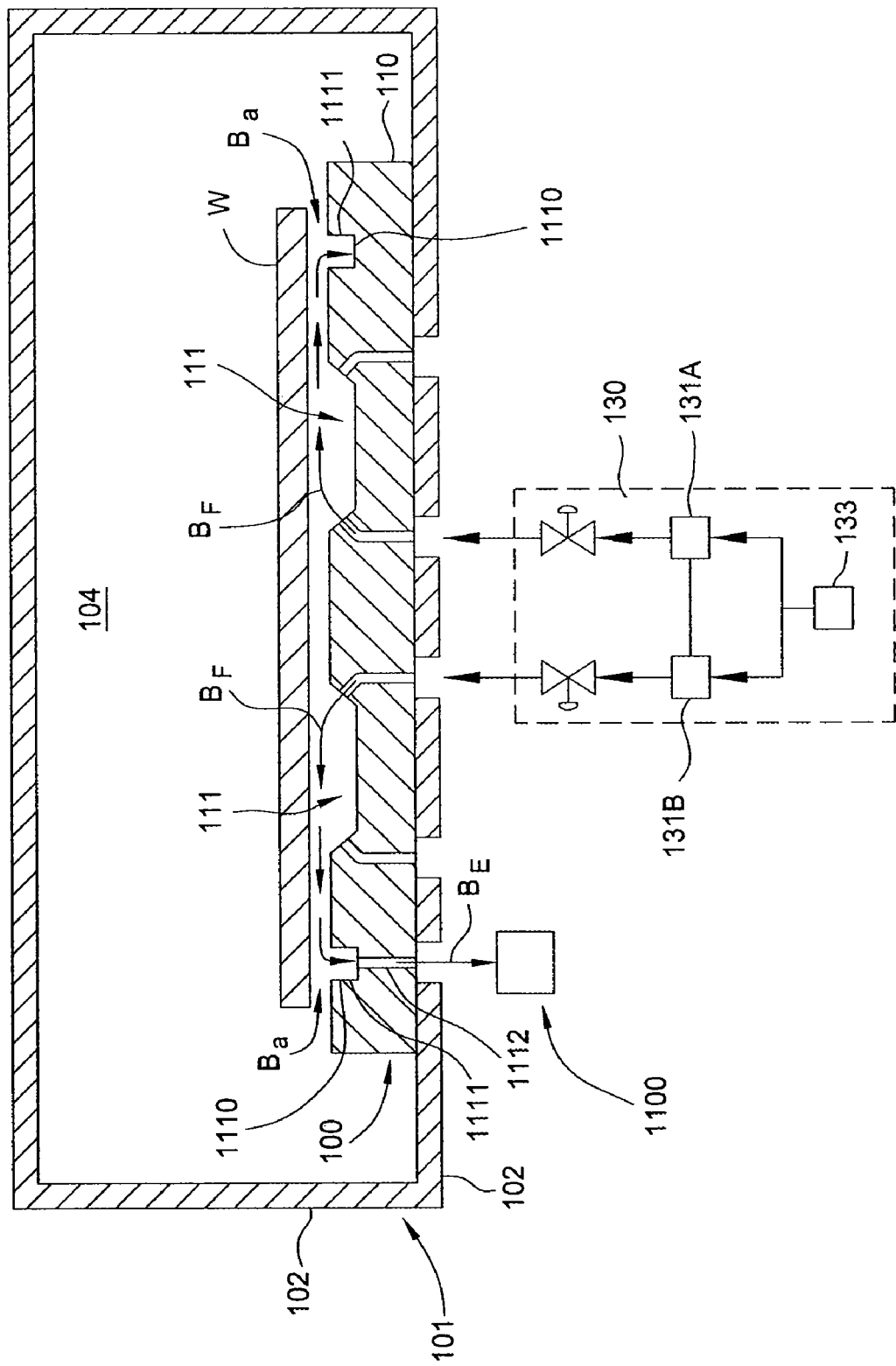
FIG. 11A is a cross-sectional view of a substrate support and a processing chamber according to one embodiment of the invention.

FIG. 11A-11B are side cross-sectional views of another embodiment of a substrate support assembly 100 that is positioned in the processing region 104 of a processing chamber 101. In an effort to reduce or minimize the effect of the fluid flow $B_F$ delivered from the ports 111 from entering and or affecting the process being performed on the substrate in the processing region 104, one or more isolation features 1110 are used to capture the delivered fluid. In one embodiment, one or more isolation features 1110 formed in the substrate support 110 are connected to an exhaust system 1100 to collect and prevent the fluid from making its way into the processing region 104. FIG. 11A illustrates a configuration in which the isolation feature 1110 contains a groove 1111 that circumscribes the edge of the substrate support 110 and is connected to the exhaust system through the one or more exhaust ports 1112 to collect the fluid (i.e., flow $B_E$) provided by the ports 111. In one embodiment, the isolation features 1110 are positioned near the edge of the substrate so that the flow from the processing region (i.e., flow $B_a$) can move the substrate due to the offset of the substrate relative to a circular groove. In one embodiment, the groove 1111 may be between about 20 μm and about 80 μm deep relative to the substrate support surface 110A.

In one embodiment, as shown in FIG. 11B the isolation feature 1110 contains a plurality of a grooves 1111 that circumscribe each of the ports 111 in the substrate support 110 and are connected to the exhaust system 1100 (e.g., rough pump, fluid pump) so that the fluid delivered through one port will not affect the other ports 111 or the process(es) being performed in the processing region 104.

Referring to FIGS. 11A-11B, in one embodiment, the substrate support surface 110A, and thus substrate during processing, is positioned at an angle relative to the horizontal to reduce the required horizontal footprint of the processing chamber. The angle may vary from about zero degrees (i.e., horizontal as shown in FIG. 11A-11B) to about 90 degrees, or vertically oriented (not shown). In one embodiment, the angle of the substrate support surface 110A, and substrate, relative to the horizontal is between about 0.1 degrees and about 85 degrees. To counteract the gravitational forces that would tend cause the substrate to move from the substrate support 110, when it is supported by the fluid, a constant biasing force that counteracts the weight of the substrate will need to be applied to the substrate by the fluid delivered from the plurality of ports 111. In some cases, the isolation features 1110 may also be used to help provide a biasing force that tends to retain the substrate over the substrate support surface 110A by use of the low pressure region formed around the groves 1111 by the exhaust system 1100.

In one aspect of the invention the heat transfer to and/or from the substrate can be controlled by injecting a fluid from the ports 111 within the gap 114 formed between the substrate support 110 and substrate W, during one or more steps of the process performed in the processing region of the processing chamber 101. FIG. 12 illustrates on embodiment, in which heat (Q) is transferred to the substrate support during processing due to conductive or convective heat transfer process occurring during the supporting, positioning and or rotating processes performed on the substrate. In one embodiment, a gas having desirable thermal properties (e.g., high thermal conductivity) is injected into the gap 114, such a gas that contains helium (He), nitrogen ($N_2$), argon (Ar), or combination thereof to improve the heat transfer process.

Rapid Thermal Annealing Chamber Configurations

Figure 13A:
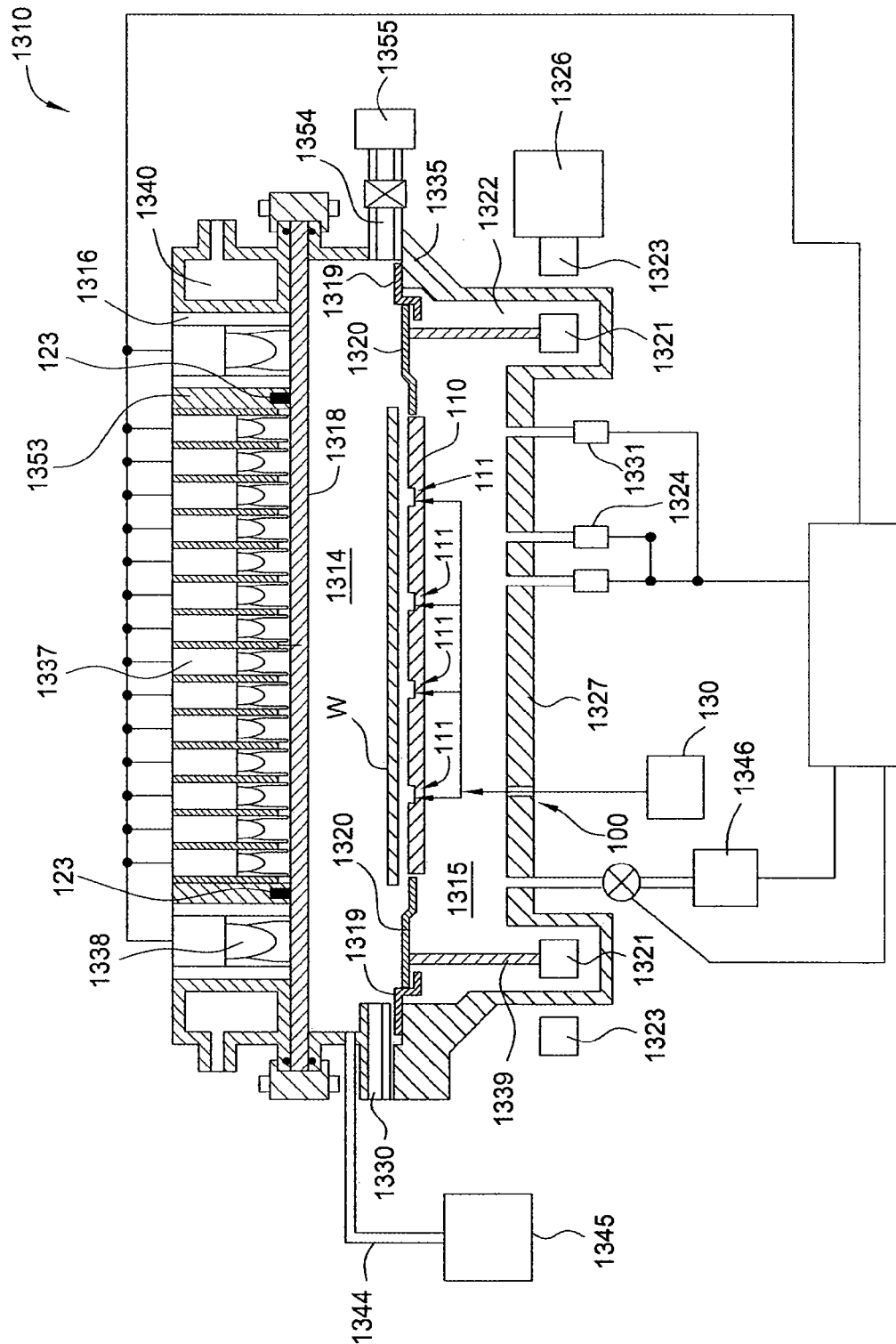
FIGS. 13A-13C is a cross-sectional view of a processing chamber according to one embodiment of the invention.
Figure 13B:
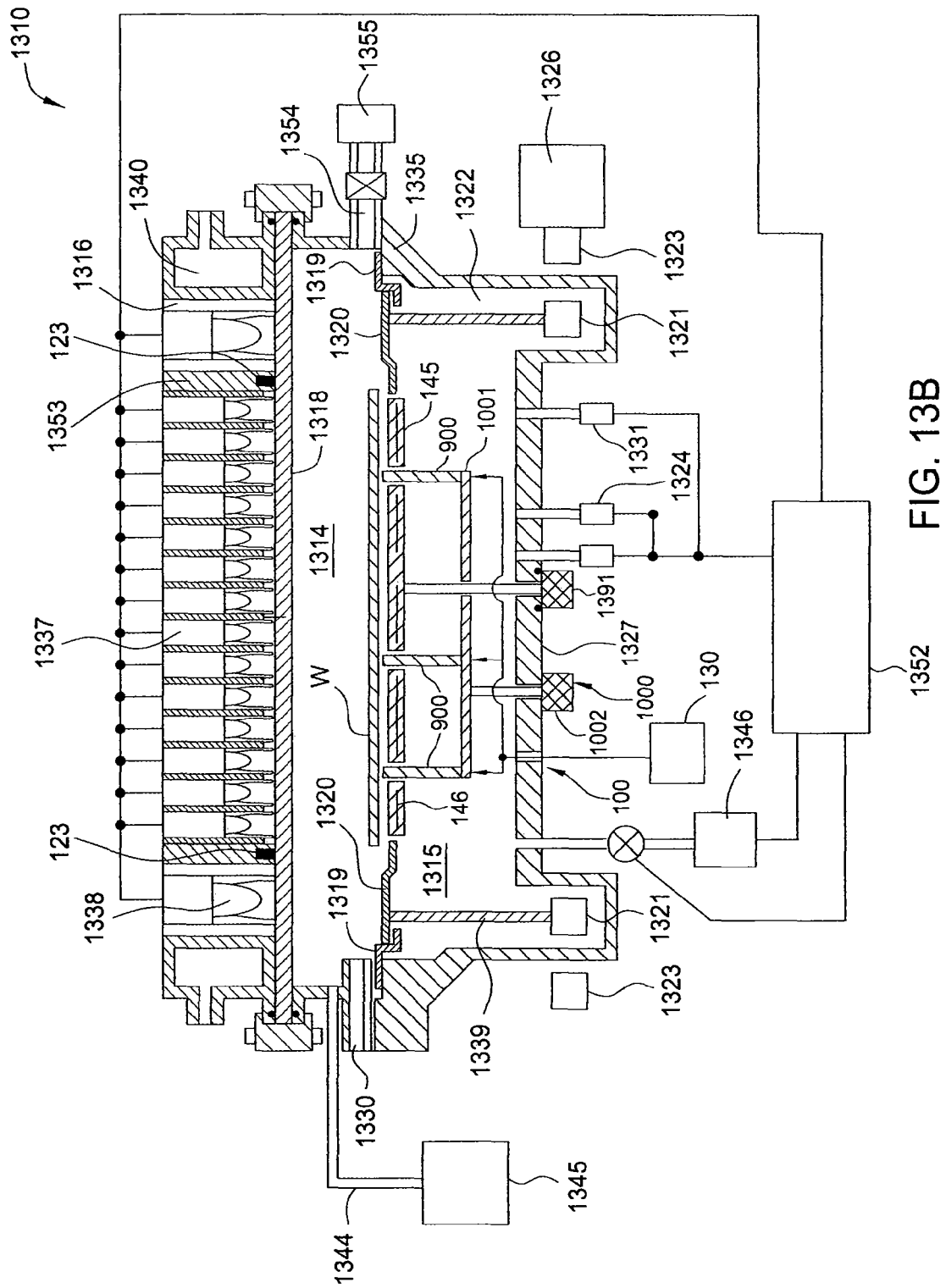
Figure 13C:
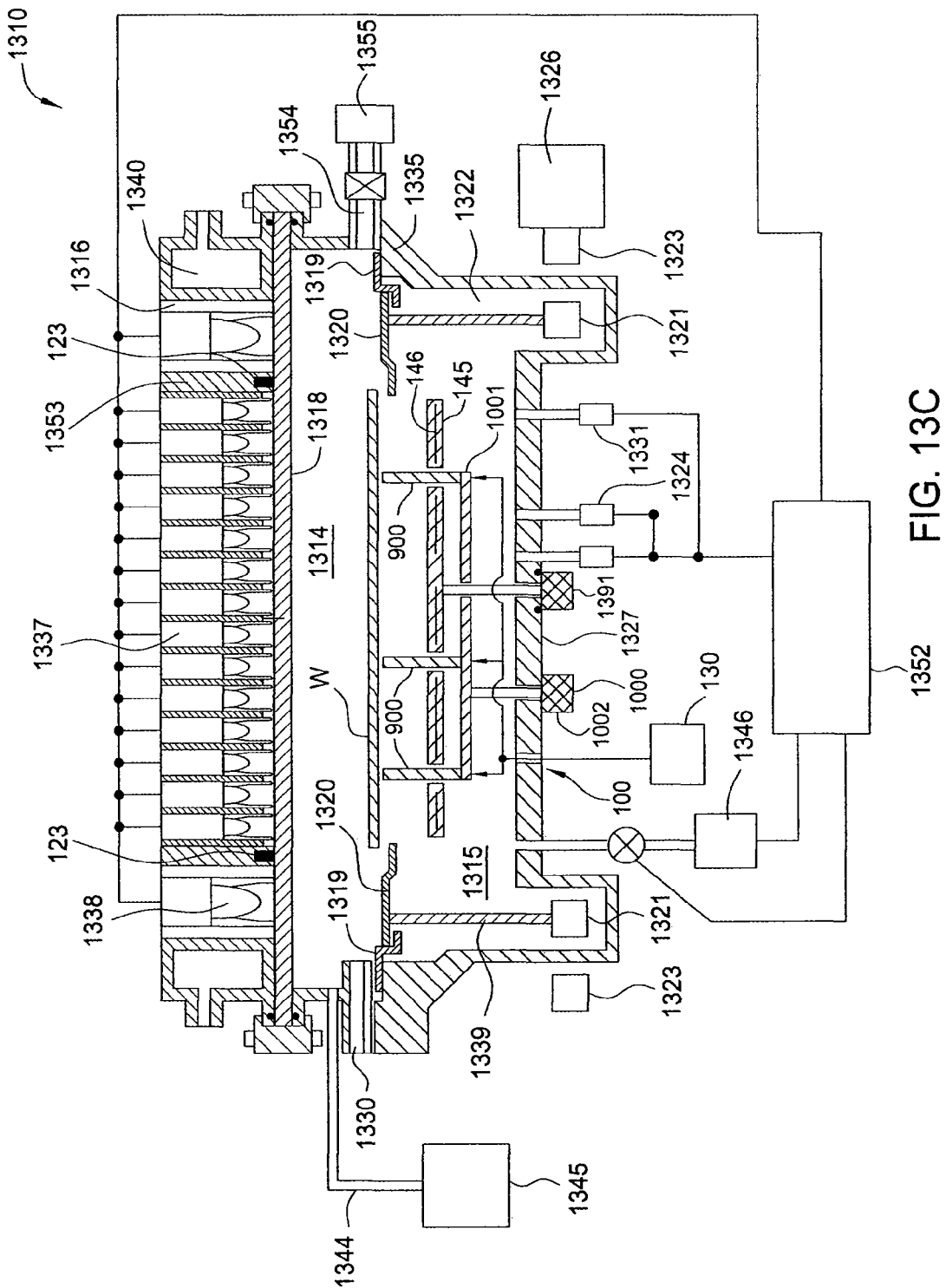

FIGS. 13A-13C are cross-sectional views of a thermal processing system 1310 in accordance with one embodiment of the present invention. The thermal processing system 1310 comprises a chamber body 1335 defining a processing volume 1314 configured for annealing a substrate W therein. The chamber body 1335 may be made of stainless steel and may be lined with quartz. The processing volume 1314 is configured to be radiantly heated by a heating assembly 1316 disposed on a quartz window 1318 of the thermal processing system 1310. An example of a thermal processing system and methods of using the same is further described in U.S. patent application Ser. No. 11/623,238, filed Jan. 15, 2007, which is incorporated by reference herein.

A slit valve 1330 may be formed on a side of the chamber body 1335 providing a passage for the substrate W to the processing volume 1314. A gas inlet 1344 may be connected to a gas source 1345 to provide processing gases, purge gases and/or cleaning gases to the processing volume 1314. A vacuum pump 1355 may be fluidly connected to the processing volume 1314 through an outlet 1354 for pumping out the processing volume 1314.

A circular channel 1322 is formed near the bottom of the chamber body 1335. A magnetic rotor 1321 is disposed in the circular channel 1322. A tubular riser 1339 rests on or otherwise coupled to the magnetic rotor 1321. In one embodiment, the substrate W is supported by a peripheral edge by an edge ring 1320 disposed on the tubular riser 1339 during one or process steps performed in the thermal processing system 1310. A magnetic stator 1323 is located externally of the magnetic rotor 1321 and is magnetically coupled through the chamber body 1335 to induce rotation of the magnetic rotor 1321 by use of a motor 1326 and hence of the edge ring 1320, and the substrate W when supported thereon. The magnetic stator 1323 may be also configured to adjust the elevations of the magnetic rotor 1321, thus lifting the substrate W being processed. Additional magnetic rotation and levitation information is available in the U.S. Pat. No. 6,800,833, which is hereby incorporated by reference.

The chamber body 1335 may include a reflector plate 1327 near the back side of the substrate W. The reflector plate 1327 has an optical reflective surface 1328 facing the back side of the substrate W to enhance the emissivity of the substrate W. In one embodiment, the reflector plate 1327 may be water cooled. The reflective surface 1328 and the back side of the substrate W define a reflective cavity 1315. In one embodiment, the reflector plate 1327 has a diameter slightly larger than the diameter of the substrate W being processed. For example, if the thermal processing system 1310 is configured to process 300 mm substrates, the diameter of the reflector plate 1327 may be about 13 inches. In one embodiment, an outer ring 1319 may be coupled between the chamber body 1335 and the edge ring 1320 to separate the reflective cavity 1315 from the processing volume 1314. The reflective cavity 1315 and the processing volume 1314 may have different environments.

A purge gas may be provided to the reflector plate 1327 through a purge gas inlet 1348 connected to a purge gas source 1346. The purge gas ejected through the reflector plate 1327 helps cooling of the reflector plate 1327.

The heating assembly 1316 may comprise an array of heating elements 1337. The array of heating elements 1337 may be UV lamps, halogen lamps, laser diodes, resistive heaters, microwave powered heaters, light emitting diodes (LEDs), or any other suitable heating elements. The array of heating elements 1337 may be disposed in vertical holes formed in a reflector body 1353. In one embodiment, the heating elements 1337 may be arranged in a hexagon pattern. A cooling channel 1340 may be formed in the reflector body 1353 to cool the array of heating elements 1337 during processing.

The array of heating elements 1337 are connected to a controller 1352 which are capable of adjusting heating effects of the array of heating elements 1337. In one embodiment, the array of heating elements 1337 may be divided into a plurality of heating groups to heat the substrate W by multiple concentric zones. Each heating group may be controlled independently to provide desired temperature profile across a radius of the substrate W. Detailed descriptions of the heating assembly 1316 may be found in U.S. Pat. Nos. 6,350,964 and 6,927,169, which are hereby incorporated by reference.

In one embodiment, an edge ring heating assembly 1338 configured primarily to heat the edge ring 1320 may be disposed outside the array of heating elements 1337. The edge ring heating assembly 1338 is connected to the controller 1352 which may adjust the heating power of the edge ring heating assembly 1338. The edge ring heating assembly 1338 is independently controllable from the array of heating elements 1337, hence controlling the temperature of the edge ring 1320 independently from the temperature of the substrate W. In one embodiment, the edge ring heating assembly 1338 may be one of the heating groups of the array of heating elements 1337.

The thermal processing system 1310 may further comprise a plurality of thermal probes 1324 configured to measure thermal properties of the substrate W at different radial locations. In one embodiment, the plurality of thermal probes 1324 may be a plurality of pyrometers optically coupled to and disposed on the reflector plate 1327 to detect a temperature or other thermal properties of a different radial portion of the substrate W. Detailed description of similar temperature probes may be found in the U.S. Pat. No. 5,755,511, which is hereby incorporated by reference. The plurality of temperature probes 1324 is connected with the controller 1352 which may conduct a closed loop control to adjust the power supplies to the array of heating elements 1337 to provide a tailored radial thermal profile across the substrate W.

The thermal processing system 1310 may further comprise an edge ring thermal probe 1331 disposed on the reflector plate 1327 near the edge ring 1320. The edge ring thermal probe 1331 may be a pyrometer configured to measure a temperature or other thermal properties of the edge ring 1320. The edge ring thermal probe 1331 is connected with the controller 1352 which is connected to the edge ring heating assembly 1338. The controller 1352 is generally part of the system controller 120 discussed above. The controller 1352 may conduct a closed loop control to the edge ring heating assembly 1338 using the measurement from the edge ring thermal probe 1331. In one embodiment, the edge ring 1320 may be heated to a desired temperature independently from the substrate W during a thermal process.

The edge ring 1320 may be designed to have thermal properties, such as thermal mass, emissivity and absorptivity, according to the thermal properties of the substrate W being processed to improve substrate temperature profile. The thermal properties of the edge ring 1320 may be altered by choosing different materials, different thicknesses and different coatings. A detailed description of edge ring design may be found in the U.S. Pat. No. 7,127,367, which is hereby incorporated by reference. In one embodiment, the edge ring 1320 may be made from silicon with a nickel coating.

In one embodiment, the magnetic rotor 1321 may rotate the edge ring 1320 and the substrate W, and also position the substrate W in a desired elevation in the processing chamber. During most processes, the objective is to rapidly heat the substrate W uniformly to a target temperature. In one embodiment of the present invention, heat transfer to the substrate W mainly comes from radiation of the array of heating elements 1337 and conduction and/or radiation from the edge ring 1320 which is heated to a desired temperature. A uniform temperature profile across the substrate W may be achieved by controlling the array of heating elements 1337 and by keeping the edge ring 1320 at the desired temperature which is usually different than the target temperature for the substrate W. However, the use of magnetic rotor 1321 and its supporting components are complex and expensive due to the need to impart motion, support, and control the components that are contained in the processing region (e.g., reflective cavity 1315, processing volume 1314) that is under vacuum or in an isolated inert environment. One advantage of the embodiments of the substrate support assembly 100 and lift assembly 1000, discussed herein, is that it allows the substrate to be rotated in a very simple manner without the need for the magnetic stator 1323, magnetic rotor 1321, tubular riser 1339, circular channel 1322, motor 1326, and/or other supporting components. In one embodiment, the edge ring 1320 remains stationary while the substrate W is supported, positioned and/or rotated by use of the substrate support assembly 100 and/or lift assembly 1000.

In one embodiment, as shown in FIG. 13A, a substrate support assembly 100 is positioned within the processing volume 1314 to support, position, and/or rotate the substrate W disposed thereon. In this configuration the substrate support 110 contains a plurality of ports 111, a fluid delivery system 130, a sensing assembly 123 and a controller 1352 that are used to position and/or rotate the substrate during thermal processing using at least one of the processes and configurations discussed above. The sensing assembly 123 is generally positioned to monitor the position of the substrate W and mounted in the heating assembly 1316 near the edge of the substrate. In one embodiment, the substrate support 110 is made of an optically transparent material, such as quartz or sapphire that allows the temperature of the substrate to be sensed at a desired wavelength through the substrate support 110 using the plurality of thermal probes 1324 that are connected with the controller 1352.

In one embodiment, during processing the substrate is rotated at a speed between about 100 and about 3000 rpm using the plurality of ports 111 during the thermal processing steps performed on the substrate. By rapidly rotating the substrate even heat distribution may be obtained due to the averaging effect of any non-uniformities found in the heating assembly. Furthermore, because substrate W is not in contact with the substrate support surface uneven thermal losses are kept at a minimum.

In one embodiment, as shown in FIGS. 13B and 13C, port assemblies 900 that are part of a lift assembly 1000 (discussed above) are used to receive a substrate from a robot (not shown). In this configuration a substrate can be supported, positioned and/or rotated by use of the ports 111 formed on each of the port assemblies 900. FIG. 13B is cross-sectional view of the thermal processing system 1310 in which the lift assembly 1000 and port assemblies 900 are in the "processing" position in which processing steps may occur. In one embodiment, the lift assembly 1000 is used to position the substrate W at a desired elevation in the processing chamber during processing. In one embodiment, the lift assembly 1000 is moved from an "up" position (not shown), which is generally above the processing position, to allow port assemblies to pick up or drop off a substrate on a robot blade and a "down" position (not shown), which is generally below the processing position, to allow the robot to enter the thermal processing system 1310 with a substrate disposed on the blade. In one embodiment, the "down" position allows the substrate to be disposed on the substrate plate 145, or on the edge ring 1320.

In one embodiment, as shown in FIGS. 13B and 13C, an actuator assembly 1391 is used to move and position the substrate plate 145 relative to the substrate W and port assemblies 900 to change the heat transfer characteristics surrounding the substrate during thermal processing. In this configuration, the substrate plate 145, which can be heated by use of embedded resistive heating elements 146, can be moved from a position close to the substrate (FIG. 13B) during one step of the thermal process and to a position a distance away from the substrate (FIG. 13C) during another part of the process to change the heat transfer to or from the substrate. In one embodiment, the substrate plate 145 comprises an optically transparent material, such as quartz or sapphire that allows the temperature of the substrate to be sensed through the substrate plate 145 using the plurality of thermal probes 1324 that are connected with the controller 1352.

During a rapid thermal process, the substrate W may be transferred to the processing volume 1314 through the slit valve 1330 and supported by the fluid delivered from the ports 111 formed on the substrate support assembly 100. In one embodiment, the substrate W is supported by the edge ring 1320 during part of the thermal processing steps. In one embodiment, it is desirable to align and position the substrate in a desired horizontal position (X, Y directions) in the thermal processing system by use of the fluid delivered from the ports 111 and the sensing assembly 123 prior to positioning the substrate in a desired position on the edge ring 1320. The use of the ports 111 to actively position a substrate in a desirable position on the edge ring 1320 can be important, since it will tend to remove one of the major sources of temperature non-uniformity found in these type high temperature thermal processes. The substrate support assembly 100 also reduces the need for a highly accurate and highly repeatable robotic transfer systems that are used to transfer substrates to the processing region of the processing chamber, since the substrate support assembly 100 can be used to accurately realign and place the substrate in a desired position within the processing chamber.

Controlling the array of heating element 1337 may be conducted by measuring the temperature of the substrate W across a radius using the plurality of thermal probes 1324. In one embodiment, the plurality of thermal probes 1324 may be evenly distributed across the reflector plate 1327 corresponding to a radius of the substrate W. The measured temperatures from the plurality of thermal probes 1324 are sampled by the controller 1352. The controller 1352 may used the measured temperatures to adjust the array of heating elements 1337 so that the temperature across a radius of the substrate W becoming uniform. In one embodiment, the controller 1352 may adjust the array of heating elements 1337 by a plurality of concentric zones. Detailed descriptions of controlling heating elements by multiple zones may be found in U.S. Pat. No. 5,755,511 and U.S. patent application Ser. No. 11/195,395, published as United States Patent Application Publication No. 2006/0066193, which are hereby incorporated by reference.

It should be noted that while FIGS. 13A-13C illustrate a thermal processing system 1310 that has a heating assembly 1316 that is positioned over the substrate W this configuration is not intended to limiting as to the scope of the invention, since the heating assembly 1316 could easily be positioned below or on both sides of the substrate W as needed to improve the thermal process without deviating from the basic scope of the invention described herein. As noted above, in some cases it is desirable to make components in the substrate support assembly (e.g., substrate support 110, substrate plate 145) from an optically transparent material to allow heat to be received by the substrate or sensed by one of more of the temperature sensing devices (e.g., reference numerals 1324, 1331).

Low Pressure CVD Chamber Configuration

Figure 14A:
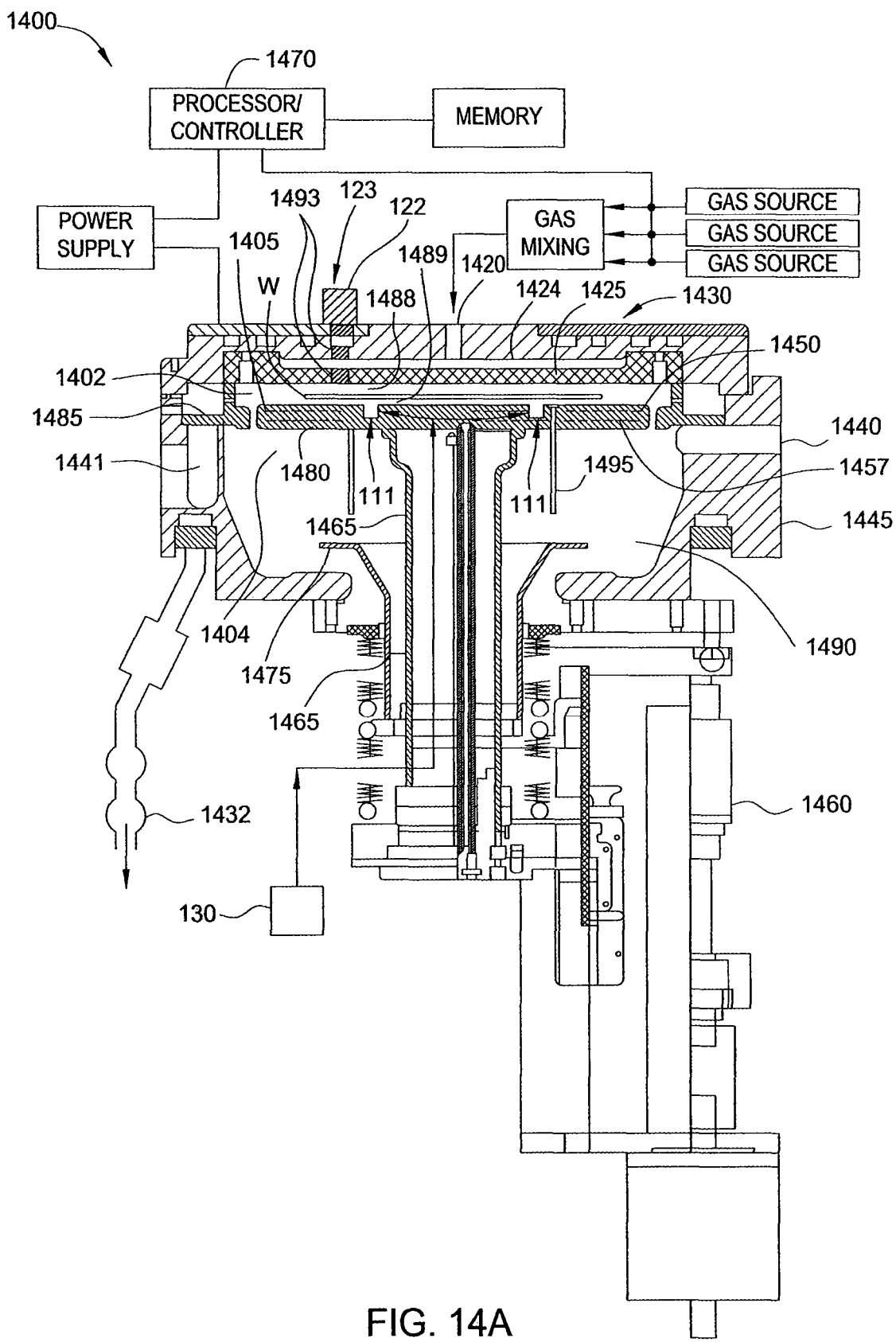
FIG. 14A is a cross-sectional view of a processing chamber according to one embodiment of the invention.

FIG. 14A illustrates an apparatus that may be adapted to use one or more of the embodiments of the substrate support assembly discussed above. FIG. 14A generally illustrates a POLYgen CENTURA® chemical vapor deposition (CVD) chamber, commercially available from Applied Materials, Inc. of Santa Clara, Calif. In one particular embodiment, the apparatus may be a Low pressure CVD (LPCVD) chamber 1400. The LPCVD chamber 1400 illustrated in FIG. 14A is generally constructed of materials that can maintain a chamber pressure between about 200 Torr and about 350 Torr and a deposition chamber temperature between about 600° C. and about 800° C. For the purpose of illustration, the LPCVD chamber 1400 may have a chamber volume of about 5-6 liters. FIG. 14A illustrates the inside of the chamber body 1445 in a "substrate-process" position. A substrate W is indicated in dashed lines to indicate its location in the LPCVD chamber 1400. In one embodiment, the LPCVD chamber 1400 is adapted to hold a single substrate, and may be sized to accommodate a substrate having a diameter greater than about 200 mm.

The chamber body 1445 defines a reaction chamber 1490 in which the thermal decomposition of a process gas or gases takes place to form a CVD deposited film on a substrate W, such as a polysilicon film. In one embodiment, the LPCVD chamber 1400 may be a "cold-wall" reaction chamber that is formed from an aluminum material and has cooling channels formed therein. Resident in the reaction chamber 1490 is a susceptor 1405 that may contain a resistive heater 1480 that is supported by a shaft 1465. The susceptor 1405 has a surface area sufficient to support a substrate such as the semiconductor substrate W (shown in dashed lines).

FIG. 14A also illustrates a cross-sectional view of a portion of the heater 1480, including a cross-section of the body of the susceptor 1405 and a cross-section of a shaft 1465. As shown, the body of the susceptor 1405 may have two heating elements formed therein, such as a first heating element 1450 and a second heating element 1457 that compatible with the material from which the susceptor 1405 is made. In an alternative embodiment, the LPCVD chamber 1400 may include lamps instead of the resistive type of heating elements 1450 and 1457. An example of a useful suseptor design, and useful pressure control techniques, and temperature control techniques are further described in U.S. Patent Application Ser. No. 60/990,173, filed Nov. 26, 2007, which is incorporated by reference herein.

The LPCVD chamber 1400 allows for a precise control of the temperature and pressure of the deposition environment. The passage of a process gas through a blocker plate 1424 and a perforated face plate 1425 provides the advantage of a uniform gas distribution towards the substrate W. Suitable materials for the reaction chamber 1490 should be compatible with the process gases and other chemicals, such as cleaning chemicals (e.g., nitrogen trifluoride, $NF_3$) that may be introduced into the reaction chamber 1490.

The exposed surfaces of the heater 1480 may be comprised of a variety of materials provided that the materials are compatible with the process gases. For example, the susceptor 1405 and the shaft 1465 of the heater 1480 may be comprised of similar aluminum nitride material. In one embodiment, the susceptor 1405 of the heater 1480 may be coupled to the shaft 1465 by diffusion bonding or brazing, because this type of coupling may withstand the environment of the reaction chamber 1490.

During processing a process gas may enter the otherwise sealed reaction chamber 1490 through a gas distribution port 1420 in a top surface of the chamber lid 1430 of the chamber body 1445. The process gas may then go through the blocker plate 1424 to distribute the gas about an area consistent with the surface area of the substrate W. Thereafter, the process gas may be distributed through the perforated face plate 1425 located above the heater 1480 and coupled to the chamber lid 1430 inside the reaction chamber 1490. In one embodiment, the combination of the blocker plate 1424 with the face plate 1425 creates a uniform distribution of process gas near a top surface of the substrate W.

As illustrated in FIG. 14A, the substrate W may be placed in the reaction chamber 1490 on the susceptor 1405 of the heater 1480 through an entry port 1440 in a side portion of the chamber body 1445. To accommodate a substrate for processing, the heater 1480 is lowered so that the surface of the susceptor 1405 is below the entry port 1440. In one embodiment, the substrate W may be loaded into the reaction chamber 1490 by way of, for example, a transfer blade of a robotic transfer device (not shown) onto the top surface of the susceptor 1405. Once the substrate W is loaded, the entry port 1440 is sealed and the heater 1480 is advanced in an upward direction toward the face plate 1425 by a lifter assembly 1460 that may include, for example, a stepper motor. In the substrate-process position of FIG. 14A, the reaction chamber 1490 is divided into two zones, a first zone 1402 above the top surface of the susceptor 1405, and a second zone 1404 below the bottom surface of the susceptor 1405.

With the substrate W disposed within the reaction chamber 1490, the first zone 1402 includes an area 1488 above the substrate W where a film is formed on the top surface of the substrate W (e.g., polysilicon film on the substrate surface facing the perforated face plate 1425). In an alternative embodiment, formation of a film may be accomplished in both sides of the substrate by positioning the substrate above the top surface of the susceptor 1405 to allow deposition on the backside of the substrate (i.e., area 1489).

The process gas, which flows into the reaction chamber 1490 under the control of a gas panel, may be thermally decomposed to form a film on the substrate. At the same time, an inert bottom-purge gas, e.g., nitrogen, may be introduced into the second zone 1404 to inhibit film formation in that zone. In one embodiment, a baratron pressure regulator(s) maintains the pressure in the first zone 1402 at a level between about 200 Torr to about 350 Torr and a temperature between about 600° C. and 800° C. for the deposition of a polysilicon film on the substrate W.

Residual process gas may be pumped out of the reaction chamber 1490 through a pumping plate 1485 to a collection vessel at a side of the chamber body 1445. A pump 1432 disposed outside the reaction chamber 1490 may provide vacuum pressure within a pumping channel 1441 to draw both the process and purge gases out of the reaction chamber 1490 to the pump 1432. Preferably, a controller or processor (not shown) receives signals from the pressure sensor(s) to allow the chamber pressure to be adjusted and maintained a desired pressure by controlling the pump 1432 flow rate.

Once the processing of the substrate W is complete, the reaction chamber 1490 may be purged, for example, with an inert gas, such as nitrogen. After processing and purging, the heater 1480 is lowered by the lifter assembly 1460. As the heater 1480 is moved, lift pins 1495, which extend through openings in a surface of the susceptor 1405, contact a lift plate 1475 positioned at the base of the reaction chamber 1490. As the heater 1480 continues to move downward driven by the lifter assembly 1460, the lift pins 1495 remain stationary and ultimately extend above the susceptor 1405 to separate the processed substrate W from the surface of the susceptor 1405. The surface of the susceptor 1405 is thereby moved to a position below the entry port 1440. Once a processed substrate W is separated from the surface of the susceptor 1405, the transfer blade of a robotic mechanism may be moved through the entry port 1440 beneath the top ends of the lift pins 1495 that supports the substrate W. Next, the lifter assembly 1460 further moves downward the heater 1480 and the lift plate 1475 to a "substrate load" position. The processed substrate W may then be retrieved through the entry port 1440 and transferred to the next processing stage. A second substrate (not shown) may then be loaded into the reaction chamber 1490 for processing. The steps described above then may be reversely performed to bring the new substrate W into a process position.

The LPCVD chamber 1400 may include a processor/controller 1470 that is similar to the system controller 120 discussed above. In one embodiment, the LPCVD chamber 1400 includes instructions and process parameters for delivering a gas mixture including a silicon source gas and a carrier gas into the reaction chamber 1490, heating the susceptor 1405 to a temperature between about 640° C. and about 750° C., and generating a pressure between about 200 Torr to about 350 Torr within the reaction chamber 1490 so that a polysilicon film may be deposited by thermal chemical vapor deposition onto the substrate W.

In one embodiment, as shown in FIG. 14A, the susceptor 1405 contains the components found in the substrate support assembly 100 discussed above. In this configuration, the susceptor 1405 is adapted to support, position, and/or rotate the substrate W disposed thereon. The heater 1480, much like the substrate support 110 discussed above, contains a plurality of ports 111 that are in communication with the fluid delivery system 130, which combined with the sensing assembly 123 and controller 1352 can position and/or rotate the substrate during processing. In one embodiment, the substrate is rotated at a speed between about 100 and about 3000 rpm using the plurality of ports 111 during the processing steps performed on the substrate. By rotating the substrate even heat distribution may be obtained. Also, since the susceptor 1405 components and other related components do not need to be rotated the hardware complexity and chamber reliability is greatly increased. The complexity and reliability improvement over configurations that require the susceptor 1405, or other related components, to be rotated is especially true for configurations where the process is performed in a high temperature (e.g., >500° C.) vacuum environment where the susceptor 1405 also needs to be moved vertically.

In one embodiment, the sensing assembly 123, which is positioned and within the chamber lid 1430, is positioned and configured to monitor the position of the substrate W. In one embodiment, the sensing assembly 123 contains a sensor 122 that is positioned to view the edge of a substrate disposed over the susceptor 1405 so that the system controller (i.e., processor/controller 1470) can control the position and movement of the substrate by use of fluid delivered through the ports 111. In one embodiment, one or more windows 1493 are sealably mounted to components in the chamber lid 1430, such as blocker plate 1424 and a perforated face plate 1425, to provide an optical path to allow one or more sensors (e.g., retroreflective type sensor) to view and monitor the motion of the substrate.

Figure 14B:
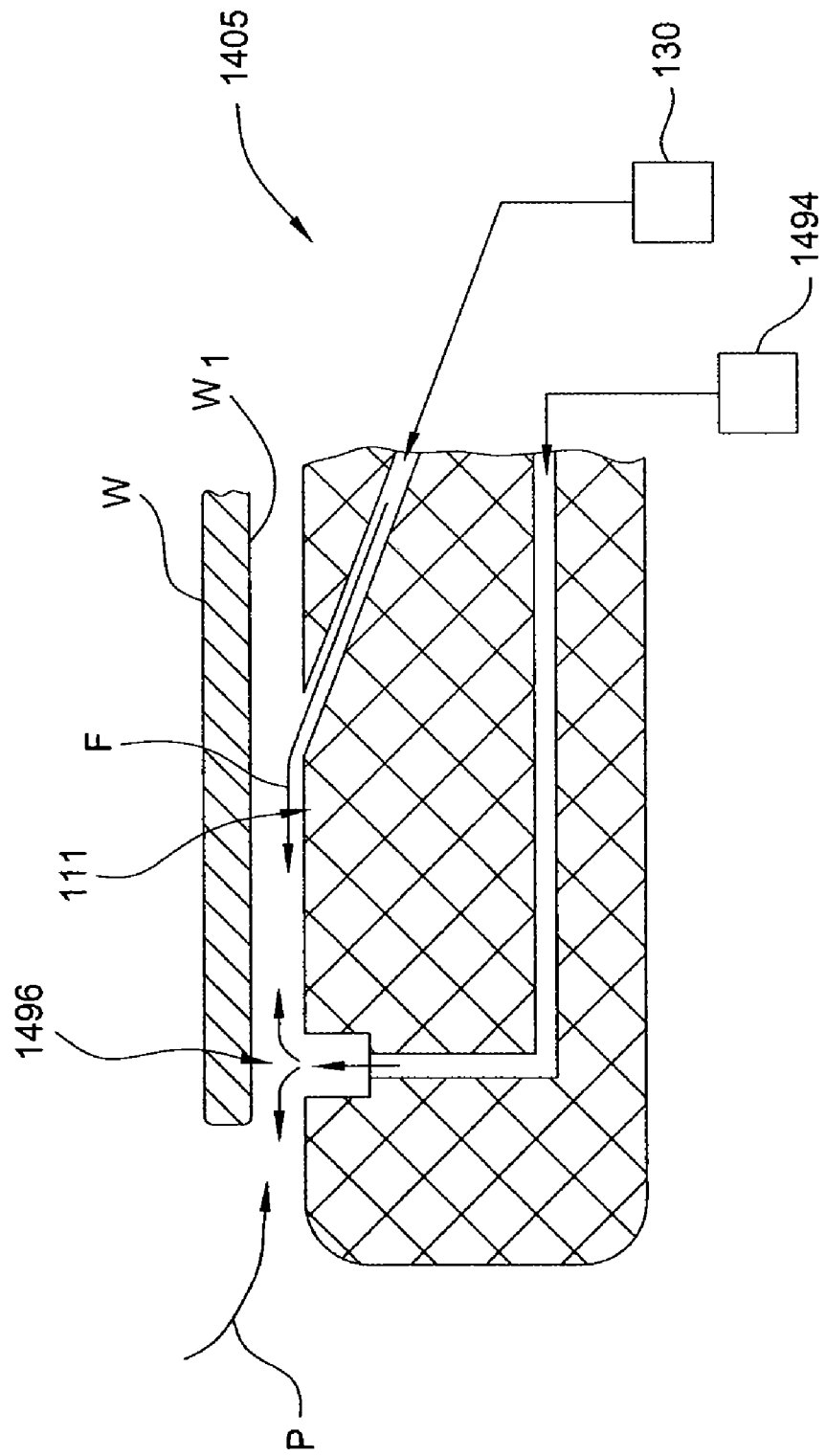
FIG. 14B is a close-up cross-sectional view of a susceptor according to one embodiment of the invention.

FIG. 14B is close up cross-sectional view of an region of the susceptor 1405 that has a port 111 that can be used to support, position and/or rotate the substrate W. In one embodiment, the plurality of ports 111 are positioned so that the fluid flow (i.e., flow F in FIG. 14B) tends to prevent the reactive process elements "P" in the processing region (e.g., CVD precursor components) delivered into the area 1488 from making their way to the lower surface $W_1$ of the substrate W. In one embodiment, an additional plurality of ports 1496, which are connected to a fluid source 1494, are positioned near the edge of the susceptor 1405 to inhibit the movement of the reactive process elements "P" to the lower surface $W_1$ of the substrate W. In general, this configuration may be advantageous, since it tends to decouple the fluid flow needed to shield the lower surface $W_1$ of the substrate from the control of the movement and position of the substrate provided by the ports 111.

Edge Roller Design

Figure 15:
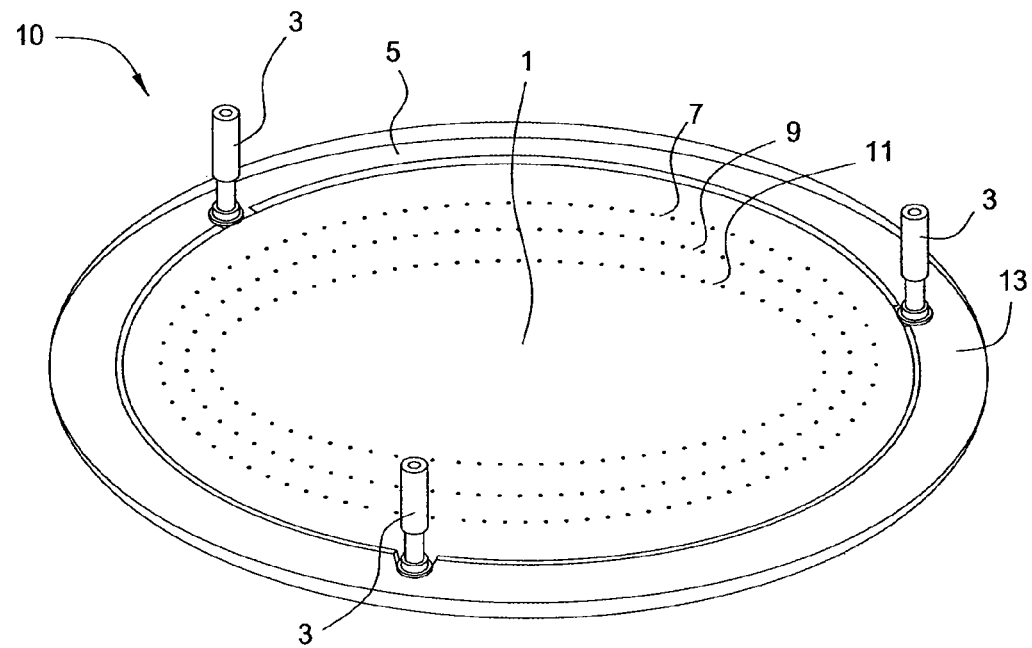
FIG. 15 depicts a perspective view of a substrate support and positioning assembly according to one embodiment of the invention.

FIG. 15 depicts a perspective view of a substrate support and positioning assembly 10 according to one embodiment of the invention. The substrate support and positioning assembly 10 includes a base plate 1, on which a plurality of air bearing edge rollers 3 and a thermal edge barrier 5 may be positioned. Base plate 1 is an annular body and may include a plurality of apertures for flowing gas therethrough to elevate the substrate. Apertures for providing vacuum between a substrate and base plate 1 may also be present. In one embodiment, the plurality of apertures may be arranged in a concentric circular fashion so that three aperture circles are formed on base plate 1. In one embodiment, an outer circle of apertures 7 may be adapted to provide vacuum, middle circle of apertures 9 may be adapted to provide a gas, and inner circle of apertures 11 may provide vacuum. Any number of such aperture circles and configurations of vacuum and gas adapted apertures are contemplated. Apertures 7, 9, and 11 may have a diameter of between about 1/2000 of an inch and about 1/16 of an inch, preferably between about 1/1000 of an inch and about 1/32 of an inch, Base plate 1 may be fabricated from a suitable material that reduces potential scratching, chemical or physical contamination and/or marring of the substrate, for example, stainless steel, aluminum, metal alloys, ceramic or a high temperature polymer. Base plate 1 may alternatively be fabricated from a transparent material such as quartz, sapphire, or a hard transparent material. Base plate 1 may be between about 1/16 of an inch and about 2 inches thick, preferably about 1/8 of an inch. The sites of apertures 7, 9, and 11 may have counter bores in order to reduce the thickness of base plate 1 at the aperture sites to a thickens which allows for laser drilling or micro machining of apertures 7, 9, and 11. In one embodiment, an outer ring 13 may be adhered to base plate 1. The outer ring 13 may be a carbon based material such, as silicon carbide, that is directly applied to an upper surface of the base plate 1. Optionally, outer ring 13 may be fabricated from a material that reduces potential scratching of the substrate, such as silicon carbide. The outer ring 13 may be coupled to the upper surface of base plate 1 by the use of adhesives or bonding processes.

Figure 16:
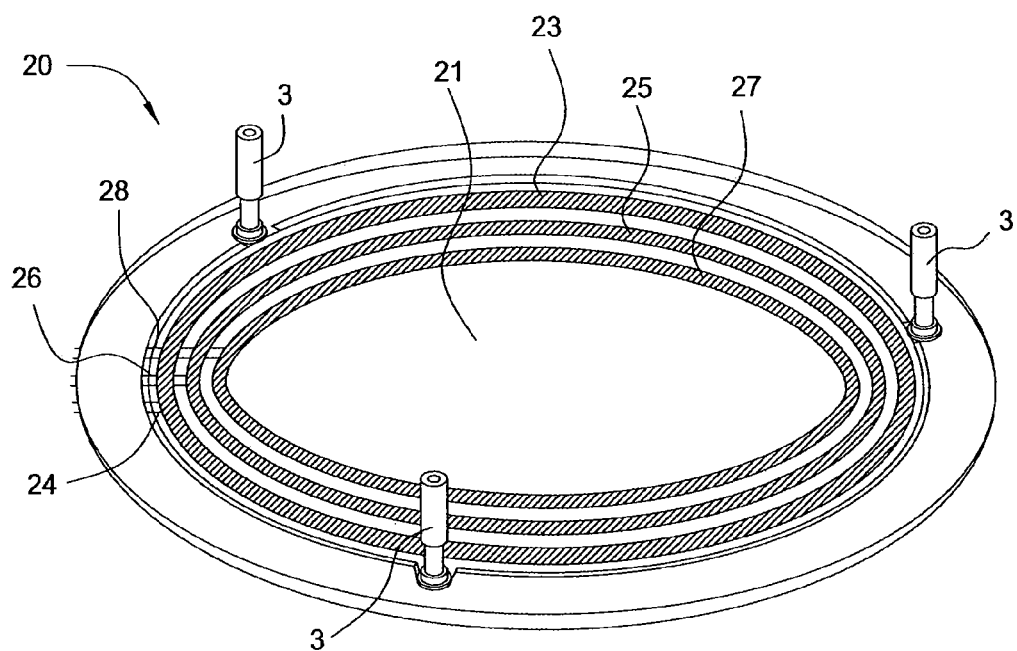
FIG. 16 depicts a perspective view of a substrate support and positioning assembly according to another embodiment of the invention.

FIG. 16 depicts a perspective view of a substrate support and positioning assembly 20 according to another embodiment of the invention. The substrate support and positioning assembly 20 includes a base plate 21, on which the plurality of air bearing edge rollers 3 and the thermal edge barrier 5 may be positioned. Base plate 21 is an annular body and may include one or more annular grooves 25 for flowing gas therethrough to elevate the substrate. One or more annular grooves 23 and 27 to evacuate regions of the base plate 21 may also be present. In an embodiment, the grooves may be arranged in a concentric circular fashion on base plate 1, as shown in FIG. 16. In one embodiment, the annular groove 23 may be adapted to provide an evacuated region, the middle groove 25 may be adapted to provide a gas, and inner groove 27 may provide an evacuated region. Any number of grooves and configurations of vacuum and gas adapted grooves are contemplated. Base plate 21 may be fabricated from a suitable material that reduces potential scratching, chemical or physical contamination and/or marring of the substrate, for example, stainless steel, aluminum, metal alloys, ceramic or a high temperature polymer. Base plate 21 may alternatively be fabricated from a transparent material such as quartz, sapphire, or a hard transparent material. Base plate 21 may be between about 1/16 of an inch and about 2 inches thick, preferably about 1/8 of an inch. Grooves 23, 25, and 27 may be between about 1/2000 of an inch and about 1/16 of an inch wide, preferably between about 1/1000 of an inch and about 1/32 of an inch, and may be may be between about 1/1000 of an inch and about 1/4 of an inch deep, preferably between about 1/32 of an inch and about 1/16 of an inch. Channels 24, 26, and 28 may provide gas or vacuum to grooves 23, 25, and 27, respectively, and may have diameters between about 1/32 of an inch and about 1/8 of an inch.

FIG. 17 depicts a partial sectional view of the support and positioning assembly according to one embodiment of the invention, illustrating that the thermal edge barrier 5 may be mounted on top of base plate 1 or 21. The thermal edge barrier 5 is an annular body which at least partially circumscribes the substrate 2 and limits the movement of the substrate within its boundaries. The thermal edge barrier 5 may be located and secured in an annular groove 15 located in the base plate 1 or 21. The thermal edge barrier 5 may be temperature controlled using laser heating, dedicated lamp zones, or resistive heating elements. The edge barrier 5 can thus be used to improve the thermal uniformity of the process being performed on the substrate by reducing the edge losses or improve the thermal coupling of the substrate. The thermal edge barrier 5 may be fabricated from a material that reduces potential scratching, chemical or physical contamination and/or marring of the substrate surface, for example, silicon carbide, stainless steel, aluminum, ceramic or a high temperature polymer. Alternatively, the thermal edge barrier may be fabricated as a unitary member with the base plate using the same material of the base plate. The thermal edge barrier 5 may have an inner diameter between about 1% and about 20% larger than the diameter of the substrate being processed, preferably between about 2% and about 5%.

In one embodiment, the edge 5A of the edge barrier 5 is shaped to form a parabolic type reflector (not shown) that circumscribes the edge of the substrate to transfer or to receive heat that is transferred between the edge of the substrate and the edge barrier 5. The parabolic type reflector can be used collect, concentrate and/or optimally reflect energy to the edge regions of the substrate.

Figure 18:
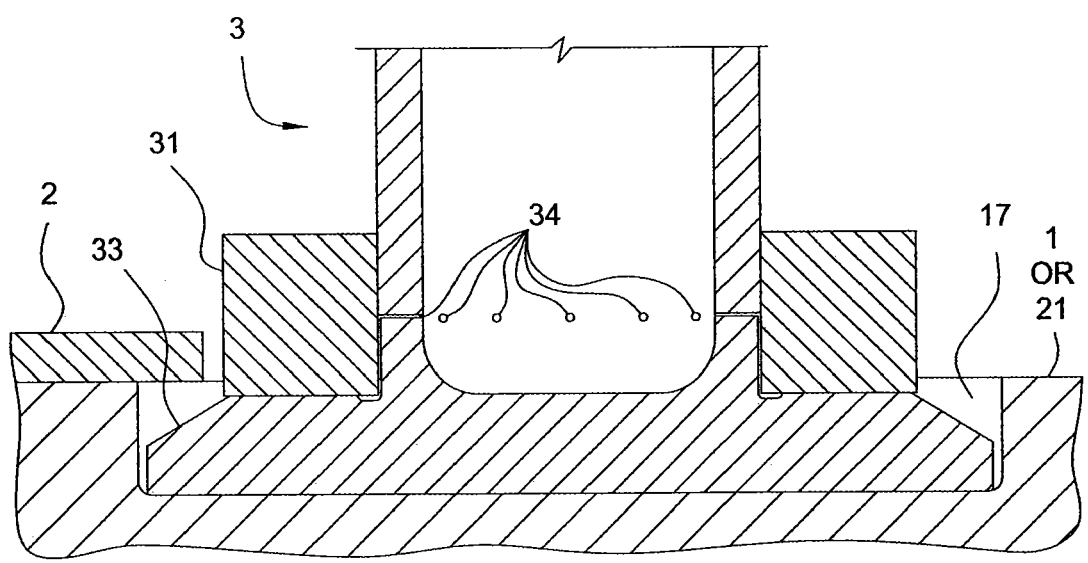
FIG. 18 depicts a perspective view of an air bearing edge roller according to one embodiment of the invention.

FIG. 18 depicts an embodiment of the air bearing edge rollers 3. The air bearing edge roller is adapted to position substrate 2 without the substrate having to contact thermal edge barrier 5. The air bearing edge rollers 3 may rest on the base plate in grooves 17 and may be fabricated from a material that reduces potential scratching, chemical or physical contamination and/or marring of the substrate surface, for example, a high temperature polymer, silicon carbide, graphite, or aluminum. A floating sleeve 31 circumscribes the air bearing edge roller 3. The floating sleeve 31 may be positioned on top of an air bearing journal or lift 33 that is used to lift the substrate 2 between a loading position and a processing position. The air bearing edge rollers 3 may be positioned so that parts of an outer circumference of the floating sleeve 31 is in-line with the edge 5A (FIG. 17) of the thermal edge barrier 5, or slightly radially protruding the thermal edge barrier 5. The thermal edge barrier 5 and the floating sleeve thus define a boundary to retain the substrate 2, as depicted in FIGS. 15 and 16. Floating sleeve 31 may have an outer diameter between about 5 mm and about 150 mm, preferably between about 20 mm and about 50 mm, and may be made from low mass density materials, such as sapphire or quartz. The gas flow channels 34 may be evenly spaced and adapted to flow gas to lift floating sleeve 31, so that floating sleeve may rotate freely with minimal friction. Optionally, a plurality of air bearing edge rollers 3, preferably three, may be used to position the substrate inside the thermal edge barrier.

Figure 19:
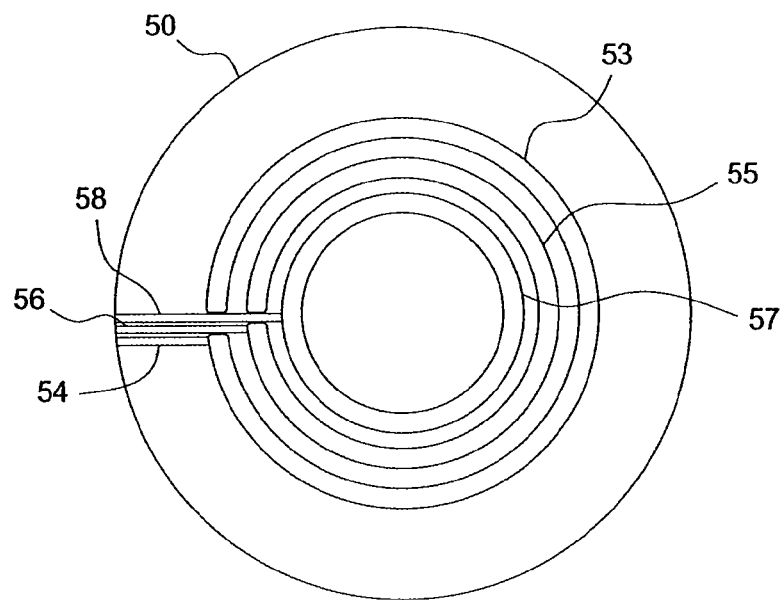
FIG. 19 depicts a top view of a lower base plate according to one embodiment of the invention.

FIG. 19 depicts a top view of a lower base plate 50, according to an embodiment of the invention. Lower base plate 50 is an annular body and may include one or more annular grooves 53, 55, and 57. The lower base plate 50 may be used in conjunction with base plate 1, and provides channels for supplying gas and vacuum to the apertures of base plate 1. The lower base plate 50 may be positioned below and in contact with base plate 1 so that an annular groove 55 aligns with the middle circle of apertures 9 of FIG. 15. The annular groove 55 and base plate 1 thus define a conduit for gas to flow to apertures 9. One or more annular grooves 53 and 57 for providing vacuum may also be present. Annular groove 53 may align with the outer circle of apertures 7, and annular groove 57 may align with the inner circle of apertures 11. In one embodiment outer groove 53 may be adapted to provide vacuum from a channel 54, annular groove 55 may be adapted to provide a gas from a channel 56, and inner groove 57 may provide vacuum from a channel 58. Any number of grooves and configurations of vacuum and gas adapted grooves are contemplated. The lower base plate 50 may be fabricated from a suitable material that reduces potential scratching, chemical or physical contamination and/or marring of the substrate surface, for example, stainless steel, aluminum, metal alloys, ceramic materials or a high temperature polymer. The base plate 21 may alternatively be fabricated from a transparent material such as quartz, sapphire, or a hard transparent mineral. The lower base plate 50 may be between about 1/16 of an inch and about 2 inches thick, preferably about 1/8 of an inch. Grooves 53, 55, and 57 may be between about 1/2000 of an inch and about 1/16 of an inch wide, preferably between about 1/1000 of an inch and about 1/32 of an inch, and may be may be between about 1/1000 of an inch and about 1/4 of an inch deep, preferably between about 1/32 of an inch and about 1/16 of an inch. Channels 54, 56, and 58 may provide gas or vacuum to grooves 53, 55, and 57, respectively, and may have a diameters between about 1/32 of an inch and about 1/8 of an inch.

Figure 20:
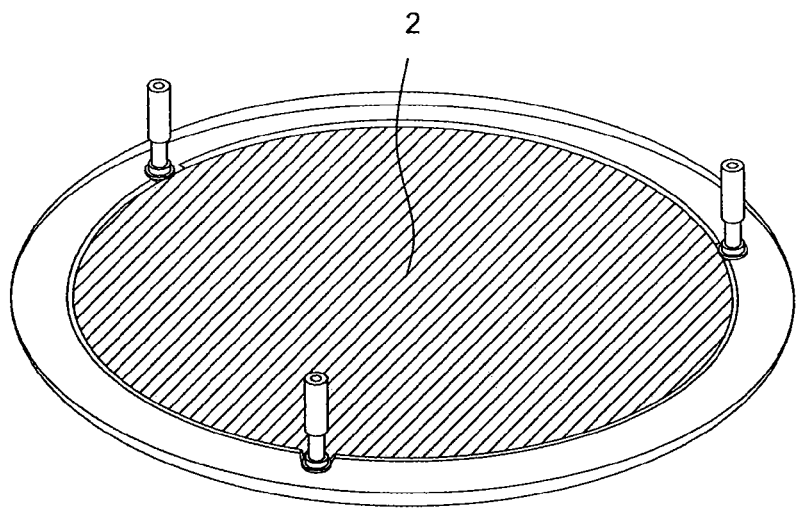
FIG. 20 depicts a perspective view of a support and positioning assembly with a substrate thereon according to one embodiment of the invention.

FIG. 20 depicts a perspective view of a support and positioning assembly with substrate 2 disposed thereon according to one embodiment of the invention. During processing, the substrate 2 is elevated and floating above the base plate 1 or 21 (FIGS. 15-16) by a layer of fluid positioned between the substrate 2 and the base plate 1 or 21 as a result of the gas flow through the plurality of apertures 9 formed in the base plate 1, or from the groove 25 formed on the base plate 21. In one embodiment, to achieve a desired vertical position, a fluid is delivered through the plurality of apertures 9, or from the groove 25, and the fluid is evacuated through the plurality of apertures 7 and 11, or grooves 23 and 27. Different aperture characteristics may be used for the vacuum and the injection elements in order to build up the required performance in terms of vertical stiffness and positional accuracy.

Figure 21:
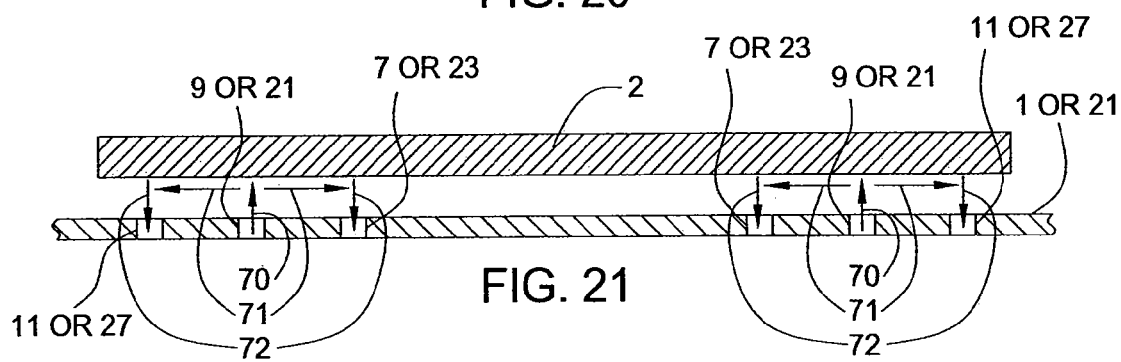
FIG. 21 depicts an elevation of a substrate above a base plate according to one embodiment of the invention.

FIG. 21 schematically depicts the fluid flow which provides a cushion according to an embodiment of the invention. A fluid flow 70 is introduced through, for example, apertures 9 or grooves 25, and provides for a gas flow cushion 71. The gas flow cushion 71 elevates substrate 2 between about 1 μm and about 1000 μm, preferably between about 5 μm and about 100 μm. In one embodiment the substrate is elevated about 60 μm. A gas exit flow 72 may escape through apertures 7 and 11 or grooves 23 and 27. Optionally, a sensor (not shown), such as an optical sensor, may be disposed on the outside of the base plate 1 and configured to detect when the substrate is at a predetermined height (e.g., a raised processing position or a lowered substrate transfer position).

Rotation of substrate 2 may, in one embodiment, be obtained by providing a plurality of slanted apertures may be added to base plate 1 or 21 for flowing gas therethrough to rotate the substrate to ensure uniform heating during processing, as shown in FIGS. 1-14 discussed above. In one embodiment, a plurality of ports 111, similar to the ones shown in FIGS. 3A-4, and 5B, may be positioned between apertures 7 or grooves 23 (FIG. 15) and thermal edge barrier 5 to support, position or rotate the substrate. Because there are no moving parts necessary for rotating the substrate, the plurality of ports 111 can thus improve any uneven temperature distribution on the substrate during processing and provides numerous other processing advantages. The flow of gas may be supplied to the ports formed in the base plate 1 or 21 via corresponding channels in lower base plate 50 as described in relation to FIG. 19.

Figure 22:
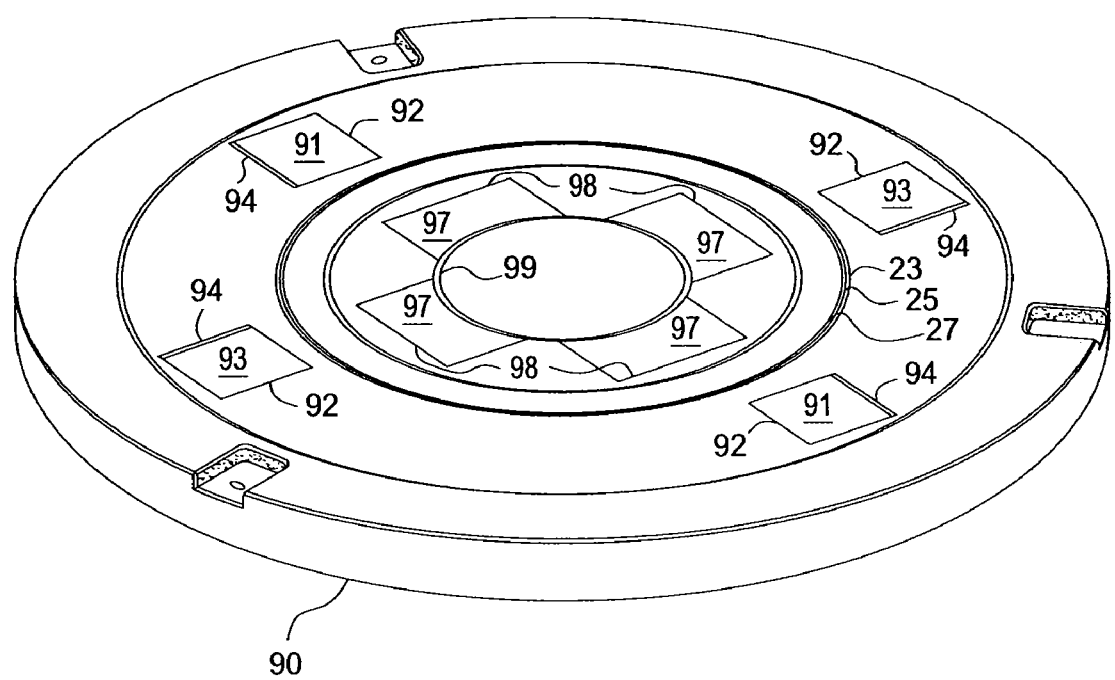
FIG. 22 depicts a perspective view of a base plate according to one embodiment of the invention.

FIG. 22 depicts a perspective view of a base plate 90, similar to the substrate support 110 shown in FIG. 5A, illustrating an alternate method of rotating and positioning substrate 2, according to one embodiment of the invention. Base plate 90 includes gas flow pockets 91 and 93 embedded in base plate 90 which are adapted to provide a rotational force on substrate 2. In one embodiment, the gas flow pockets 91 and 93 are similar to the ports 111 discussed in FIGS. 3A-4 and 5A. Gas flow pockets 91 are adapted to provide a counterclockwise rotational force, while gas flow pockets 93 are adapted to provide a clockwise rotational force. Each gas flow pocket may be between about 10 µm and about 30 µm deep relative to the top surface of base plate 90. Gas flow pockets 91 and 93 may have a width of about 10 mm or above, preferably between about 10 mm and about 50 mm. In one embodiment the width may be about 35 mm. Gas flow pockets 91 and 93 may have a length of about 10 mm or above, preferably between about 10 mm and about 50 mm. In one embodiment the length may be about 35 mm.

Gas flow pockets 91 and 93 may include grooves 92 and 94 at opposing ends of the pockets and extending the width of the pockets. Grooves 92 and 94 may be between about 20 µm and about 80 µm deep relative to the top surface of base plate 90. Grooves 92 may be adapted to provide a fluid to become a pressure "well" and grooves 94 may be adapted to provide a vacuum to become a low pressure "well." Gas and vacuum may be supplied to grooves 92 and 94, respectively, via corresponding channels formed in the lower base plate 50 as described in relation to FIG. 19. In one embodiment, gas flow pockets 91 and 93 are radially positioned between grooves 23, 25, and 27, and are used to lift the substrate 2, and temperature control the substrate 2 and thermal edge barrier 5. Although eight pockets are depicted, any number of pockets are contemplated. By regulating the gas flows and vacuum pressures to grooves 92 and 94, respectively, control of the substrate rotation may be accomplished. Although, two gas flow pockets 91 and two gas flow pockets 93 are depicted in FIG. 22, any number of such pockets needed to provide rotational control of the substrate is contemplated.

Base plate 90 may also include gas flow pockets 97 adapted to apply transverse directional forces to provide positioning forces upon substrate 2. Each gas flow pocket 97 may be between about 10 µm and about 30 µm deep relative to the top surface of base plate 90. Gas flow pockets 97 may have a width of about 10 mm or above, preferably between about 10 mm and about 50 mm. In one embodiment the width may be about 35 mm. Gas flow pockets 97 may have a length of about 10 mm or above, preferably between about 10 mm and about 50 mm. In one embodiment the length may be about 35 mm.

Gas flow pockets 97 may include grooves 98 and 99 at opposing ends of the pockets and extending the length of the pockets. Grooves 98 and 99 may be between about 20 µm and about 80 µm deep relative to the top surface of base plate 90. Grooves 98 may be adapted to provide a gas to become a pressure well and grooves 99 may be adapted to provide a vacuum to become a low pressure well. In one embodiment, such as depicted in FIG. 22, the grooves consist of one groove 99 that is circular shaped with gas flow pockets 97 extending outwards from the groove 99. In this embodiment a flow of gas may flow from grooves 98 to grooves 99, and thus exerting a force on the substrate towards the center of base plate 90. A plurality of gas flow pockets 97 may be controlled in order to center the substrate over base plate 90. Although four gas flow pockets 97 are depicted in FIG. 22, any number of such pockets needed to provide rotational control of the substrate is contemplated. In one embodiment, grooves 98 and groove 99 may be reversed; such the force of the flowing gas is in a direction away from the center of base plate 90. Gas and vacuum may be supplied to grooves 98 and 99, respectively, via corresponding channels in lower base plate 50 as described in relation to FIG. 19.

Alternate Rapid Thermal Annealing Chamber Configuration

Figure 23:
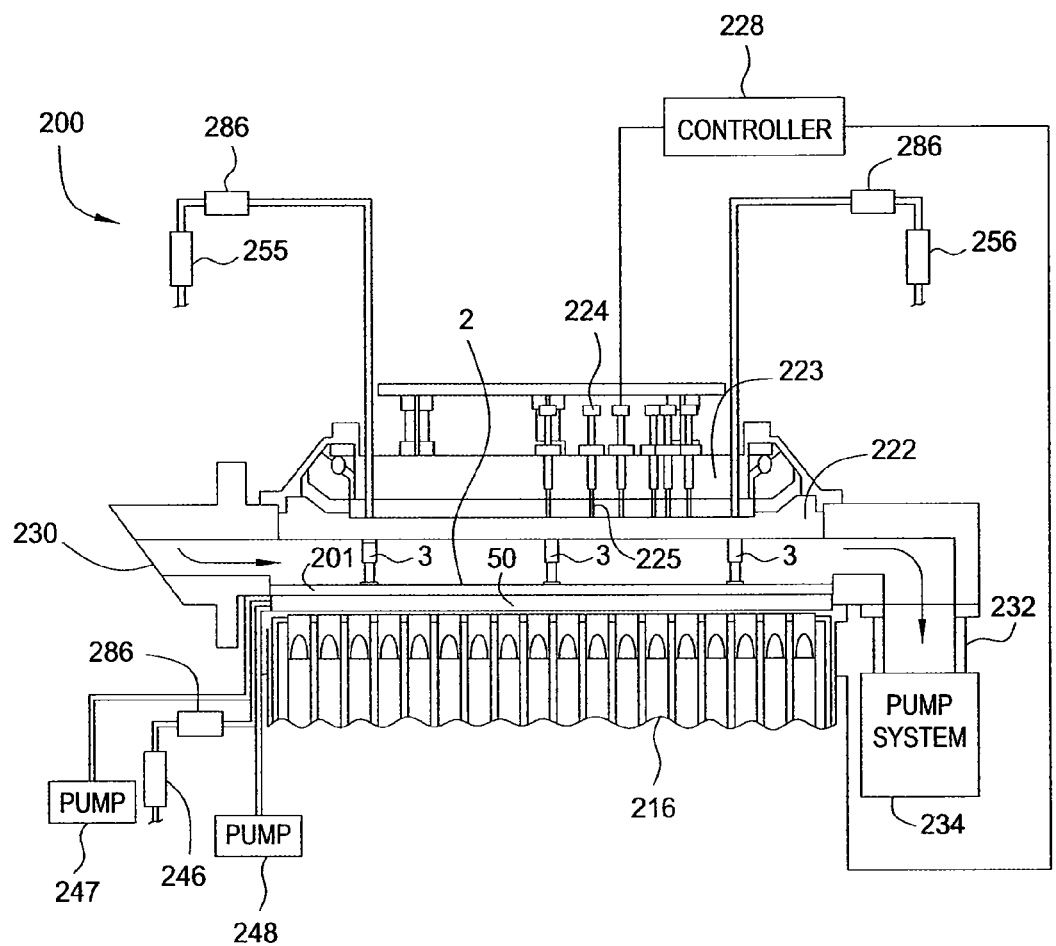
FIG. 23 depicts a sectional view of a processing chamber according to one embodiment of the invention.

FIG. 23 depicts a simplified sectional view of another embodiment of a thermal processing chamber 200 having an apparatus for supporting, positioning and rotating a substrate disposed therein. Although the apparatus is described as utilized within a thermal processing chamber 200, the apparatus may be utilized in other substrate processing systems and ancillary devices such as substrate support platforms adapted for robot handoffs, orientation devices, deposition chamber, etch chambers, electrochemical processing apparatus and chemical mechanical polishing devices, among others, particularly where the minimization of particulate generation is desired. An example of a thermal processing chamber is also described in the co-pending U.S. patent application Ser. No. 11/746,392, filed May 9, 2007, which is herein incorporated by reference.

Substrate 2 may be radiatively heated by a lamp assembly 216. The lamp assembly 216 may include a plurality of honeycomb tubes in a water jacket assembly. Each tube contains a reflector and a tungsten halogen lamp assembly from which is formed a honeycomb-like pipe arrangement similar to the heating assembly 1316 discussed above.

Entry and egress of substrate 2 may occur through an access port 230. Inside the chamber, substrate 2 may be supported by the support and positioning assembly 10, discussed above. FIG. 23 depicts a chamber including both a base plate 201 and the lower base plate 50. Base plate 201 may be any base plate described above, such as base plates 1, 21 and 90. Both base plate 201 and lower base plate 50 may be made from transparent material such as quartz, sapphire, or a hard transparent material. The transparent base plate 201 allows for the substrate to be radiatively heated by lamp assembly 216 positioned underneath substrate 2. The radiative heat may thus pass through the transparent substrate support structure in order to heat a bottom surface of substrate 2.

Connected to lower base plate 50 is gas inlet 246 which is connected to filter 286. Gas inlet 246 may provide the gas used to elevate substrate 2. Vacuum may be applied to the lower base plate via vacuum pumps 247 and 248. Gas and vacuum may be applied so that a pressure difference between the apertures for providing gas and the apertures for providing vacuum may be between about 5 PSI and about 50 PSI, preferably between about 10 PSI and about 30 PSI. In one embodiment the pressure difference is about 20 PSI. Also connected to lower base plate 50 may be gas sources (not shown) for the ports 111 and the gas flow pockets 91, 93, and 97. Additionally, vacuum may be applied to the gas flow pockets 91, 93, and 97, through a plurality of pumps (not shown). Gas and vacuum may be applied to the gas flow pockets so that a pressure difference between the pressure wells and the low pressure wells may be between about 5 PSI and about 100 PSI, preferably between about 10 PSI and about 30 PSI. In one embodiment the pressure difference is about 20 PSI.

Above substrate 2 is a nickel-plated aluminum reflector plate assembly 222 that may have an optically reflective coating facing to enhance the effective emissivity of substrate 2. The optically reflective coating is further described in commonly assigned U.S. Pat. No. 6,839,507, issued Jan. 4, 2005 to Adams and Hunter, which description is incorporated by reference herein. Reflector plate assembly 222 is mounted on a water-cooled base 223. Cool down of substrates may be further enhanced ejecting gas supplied by gas input 255 through holes in the reflector plate.

In a system designed for processing eight inch (200 mm) silicon wafers, reflector plate assembly 222 may have a diameter of about 8.9 inches, the separation between substrate 2 and the surface of reflector plate assembly 222 may be between about 15 and about 25 mm. In a system designed for processing twelve-inch (300 mm) silicon wafers, reflector plate assembly 222 may have a diameter of about 13 inches, the separation between substrate 2 and the surface of reflector plate assembly 222 may be between about 20 and about 30 mm.

The temperatures at localized regions of substrate 2 are measured by a plurality of temperature probes 224 that are positioned to measure substrate temperature at different radial locations across the substrate. Temperature probes 224 receive light from inside the processing chamber through optical ports 225, which extend through the top surface of reflector plate assembly 222. While processing chamber 200 typically may have about ten such temperature probes, only some of the probes are shown in FIG. 23. At the reflector plate surface, each optical port may have a diameter of about 0.08 inch. Sapphire light pipes deliver the light received by the optical ports to respective optical detectors (e.g., pyrometers), which are used to determine the temperature at the localized regions of substrate 2. Temperature measurements from the optical detectors are received by a controller 228 (e.g., similar to the system controller 120) that controls the radiative output of lamp assembly 216. The resulting feedback loop improves the ability of the processing system to uniformly heat substrate 2. Air bearing edge rollers 3 may be attached to reflector plate assembly 222. Inlet 256 supplies gas through filter 286 to the air bearing edge rollers.

In order for the optical detectors to measure the temperature of substrate 2, without optical leakage of light effecting the measurements, base plate 1 may have outer ring 13 adhered to it. In this embodiment the base ring is of a dark color in order to absorb light leakage from the lamp assembly. The outer ring 13 may be a carbon based material such, as silicon carbide.

During an annealing processing, gases for the annealing ambient are introduced into processing chamber 200 through a gas input 255. The ambient gases flow across the top surface of substrate 2 and may react with a heated substrate. Excess ambient gases, as well as any reaction by-products, are withdrawn from processing chamber 200 through an ambient gas output 232 by a pump system 234.

The gases used to elevate (introduced via apertures 9 or groove 25), rotate (introduced via ports 111, gas flow pockets 91 and 93, or air jets), and position (through air bearing edge rollers 3 and/or gas flow pockets 97) may be the same gas used as processing gas. Alternatively, the gases may be inert gases such as nitrogen, helium, or argon, mixtures thereof.

One or more sensors (not shown) may be coupled to the chamber body. Generally, the sensors are adapted to detect the elevation of the substrate within the interior volume of the chamber body and provide an output indicative of the distance between the substrate and the top of the base plate 1. The sensors may also be adapted to detect the rotational speed of the substrate and provide an output indicative of the how fast the substrate is rotating on the support assembly.

The controller 228 is coupled to the sensors, lamps, and other elements of the processing chamber. The controller utilizes the positional metric obtained from the sensors to adjust the elevation of the substrate so that both the elevation and the planarity of the substrate seated on the support assembly may be adjusted relative to the lamp assembly.

An atmosphere control system is also coupled to the interior volume of the chamber body. The atmosphere control system includes throttle valves and pump system 234 for controlling chamber pressure. The atmosphere control system may additionally include gas input 255 for providing process or other gases to the interior volume. Typically, atmosphere control system provides process gases for thermal deposition procedures.

A method for supporting, positioning and rotating the substrate in the processing chamber is stored in the memory of the controller, typically as a software routine. The software routine may also be stored and/or executed by a second CPU (not shown) that is remotely located from the hardware being controlled by the CPU.

The method, when executed by the CPU, allows controller 128 to control the position and rotation of the substrate within the processing chamber so that a thermal or other process may be performed. Although the process of embodiments of the present invention is discussed as being implemented as a software routine, some of the method steps that are disclosed therein may be performed in hardware as well as by the software controller. As such, the embodiments of the invention may be implemented in software as executed upon a computer system, in hardware as an application specific integrated circuit or other type of hardware implementation, or a combination of software and hardware.

In another embodiment, the substrate support unit depicted in FIGS. 15-22 may be used in a conventional chamber where the lamp assembly 216 is positioned above substrate 2.

Figure 24:
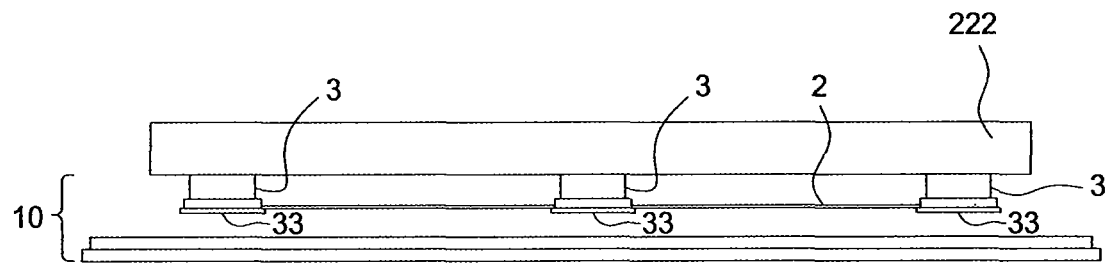
FIG. 24 depicts a side view of the support assembly in a loading mode according to an embodiment of the invention.

FIG. 24 depicts a cross section of support and positioning assembly 10 and reflector plate assembly 222 of the rapid thermal processing chamber 200 in a substrate loading mode according to an embodiment of the invention. The air bearing edge rollers 3 are lifted into a loading position so that lift 33 of FIG. 18 provides support to the substrate 2. Lift 33 may be raised by replacing gas through inlet 256 with vacuum. Once the air bearing edge rollers 3 are lifted into a loading position the substrate may be introduced or removed from the chamber via the chamber access port. If a substrate is to be introduced into the chamber, gas inlet 246 and vacuum pump 247 and 248 may be engaged to provide an fluid cushion before the lifts 33 are lowered to position the substrate 2 into processing mode.

Figure 25:
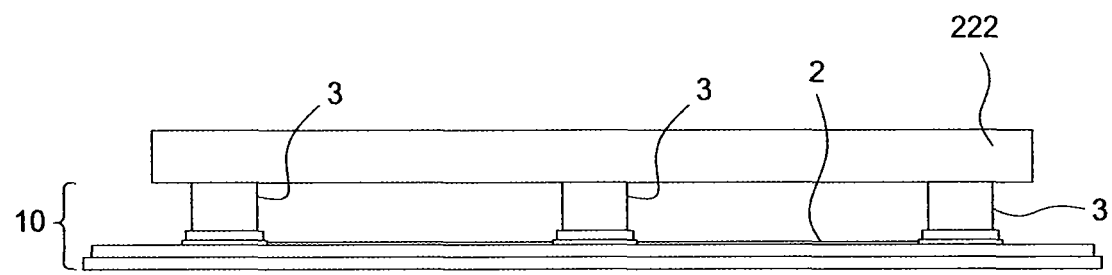
FIG. 25 depicts a side view of the support assembly in a process mode according to an embodiment of the invention.

Once substrate 2 is in a processing mode (FIG. 25), substrate 2 may be rotated by applying gas to the ports 111 formed in the base plate 1, or by providing gas and vacuum to the gas flow pockets 91 and/or 93. After the substrate has reached a predetermined elevation above base plate 1 and a predetermined rotational speed and a desired processing gas flow has been reached, lamp assembly 216 may be engaged to perform the heating of the substrate. The lamp assembly may be engaged between about ½ of a second and about 15 seconds, preferably between about 1 second to about 5 seconds. The time the lamp assembly is engaged may depend on the substrate to be processed as well as the process gas chemistry.

By rapidly rotating the substrate even heat distribution may be obtained. Furthermore, because substrate 2 is not in contact with the substrate support surface uneven thermal losses are kept at a minimum. Some thermal heat loss may occur upon substrate 2 coming in contact with floating sleeve 31 of air bearing edge rollers 3, however this loss is minimal compared to the heat loss found in conventional substrate supports, and may be minimized by applying the transverse directional forces of pockets 97 to position substrate 2 within the center of base plate 90. Furthermore, contamination is reduced because there is no contact between the substrate and the support assembly.

While the foregoing is directed to the preferred embodiment of the present invention, other and further embodiments of the invention may be devised without departing from the basic scope thereof. The scope of the invention is determined by the claims that follow.

What is claimed is:

1. A processing chamber, comprising:
   a substrate support comprising a plurality of ports having one or more apertures that each receive a flow of fluid from one or more flow controllers, wherein each of the plurality of ports are adapted to direct the received fluid in a predominant flow direction that is not the same as the predominant flow direction of the other plurality of ports;
   a sensor that is positioned to monitor the position of a substrate disposed over the substrate support that is disposed within a processing region of the processing chamber; and
   a controller that is configured to receive a signal from the sensor and is adapted to control the position of the substrate by controlling the flow of the fluid delivered by each of the plurality of ports from the one or more flow controllers; a pump that is adapted to reduce the pressure within the processing region to a pressure less than atmospheric pressure; and the substrate support further comprises an isolation feature that is positioned to substantially prevent the received fluid flow from flowing into the processing region when a substrate is disposed over the substrate support.

2. The processing chamber of claim 1, wherein the plurality of ports essentially comprises three ports that are each positioned relative to a center point of the substrate support.

3. The processing chamber of claim 1, wherein the radial component of the predominant flow direction delivered by each of the plurality of ports is generally directed away from the center of the substrate that is disposed over the substrate support.

4. The processing chamber of claim 1, wherein at least one of the plurality of ports have a predominant flow direction that causes the substrate to rotate about an axis that is generally perpendicular to a processing surface of a substrate.

5. The processing chamber of claim 1, wherein the one or more flow controllers are configured to control the velocity of the fluid exiting the one or more apertures to a subsonic speed.

6. The processing chamber of claim 1, wherein the one or more flow controllers are configured to control the velocity of the fluid exiting the one or more apertures to a supersonic speed.

7. The processing chamber of claim 1, wherein the substrate support comprises an optically transparent material.

8. A processing chamber, comprising:
   a plurality of ports that are adapted to each provide a flow of fluid to a surface of a substrate, wherein the plurality of ports comprise:
      a first port that is adapted to receive the fluid from a first flow controller and direct the fluid in a first direction;
      a second port that is adapted to receive a fluid from a second flow controller and direct the fluid in a second direction; and
      a third port that is adapted to receive a fluid from a third flow controller and direct the fluid in a third direction, wherein at least a portion of the flow of fluids from the plurality of ports are adapted to support of the weight of the substrate;
   a sensor that is positioned to monitor the position of the substrate disposed within a processing region of the processing chamber; and
   a controller that is configured to receive a signal from the sensor and is adapted to control the position of the substrate by controlling the flow of fluids from the first, second, and third flow controllers.

9. The processing chamber of claim 8, further comprising:
   a pump that is adapted to reduce the pressure within the processing region to a pressure less than atmospheric pressure; and
   an isolation feature that circumscribes at least one of the first, second or third ports to substantially prevent the fluid exiting the at least one of the first, second or third ports from flowing into the processing region when a substrate is disposed over the plurality of ports.

10. The processing chamber of claim 8, wherein the radial component of the predominant flow direction delivered by each of the plurality of ports is generally directed away from the center of the substrate that is disposed over the substrate support.

11. The processing chamber of claim 8, wherein at least one of the first, second, or third ports have a predominant flow direction that causes the substrate to rotate about an axis that is generally perpendicular to a processing surface of a substrate.

12. The processing chamber of claim 8, further comprising:
   a substrate support disposed in the processing region; and
   an actuator that is adapted to position the first, second, and third ports relative to the substrate support.

13. The processing chamber of claim 8, wherein the plurality of ports further comprise a fourth port that is adapted to receive a fluid from a fourth flow controller and direct the fluid in a fourth direction, wherein none of the first, second, third and fourth directions are in the same direction.

14. The processing chamber of claim 13, wherein the component of the first, second, third and fourth directions that are projected on to a plane that is parallel to the surface of the substrate do not pass through a single point contained within the plane.

15. The processing chamber of claim 8, wherein the plurality of ports comprise:
   the first port that is adapted to receive the fluid from the first flow controller and direct the fluid in the first direction;
   the second port that is adapted to receive the fluid from the second flow controller and direct the fluid in the second direction;
   the third port that is adapted to receive a fluid from the third flow controller and direct the fluid in the third direction;
   a fourth port that is adapted to receive a fluid from a fourth flow controller and direct the fluid in a fourth direction, wherein the first, second, third and fourth directions are not in the same direction;
   a fifth port that is adapted to receive a fluid from a fifth flow controller and direct the fluid in a fifth direction; and
   a sixth port that is adapted to receive a fluid from a sixth flow controller and direct the fluid in a sixth direction, wherein the component of the fifth and sixth directions that are projected on to a plane that is generally parallel to the surface of the substrate are substantially parallel.

16. The processing chamber of claim 15, further comprising:
   a seventh port that is adapted to receive a fluid from a seventh flow controller and direct the fluid in a seventh direction; and
   a eighth port that is adapted to receive a fluid from a eighth flow controller and direct the fluid in a eighth direction, wherein the component of the seventh and eighth directions that are projected on to a plane that is parallel to the surface of the substrate are substantially parallel.

17. The processing chamber of claim 8, wherein the plurality of ports essentially comprise:
- the first port that is adapted to receive the fluid from the first flow controller and direct the fluid in the first direction;
- the second port that is adapted to receive the fluid from the second flow controller and direct the fluid in the second direction;
- the third port that is adapted to receive a fluid from the third flow controller and direct the fluid in the third direction;
- a fourth port that is adapted to receive a fluid from a fourth flow controller and direct the fluid in a fourth direction, wherein the first, second, third and fourth directions are not in the same direction;
- a fifth port that is adapted to receive a fluid from a fifth flow controller and direct the fluid in a fifth direction;
- a sixth port that is adapted to receive a fluid from a sixth flow controller and direct the fluid in a sixth direction;
- a seventh port that is adapted to receive a fluid from a seventh flow controller and direct the fluid in a seventh direction; and
- a eighth port that is adapted to receive a fluid from a eighth flow controller and direct the fluid in a eighth direction, wherein the component of the fifth, sixth, seventh and eighth directions that are projected on to a plane that is parallel to the surface of the substrate are perpendicular to at least one radial line drawn from the center of a circular substrate to an edge.

18. A method of processing a substrate, comprising:
- delivering a flow of a fluid to a plurality of ports, wherein the plurality of ports comprise:
  - a first port that is adapted to receive a fluid from a first flow controller and direct the fluid in a first direction;
  - a second port that is adapted to receive the fluid from a second flow controller and direct the fluid in a second direction; and
  - a third port that is adapted to receive the fluid from a third flow controller and direct the fluid in a third direction, wherein at least a portion of the flow of fluids from the plurality of ports are adapted to support the weight of the substrate;
- positioning a substrate over the plurality of ports that are disposed in a processing region of a processing chamber;
- monitoring the position of the edge of the substrate disposed within the processing region by use of sensor; and
- controlling the position of the substrate by controlling the flow of the fluid delivered from the first, second, and third ports by use of the sensor.

19. The method of claim 18, the radial component of the predominant flow direction delivered by each of the plurality of ports is generally directed away from the center of the substrate that is positioned over the plurality of ports.

20. The method of claim 18, wherein the fluid is a gas and the velocity of the flow of fluid from each of the plurality of ports is subsonic.

21. The method of claim 18, wherein the fluid is a gas and the velocity of the flow of fluid from at least one of the plurality of ports is supersonic.

22. The method of claim 18, wherein the fluid is a gas selected from the group consisting of helium, hydrogen, nitrogen, and argon.

23. The method of claim 18, further comprising:
- forming the plurality of ports in a substrate support;
- forming a feature in the substrate support that circumscribes at least one of the plurality of ports; and
- evacuating a region within the feature to minimize the amount of the fluid flowing into the processing region from the at least one of the plurality of ports.

24. A method of processing a substrate, comprising:
- positioning a substrate in a processing region of a processing chamber, wherein the substrate has a plurality of semiconductor devices formed on a processing surface of the substrate;
- delivering a flow of a fluid to three or more ports, wherein the three or more ports comprise:
  - a first port that is adapted to receive a fluid from a first flow controller and direct the fluid in a first direction;
  - a second port that is adapted to receive a fluid from a second flow controller and direct the fluid in a second direction; and
  - a third port that is adapted to receive a fluid from a third flow controller and direct the fluid in a third direction, wherein at least a portion of the flow of fluids from the three or more ports are adapted to support the weight of the substrate and none of the three or more ports are adapted to direct the fluid in the same direction;
- receiving the substrate on the three or more ports;
- monitoring the position of the edge of the substrate disposed within the processing region by use of sensor; and
- controlling the position of the edge of the substrate by controlling the flow of the fluid delivered from the first, second, and third ports and a signal received from the sensor.

25. The method of claim 24, further comprising positioning the substrate in the processing region by moving the three or more ports in a direction that is substantially perpendicular to the processing surface.

26. The method of claim 24, wherein the radial component of the predominant flow direction delivered by each of the three or more ports is generally directed away from the center of the substrate that is disposed over the substrate support.

27. The method of claim 24, wherein the three or more ports comprise no more than eight ports.

28. The method of claim 24, further comprising:
- forming the three or more ports in a substrate support;
- forming a feature in the substrate support that circumscribes at least one of the plurality of ports; and
- evacuating a region within the feature to minimize the amount of the fluid flowing into the processing region from the at least one of the plurality of ports.

29. The method of claim 24, wherein the three or more ports can be moved relative to a substrate supporting surface which is disposed in the processing region.

30. The method of claim 25, wherein the three or more ports can be moved relative to a substrate supporting surface which is disposed in the processing region.

* * * * *